US010381409B1

(12) United States Patent
Zhou et al.

(10) Patent No.: US 10,381,409 B1
(45) Date of Patent: Aug. 13, 2019

(54) THREE-DIMENSIONAL PHASE CHANGE MEMORY ARRAY INCLUDING DISCRETE MIDDLE ELECTRODES AND METHODS OF MAKING THE SAME

(71) Applicant: SANDISK TECHNOLOGIES LLC, Addison, TX (US)

(72) Inventors: Fei Zhou, San Jose, CA (US); Raghuveer S. Makala, Campbell, CA (US); Christopher J. Petti, Mountain View, CA (US); Rahul Sharangpani, Fremont, CA (US); Adarsh Rajashekhar, San Jose, CA (US); Seung-Yeul Yang, Pleasanton, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/002,243

(22) Filed: Jun. 7, 2018

(51) Int. Cl.
*H01L 45/00* (2006.01)
*H01L 27/24* (2006.01)
*G11C 13/00* (2006.01)

(52) U.S. Cl.
CPC ...... *H01L 27/2481* (2013.01); *G11C 13/0004* (2013.01); *H01L 45/06* (2013.01);
(Continued)

(58) Field of Classification Search
CPC ............. H01L 27/2481; H01L 45/1253; H01L 45/143; H01L 45/144; H01L 45/146; G11C 13/004
(Continued)

(56) References Cited

U.S. PATENT DOCUMENTS 8,912,519 B2 * 12/2014 Lee ....................... H01L 45/085 257/1
9,099,385 B2 8/2015 Petti
(Continued)

FOREIGN PATENT DOCUMENTS

WO WO2016209615 A1 12/2016

OTHER PUBLICATIONS

C. H. (Kees) de Groot et al., "Highly Selective Chemical Vapor deposition of Tin Diselenide Thin Films onto Patterned Substrates via Single Source Diselenoether Precursors," Chem. Mater., 2012, 24 (22), pp. 4442-4449.
(Continued)

*Primary Examiner* — Xiaochun L Chen
(74) *Attorney, Agent, or Firm* — The Marbury Law Group, PLLC

(57) ABSTRACT

Alternating stacks of insulating strips and sacrificial material strips are formed over a substrate. A laterally alternating sequence of pillar cavities and pillar structures can be formed within each of the line trenches. A phase change memory cell including a discrete metal portion, a phase change memory material portion, and a selector material portion is formed at each level of the sacrificial material strips at a periphery of each of the pillar cavities. Vertical bit lines are formed in the two-dimensional array of pillar cavities. Remaining portions of the sacrificial material strips are replaced with electrically conductive word line strips. Pathways for providing an isotropic etchant for the sacrificial material strips and a reactant for a conductive material of the electrically conductive word line strips may be provided by a backside trench, or by removing the pillar structures to provide backside openings.

20 Claims, 79 Drawing Sheets

(52) U.S. Cl.
CPC ........ *H01L 45/1253* (2013.01); *H01L 45/143* (2013.01); *H01L 45/144* (2013.01); *H01L 45/146* (2013.01); *H01L 45/149* (2013.01); *H01L 45/1616* (2013.01); *H01L 45/1675* (2013.01)

(58) Field of Classification Search
USPC .......................................................... 365/163
See application file for complete search history.

(56) References Cited

U.S. PATENT DOCUMENTS

| | | | | |
|---|---|---|---|---|
| 9,437,658 | B2 | 9/2016 | Sakotsubo | |
| 9,450,023 | B1 | 9/2016 | Konevecki et al. | |
| 9,741,769 | B1 * | 8/2017 | Franca-Neto | H01L 45/141 |
| 9,812,505 | B2 | 11/2017 | Sakotsubo | |
| 9,859,337 | B2 | 1/2018 | Ratnam et al. | |
| 10,249,683 | B1 * | 4/2019 | Lille | H01L 27/249 |
| 2003/0001230 | A1 | 1/2003 | Lowrey | |
| 2003/0131915 | A1 | 7/2003 | Johnson et al. | |
| 2005/0023559 | A1 | 2/2005 | Ogimoto et al. | |
| 2005/0115829 | A1 | 6/2005 | Yahagi et al. | |
| 2005/0158950 | A1 | 7/2005 | Scheuerlein et al. | |
| 2006/0157682 | A1 | 7/2006 | Scheuerlein | |
| 2006/0157683 | A1 | 7/2006 | Scheuerlein | |
| 2007/0062808 | A1 | 3/2007 | Yahagi et al. | |
| 2007/0097737 | A1 | 5/2007 | Asano et al. | |
| 2007/0097738 | A1 | 5/2007 | Asano et al. | |
| 2007/0201267 | A1 | 8/2007 | Happ et al. | |
| 2007/0238226 | A1 | 10/2007 | Lowrey | |
| 2007/0272913 | A1 | 11/2007 | Scheuerlein | |
| 2007/0278538 | A1 | 12/2007 | Chao | |
| 2008/0035905 | A1 | 2/2008 | Parkinson | |
| 2008/0051704 | A1 | 2/2008 | Patel et al. | |
| 2008/0067492 | A1 | 3/2008 | Lowrey | |
| 2008/0210926 | A1 | 9/2008 | Lowrey | |
| 2009/0148649 | A1 | 6/2009 | Shi et al. | |
| 2009/0180314 | A1 | 7/2009 | Liu | |
| 2010/0009522 | A1 | 1/2010 | Parkinson | |
| 2010/0012918 | A1 | 1/2010 | Parkinson | |
| 2010/0093130 | A1 | 4/2010 | Oh et al. | |
| 2010/0182828 | A1 | 7/2010 | Shima et al. | |
| 2010/0220520 | A1 | 9/2010 | Hwang et al. | |
| 2010/0276659 | A1 | 11/2010 | Lowrey | |
| 2011/0149645 | A1 | 6/2011 | Liu | |
| 2011/0235408 | A1 | 9/2011 | Minemura et al. | |
| 2011/0301615 | A1 | 12/2011 | Patel et al. | |
| 2012/0155161 | A1 | 6/2012 | Lee et al. | |
| 2012/0211718 | A1 | 8/2012 | Shima et al. | |
| 2012/0211722 | A1 | 8/2012 | Kellam et al. | |
| 2013/0016557 | A1 | 1/2013 | Kim | |
| 2013/0048938 | A1 | 2/2013 | Shintani et al. | |
| 2013/0168633 | A1 | 7/2013 | Xu et al. | |
| 2013/0221309 | A1 * | 8/2013 | Lee | H01L 45/085 257/2 |
| 2014/0241048 | A1 | 8/2014 | Farooq et al. | |
| 2015/0044849 | A1 | 2/2015 | Pio | |
| 2015/0048291 | A1 | 2/2015 | Cheng et al. | |
| 2015/0155292 | A1 | 6/2015 | Son et al. | |
| 2016/0118582 | A1 | 4/2016 | Cheng et al. | |
| 2016/0218147 | A1 | 7/2016 | Shepard | |
| 2017/0068482 | A1 | 3/2017 | Ramalingam et al. | |
| 2017/0125675 | A1 | 5/2017 | Fujisaki et al. | |
| 2017/0133435 | A1 | 5/2017 | Shepard | |
| 2017/0250224 | A1 | 8/2017 | Ratnam et al. | |
| 2017/0358626 | A1 * | 12/2017 | Franca-Neto | H01L 45/141 |
| 2018/0211703 | A1 | 7/2018 | Choi et al. | |
| 2019/0044063 | A1 | 2/2019 | Fratin et al. | |
| 2019/0115391 | A1 | 4/2019 | Nardi et al. | |

OTHER PUBLICATIONS

Sophie L. Benjamin et al., "Controlling the nanostructure of bismuth telluride by selective chemical vapor deposition from a single source precursor," J. Materials Chem., A, 2014, 2, 4865-4869.
U.S. Appl. No. 15/672,929, filed Aug. 9, 2017, SanDisk Technologies LLC.
U.S. Appl. No. 15/711,075, filed Sep. 21, 2017, SanDisk Technologies LLC.
U.S. Appl. No. 15/715,532, filed Sep. 26, 2017, SanDisk Technologies LLC.
U.S. Appl. No. 15/720,490, filed Sep. 29, 2017, SanDisk Technologies LLC.
U.S. Appl. No. 15/805,627, filed Nov. 7, 2017, SanDisk Technologies LLC.
U.S. Appl. No. 15/843,777, filed Dec. 15, 2017, SanDisk Technologies LLC.
U.S. Appl. No. 15/844,005, filed Dec. 15, 2017, SanDisk Technologies LLC.
U.S. Appl. No. 16/002,169, filed Jun. 7, 2018, SanDisk Technologies LLC.
Notification of Transmittal of the International Search Report and Written Opinion of the International Search Authority for International Patent Application No. PCT/US2019/019879, dated May 30, 2019, 2 pages.
International Search Report from the International Searching Authority for International Patent Application No. PCT/US2019/019879, dated May 30, 2019, 3 pages.
Written Opinion of the International Searching Authority for International Patent Application No. PCT/US2019/019879, dated May 30, 2019, 5 pages.

* cited by examiner

THREE-DIMENSIONAL PHASE CHANGE MEMORY ARRAY INCLUDING DISCRETE MIDDLE ELECTRODES AND METHODS OF MAKING THE SAME

FIELD

The present disclosure relates generally to the field of semiconductor devices and specifically to three-dimensional phase change memory arrays including discrete middle electrodes and methods of making the same.

BACKGROUND

A phase change material (PCM) memory device is a type of non-volatile memory device that stores information as a resistive state of a material that can be in different resistive states corresponding to different phases of the material. The different phases can include an amorphous state having high resistivity and a crystalline state having low resistivity (i.e., a lower resistivity than in the amorphous state). The transition between the amorphous state and the crystalline state can be induced by controlling the rate of cooling after application of an electrical pulse that renders the phase change memory material in a first part of a programming process. The second part of the programming process includes control of the cooling rate of the phase change memory material. If rapid quenching occurs, the phase change memory material can cool into an amorphous high resistivity state. If slow cooling occurs, the phase change memory material can cool into a crystalline low resistivity state.

SUMMARY

According to an aspect of the present disclosure, a three-dimensional phase change memory device is provided, which comprises: a first group of alternating stacks of insulating strips and electrically conductive strips located over a substrate, wherein each of the insulating strips and electrically conductive strips within the first group of alternating stacks laterally extends along a first horizontal direction, and the alternating stacks within the first group are laterally spaced apart along a second horizontal direction; laterally alternating sequences of vertical bit lines and dielectric isolation pillars located between each neighboring pair of alternating stacks; wherein a phase change memory cell including a discrete metal portion, a phase change memory material portion, and a selector material portion is located in each intersection region between the electrically conductive strips and the vertical bit lines.

According to another aspect of the present disclosure, a method of forming a three-dimensional phase change memory device is provided, which comprises the steps of: forming a vertically alternating sequence of continuous insulating layers and continuous sacrificial material layers over a substrate; forming line trenches laterally extending along a first horizontal direction through the vertically alternating sequence, wherein patterned portions of the vertically alternating sequence comprise alternating stacks of insulating strips and sacrificial material strips that laterally extend along the first horizontal direction, and the alternating stacks within the first group are laterally spaced apart along a second horizontal direction; forming a laterally alternating sequence of pillar cavities and dielectric isolation pillars within each of the line trenches; forming a phase change memory cell including a discrete metal portion, a phase change memory material portion, and a selector material portion at each level of the sacrificial material strips at a periphery of each of the pillar cavities; forming a backside trench laterally extending along the second horizontal direction through each of the alternating stacks of insulating strips and sacrificial material strips; replacing remaining portions of the sacrificial material strips with material portions that include electrically conductive strips; and forming vertical bit lines in the two-dimensional array of pillar cavities.

According to yet another aspect of the present disclosure, a three-dimensional phase change memory device is provided, which comprises: alternating stacks of insulating strips and electrically conductive strips located over a substrate, wherein each of the insulating strips and electrically conductive strips laterally extend along a first horizontal direction, and the alternating stacks are laterally spaced apart along a second horizontal direction; and laterally alternating sequences of vertical bit lines and dielectric isolation pillars located between each neighboring pair of alternating stacks; a phase change memory cell including a discrete metal portion, a phase change memory material portion, and a selector material portion located in each intersection region between the electrically conductive strips and the vertical bit lines, wherein each of the electrically conductive strips comprises a word line that is in direct contact with a respective row of dielectric isolation pillars located between a neighboring pair of alternating stacks.

According to still another aspect of the present disclosure, a method of forming a three-dimensional phase change memory device, comprising: forming a vertically alternating sequence of continuous insulating layers and continuous sacrificial material layers over a substrate; forming line trenches laterally extending along a first horizontal direction through the vertically alternating sequence, wherein patterned portions of the vertically alternating sequence comprise alternating stacks of insulating strips and sacrificial material strips that laterally extend along the first horizontal direction and are laterally spaced apart along a second horizontal direction; forming a laterally alternating sequence of pillar cavities and sacrificial pillar structures within each of the line trenches; forming a phase change memory cell including a discrete metal portion, a phase change memory material portion, and a selector material portion at each level of the sacrificial material strips at a periphery of each of the pillar cavities; forming vertical bit lines in the two-dimensional array of pillar cavities; forming backside openings by removing the sacrificial pillar structures selective to the vertical bit lines; and replacing remaining portions of the sacrificial material strips with material portions that include electrically conductive strips.

BRIEF DESCRIPTION OF THE DRAWINGS

FIG. 56A is a horizontal cross-sectional view of the seventh configuration of the second exemplary structure after formation of discrete metal portions and discrete selector material portions according to the second embodiment of the present disclosure.

FIG. 56B is a vertical cross-sectional view along the vertical plane B-B' of the seventh configuration of the second exemplary structure of FIG. 56A. The horizontal plane A-A' is the plane of the horizontal cross-sectional view of FIG. 56A.

FIG. 57A is a horizontal cross-sectional view of the seventh configuration of the second exemplary structure after formation of a phase change memory material layer according to the second embodiment of the present disclosure.

FIG. 57B is a vertical cross-sectional view along the vertical plane B-B' of the seventh configuration of the second exemplary structure of FIG. 57A. The horizontal plane A-A' is the plane of the horizontal cross-sectional view of FIG. 57A.

FIG. 58A is a horizontal cross-sectional view of the seventh configuration of the second exemplary structure after formation of phase change memory material layers and vertical bit lines according to the second embodiment of the present disclosure.

FIG. 58B is a vertical cross-sectional view along the vertical plane B-B' of the seventh configuration of the second exemplary structure of FIG. 58A. The horizontal plane A-A' is the plane of the horizontal cross-sectional view of FIG. 58A.

FIG. 59A is a horizontal cross-sectional view of the seventh configuration of the second exemplary structure after formation of backside openings and backside cavities according to the second embodiment of the present disclosure.

FIG. 59B is a vertical cross-sectional view along the vertical plane B-B' of the seventh configuration of the second exemplary structure of FIG. 59A. The horizontal plane A-A' is the plane of the horizontal cross-sectional view of FIG. 59A.

FIG. 59C is a top-down view of the seventh configuration of the second exemplary structure of FIGS. 59A and 59B.

FIG. 60A is a horizontal cross-sectional view of the seventh configuration of the second exemplary structure after formation of electrically conductive strips according to the second embodiment of the present disclosure.

FIG. 60B is a vertical cross-sectional view along the vertical plane B-B' of the seventh configuration of the second exemplary structure of FIG. 60A. The horizontal plane A-A' is the plane of the horizontal cross-sectional view of FIG. 60A.

FIG. 61A is a horizontal cross-sectional view of the seventh configuration of the second exemplary structure after formation of dielectric isolation pillars according to the second embodiment of the present disclosure.

Figure 61B:
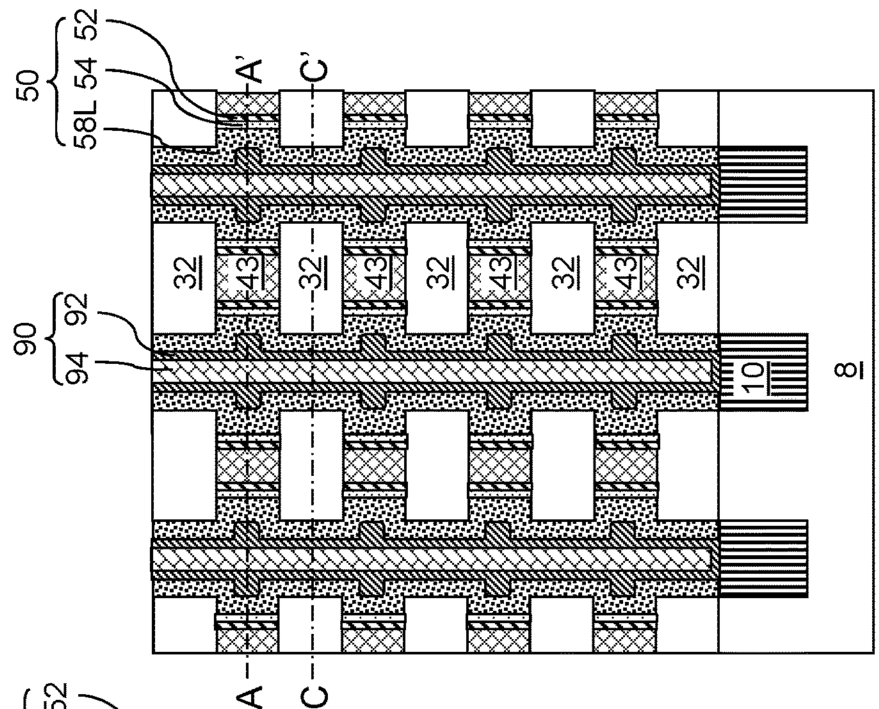
Figure 61A:
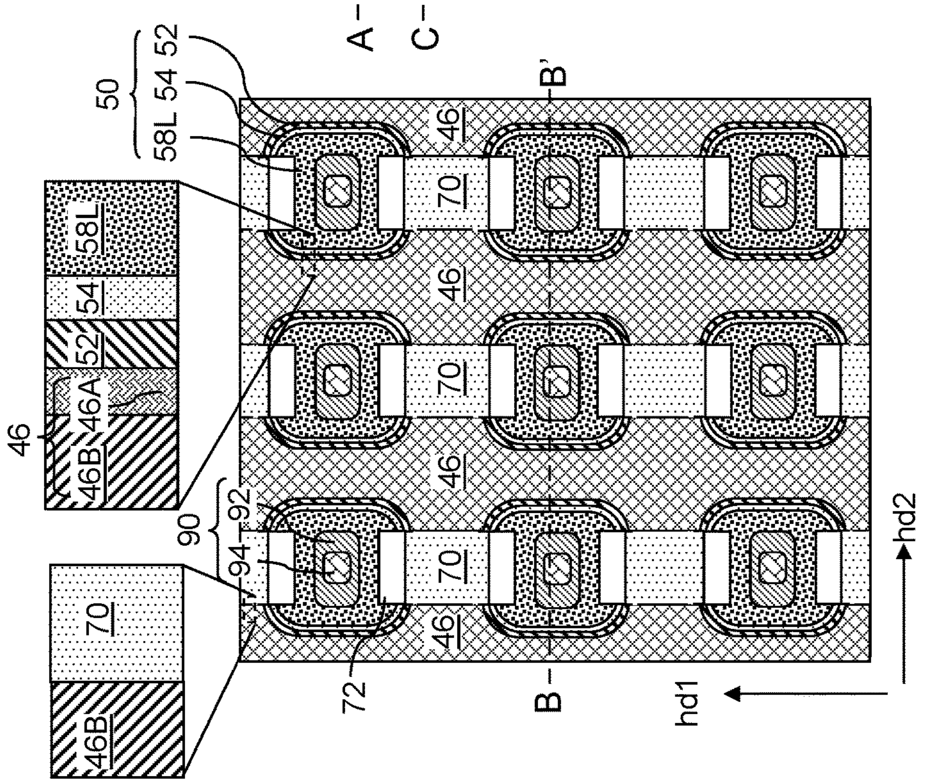

FIG. 61B is a vertical cross-sectional view along the vertical plane B-B' of the seventh configuration of the second exemplary structure of FIG. 61A. The horizontal plane A-A' is the plane of the horizontal cross-sectional view of FIG. 61A.

Figure 61C:
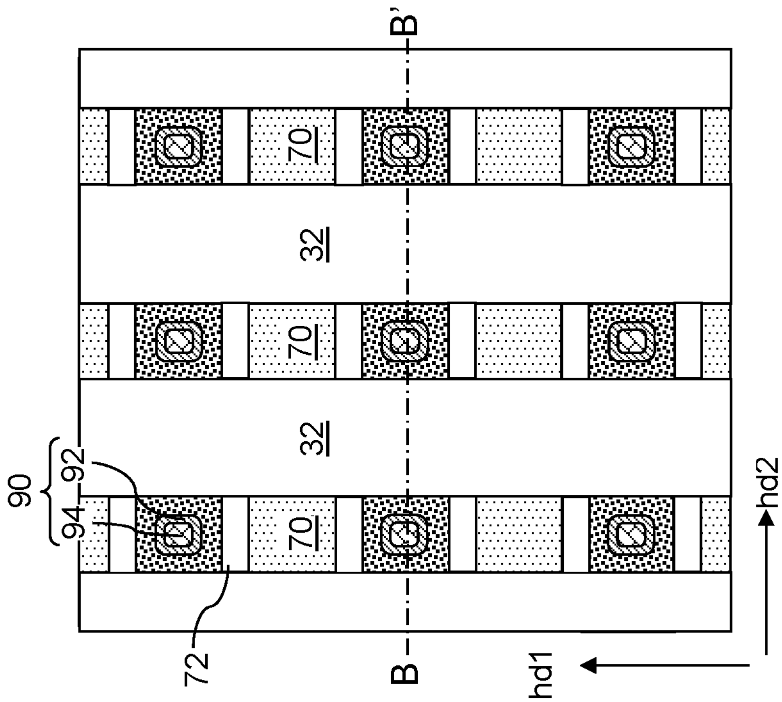

FIG. 61C is a top-down view of the seventh configuration of the second exemplary structure of FIGS. 61A and 61B.

Figure 62B:
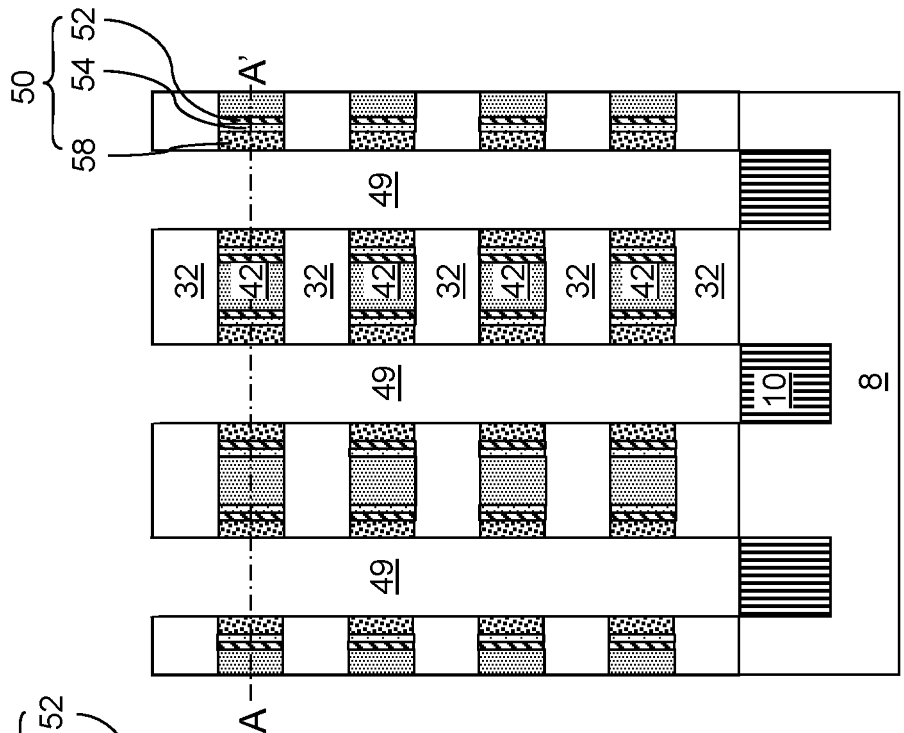
Figure 62A:
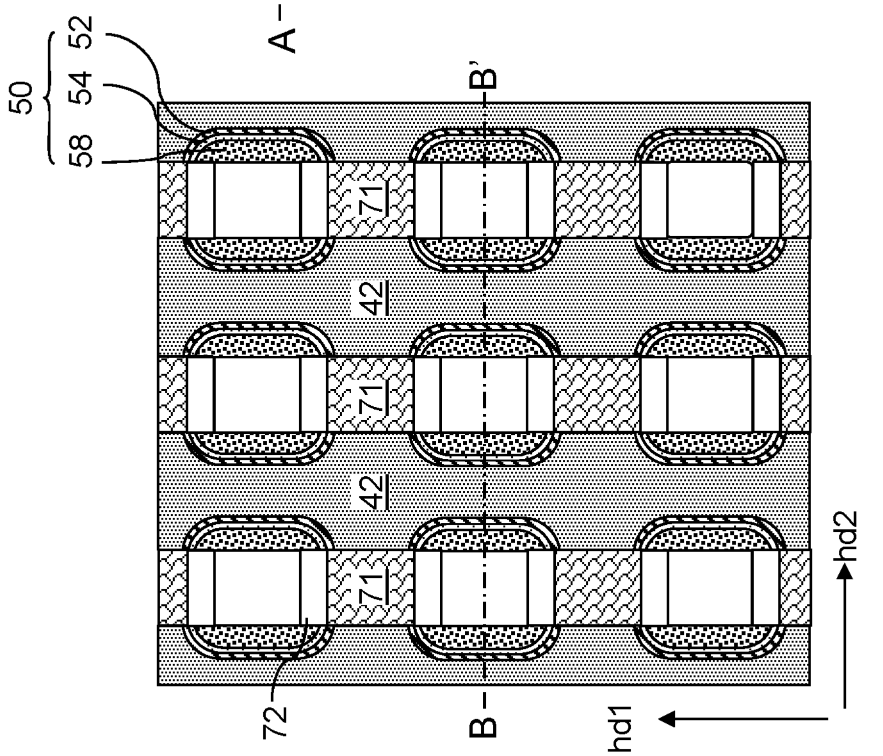

FIG. 62A is a horizontal cross-sectional view of the eighth configuration of the second exemplary structure after formation of phase change memory material portions according to the second embodiment of the present disclosure.

FIG. 62B is a vertical cross-sectional view along the vertical plane B-B' of the eighth configuration of the second exemplary structure of FIG. 62A. The horizontal plane A-A' is the plane of the horizontal cross-sectional view of FIG. 62A.

Figure 63A:
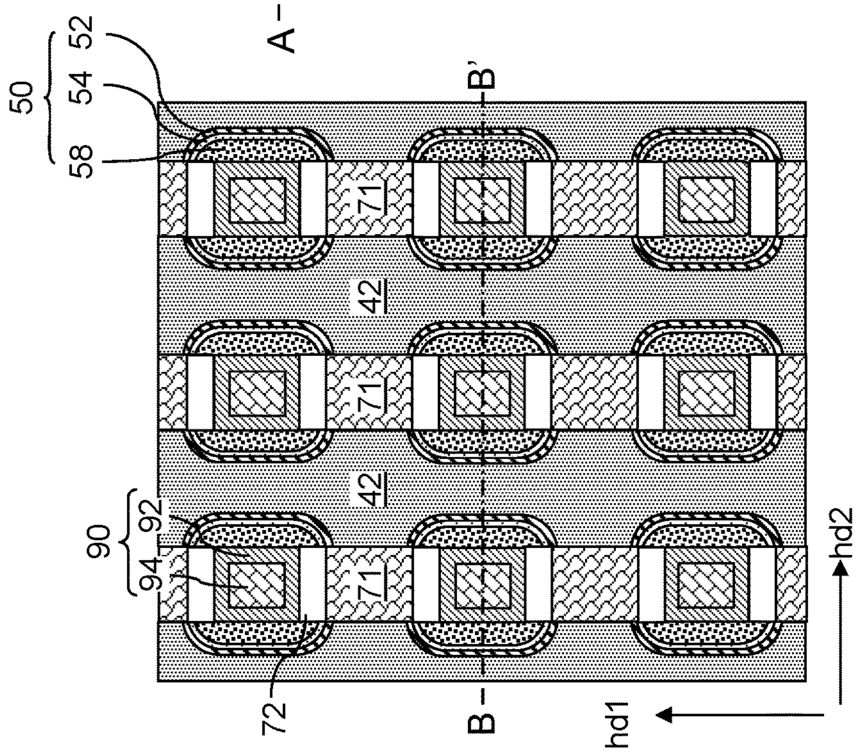

FIG. 63A is a horizontal cross-sectional view of the eighth configuration of the second exemplary structure after formation of phase change memory material portions and vertical bit lines according to the second embodiment of the present disclosure.

Figure 63B:
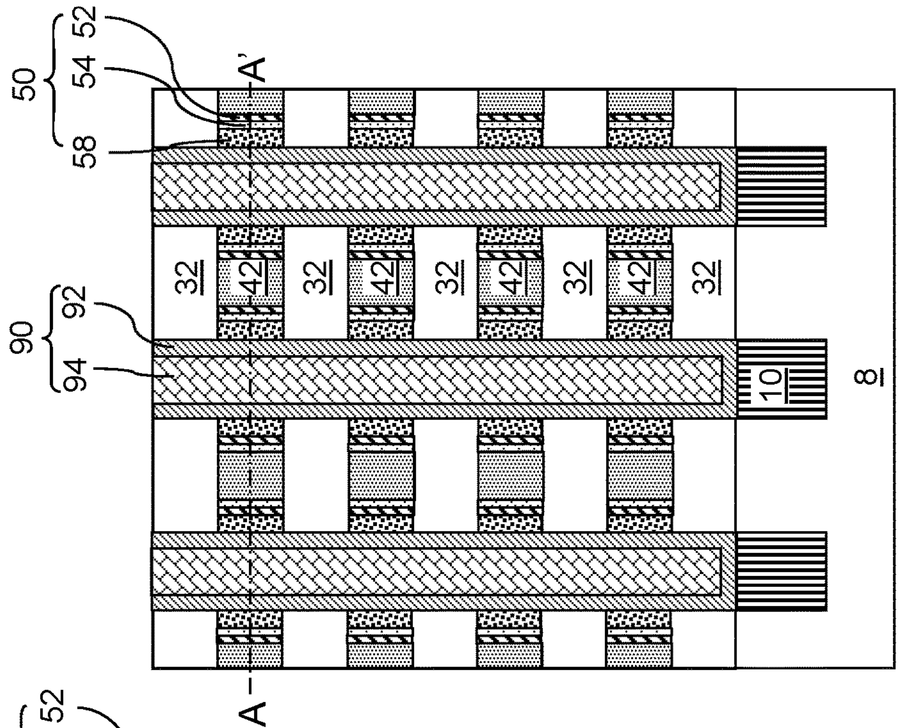

FIG. 63B is a vertical cross-sectional view along the vertical plane B-B' of the eighth configuration of the second exemplary structure of FIG. 63A. The horizontal plane A-A' is the plane of the horizontal cross-sectional view of FIG. 63A.

Figure 64B:
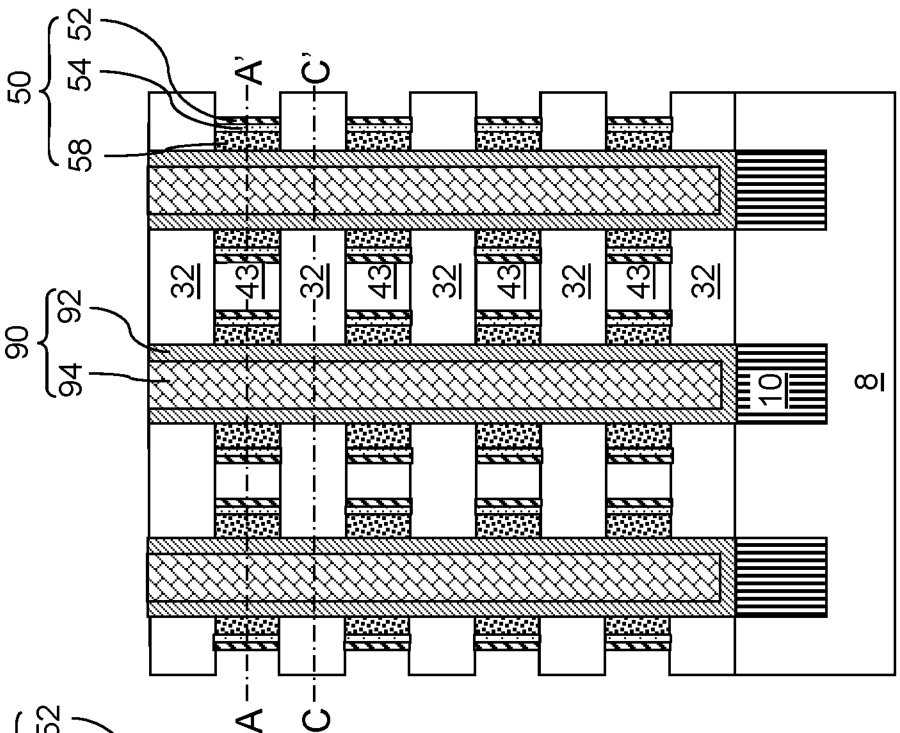
Figure 64A:
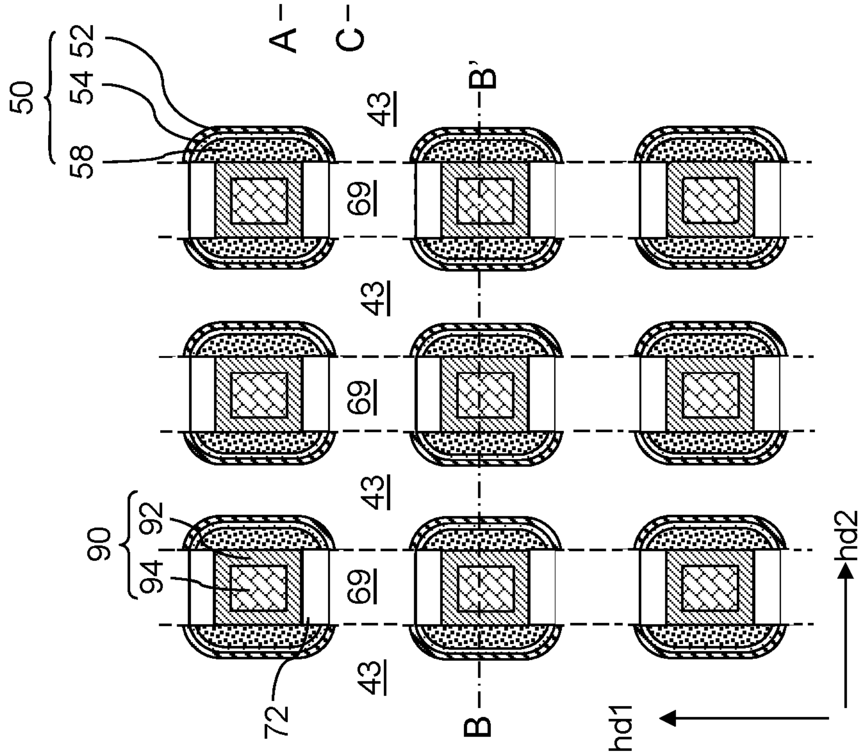

FIG. 64A is a horizontal cross-sectional view of the eighth configuration of the second exemplary structure after formation of backside openings and backside cavities according to the second embodiment of the present disclosure.

FIG. 64B is a vertical cross-sectional view along the vertical plane B-B' of the eighth configuration of the second exemplary structure of FIG. 64A. The horizontal plane A-A' is the plane of the horizontal cross-sectional view of FIG. 64A.

Figure 65B:
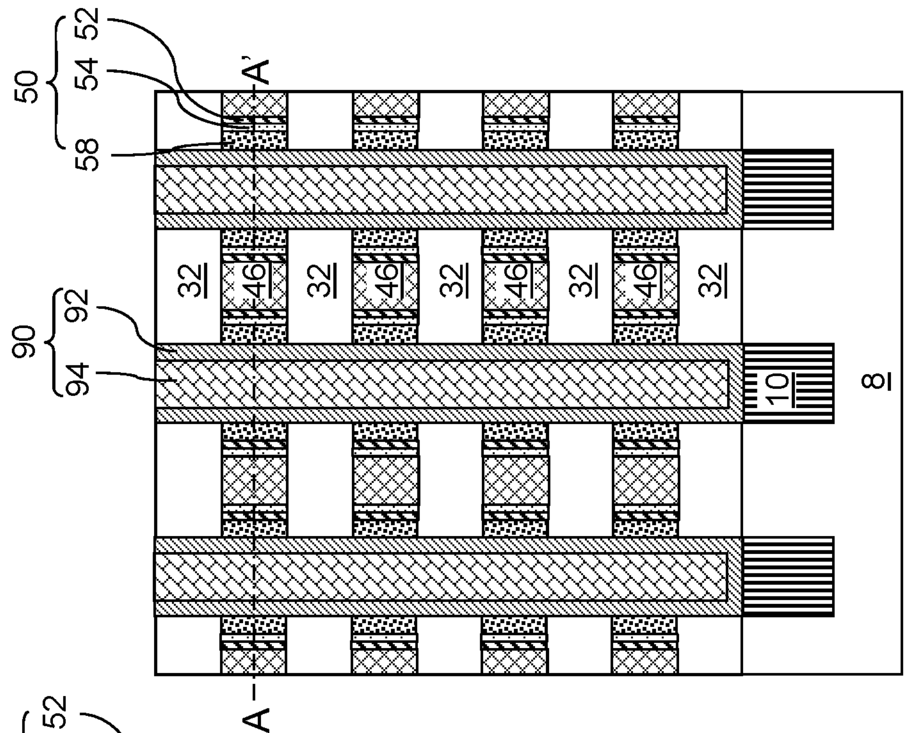
Figure 65A:
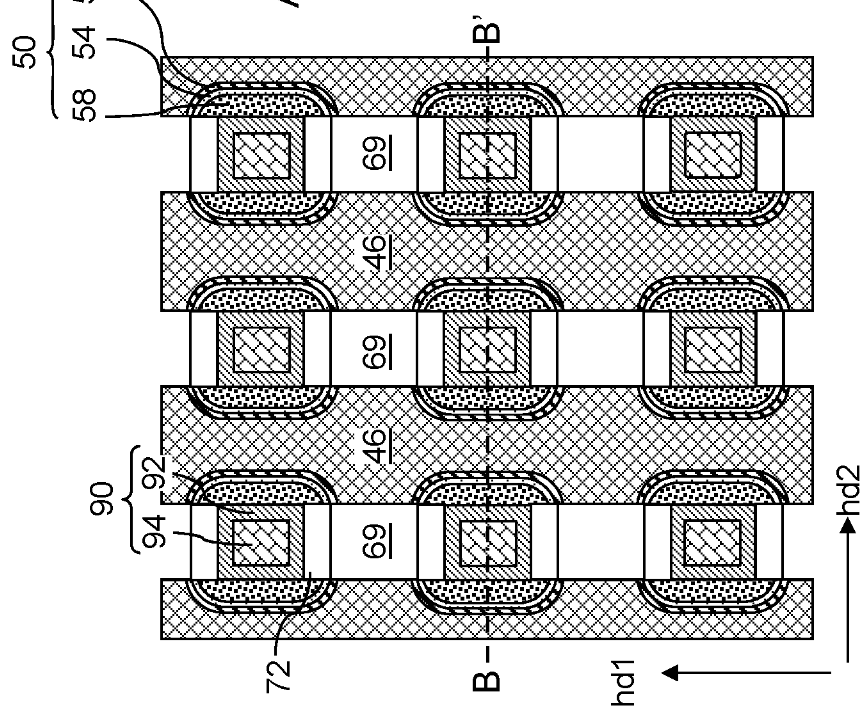

FIG. 65A is a horizontal cross-sectional view of the eighth configuration of the second exemplary structure after formation of electrically conductive strips according to the second embodiment of the present disclosure.

FIG. 65B is a vertical cross-sectional view along the vertical plane B-B' of the eighth configuration of the second exemplary structure of FIG. 65A. The horizontal plane A-A' is the plane of the horizontal cross-sectional view of FIG. 65A.

Figure 66B:
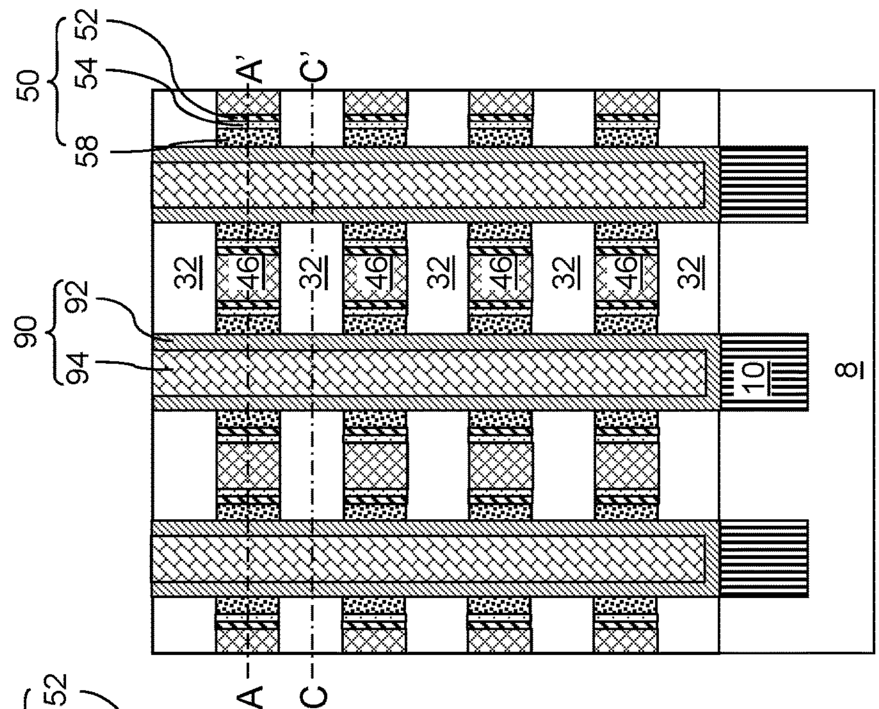
Figure 66A:
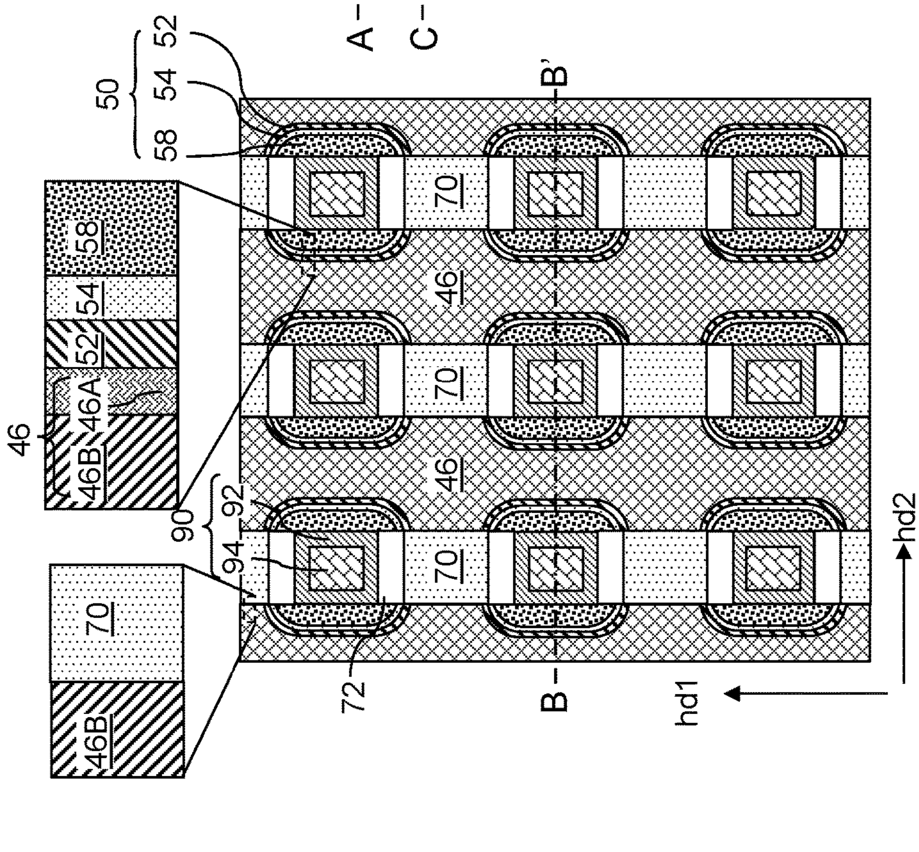

FIG. 66A is a horizontal cross-sectional view of the eighth configuration of the second exemplary structure after formation of dielectric isolation pillars according to the second embodiment of the present disclosure.

FIG. 66B is a vertical cross-sectional view along the vertical plane B-B' of the eighth configuration of the second exemplary structure of FIG. 66A. The horizontal plane A-A' is the plane of the horizontal cross-sectional view of FIG. 66A.

Figure 66C:
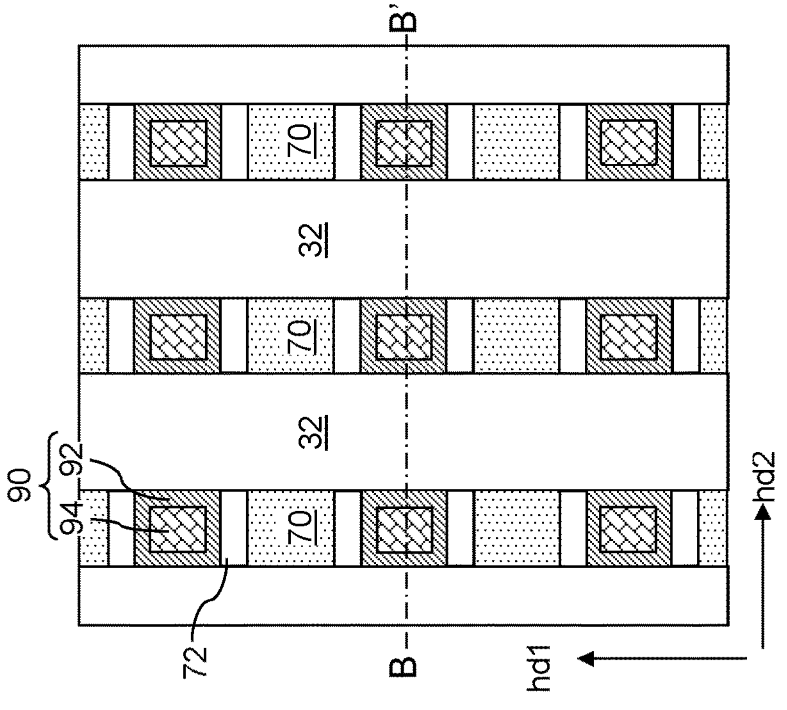

FIG. 66C is a top-down view of the eighth configuration of the second exemplary structure of FIGS. 66A and 66B.

DETAILED DESCRIPTION

A method of making a three-dimensional cross-point phase change memory array typically includes separate lithographic patterning of each memory level. The processing cost for manufacture of such three-dimensional cross-point phase change memory arrays increase with the total number of memory levels, and can become cost-prohibitive. Further, controlled etching of selector material layers and phase change memory material layers is used to manufacture such cross-point phase change memory arrays. Thus, undercut and etch damage during pattering of the selector material layers and the phase change memory material layers can degrade reliability of phase change memory cells.

Embodiments of the present disclosure are directed to three-dimensional phase change memory arrays including discrete middle electrodes and methods of making the same, without requiring a separate lithographic patterning at each device level, various aspects of which are described below.

The drawings are not drawn to scale. Multiple instances of an element may be duplicated where a single instance of the element is illustrated, unless absence of duplication of elements is expressly described or clearly indicated otherwise. Unless otherwise indicated, a "contact" between elements refers to a direct contact between elements that provides an edge or a surface shared by the elements. Ordinals such as "first," "second," and "third" are employed merely to identify similar elements, and different ordinals may be employed across the specification and the claims of the instant disclosure. A same reference numeral refers to a same element or a similar element. Unless otherwise noted, elements with a same reference numeral are presumed to have a same material composition.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor.

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant.

As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulator material" or a "dielectric material" refers to a material having electrical conductivity less than $1.0\times10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0\times10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

Figure 1:
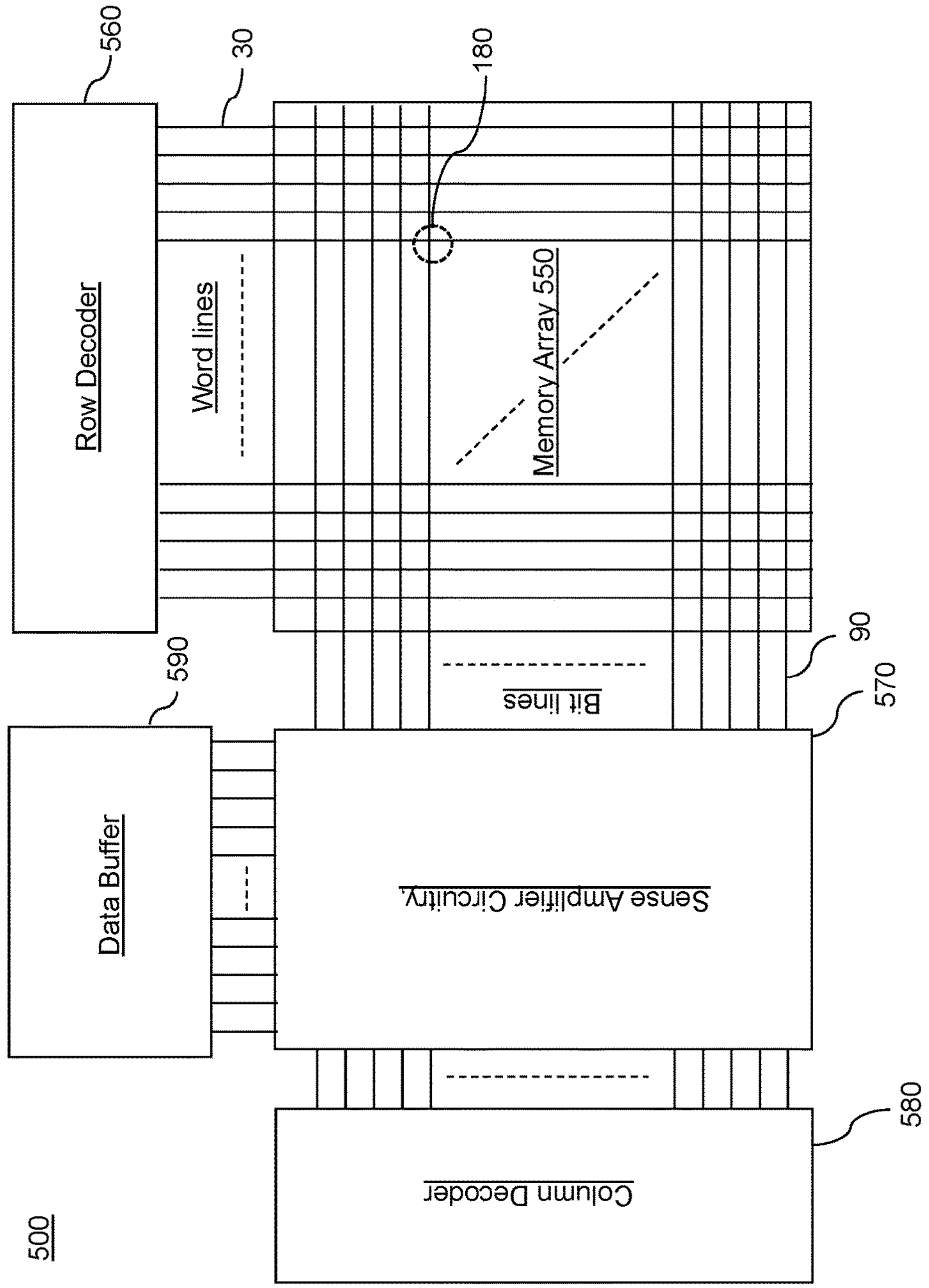
FIG. 1 is a schematic diagram of a memory device including memory cells of the present disclosure in an array configuration.

Referring to FIG. 1, a schematic diagram is shown for a non-volatile memory device including non-volatile memory cells of the present disclosure in an array configuration. The non-volatile memory device can be configured as a resistive random access memory device. As used herein, a "random access memory device" refers to a memory device including memory cells that allow random access, i.e., access to any selected memory cell upon a command for reading the contents of the selected memory cell. As used herein, a "resistive random access memory device" refers to a random access memory device in which the memory cells include a resistive memory element, such as a phase change memory element.

The resistive random access memory device 500 of the present disclosure includes a memory array region 550 containing an array of the respective memory cells 180 located at the intersection of the respective word lines (which may be embodied as first electrically conductive lines 30 as illustrated or as second electrically conductive lines 90 in an alternate configuration) and bit lines (which may be embodied as second electrically conductive lines 90 as illustrated or as first electrically conductive lines 30 in an alternate configuration). The device 500 may also contain a row decoder 560 connected to the word lines, a sense circuitry 570 (e.g., a sense amplifier and other bit line control circuitry) connected to the bit lines, a column decoder 580 connected to the bit lines and a data buffer 590 connected to the sense circuitry. Multiple instances of the memory cells 180 are provided in an array configuration that forms the random access memory device 500. It should be noted that the location and interconnection of elements are schematic and the elements may be arranged in a different configuration.

Each memory cell 180 includes a phase change memory material having at least two different phases having at least two different resistivity states. The phase change memory material is provided between a first electrode and a second electrode within each memory cell 180. Configurations of the memory cells 180 are described in detail in subsequent sections.

Referring to FIGS. 2A, 2B, 3A, 3B, 4A, and 4B, various configurations of an exemplary structure is illustrated, which includes a substrate 8 and an array of access nodes 10 located over an upper portion of the substrate 8. The substrate 8 can include a semiconductor substrate on which access semiconductor devices are formed. The access semiconductor devices can include, for example, a CMOS circuitry (e.g., driver circuits) configured to individually access a two-dimensional array of bit lines to be subsequently formed. The CMOS circuitry can be connected to the array of access nodes via metal interconnect structures (not expressly shown). In the first embodiment, the array of access nodes 10 can be an array of global bit lines that are electrically connected to the CMOS circuitry. Plural local vertical bit lines will be formed at a later step in contact with each respective global bit line.

Figure 2A:
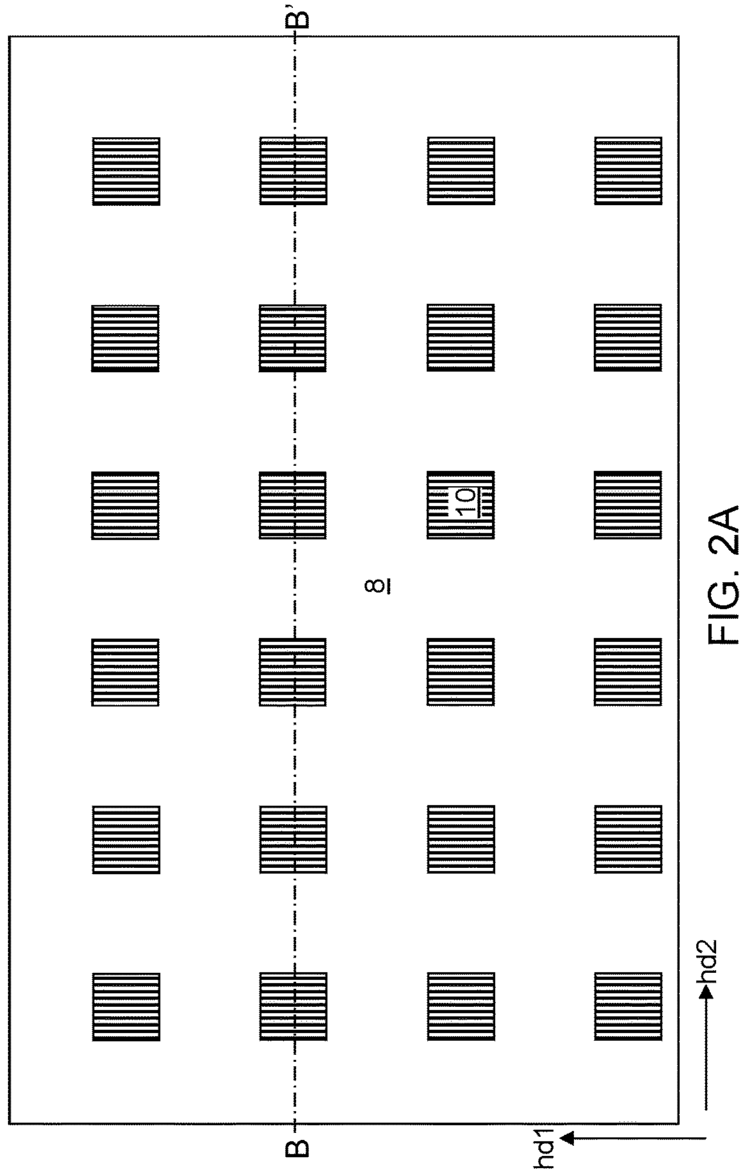
FIG. 2A is a top-down view of a first exemplary array of access nodes provided on a substrate on which any of the three-dimensional phase change memory array can be subsequently formed according to an embodiment of the present disclosure.
Figure 2B:
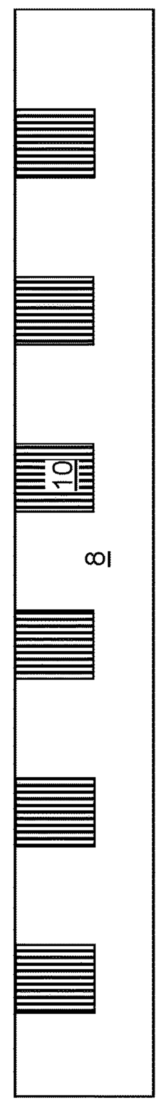
FIG. 2B is a vertical cross-sectional view along the horizontal plane B-B' of the first exemplary array of access nodes of FIG. 2A.
Figure 3A:
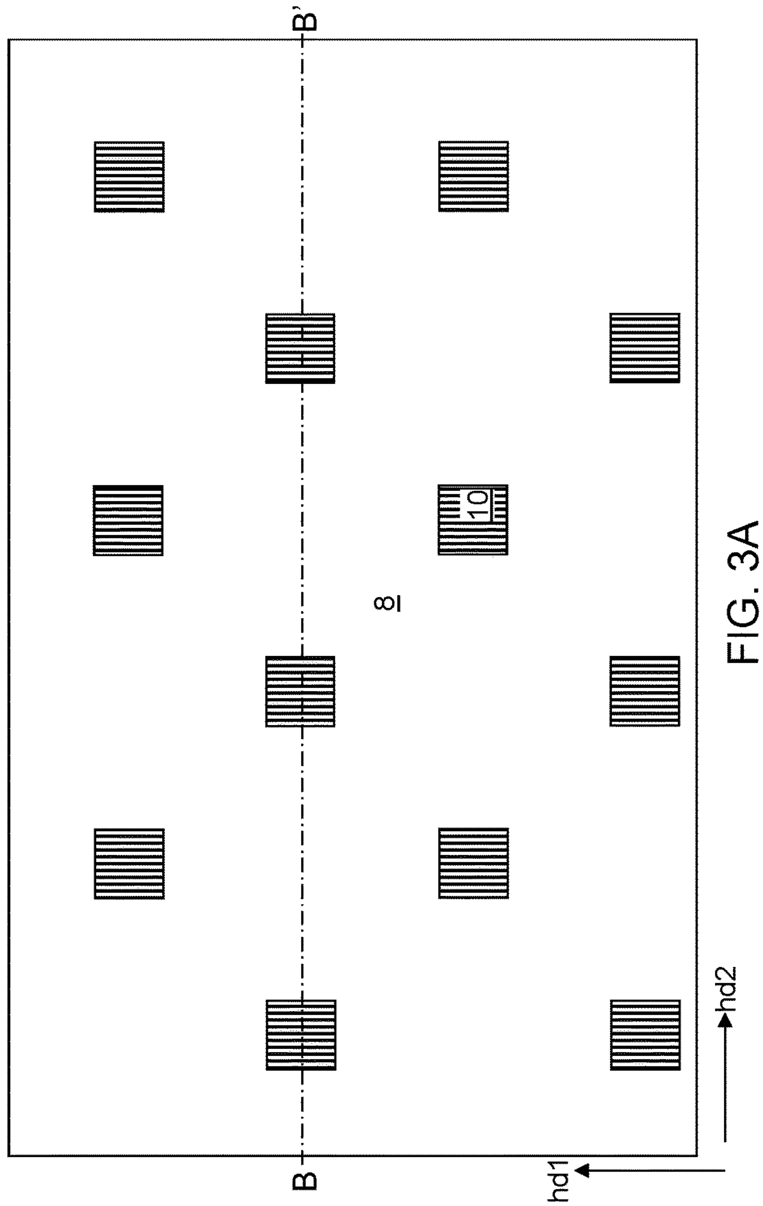
FIG. 3A is a top-down view of a second exemplary array of access nodes provided on a substrate on which any of the three-dimensional phase change memory array can be subsequently formed according to an embodiment of the present disclosure.
Figure 3B:
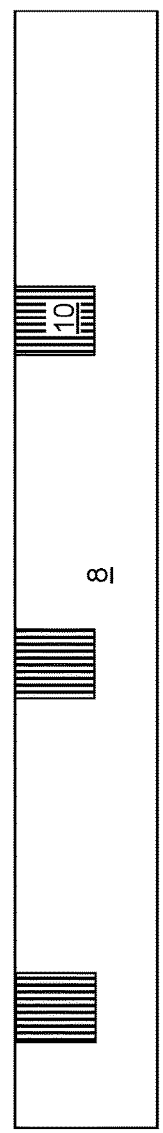
FIG. 3B is a vertical cross-sectional view along the horizontal plane B-B' of the second exemplary array of access nodes of FIG. 3A.
Figure 4A:
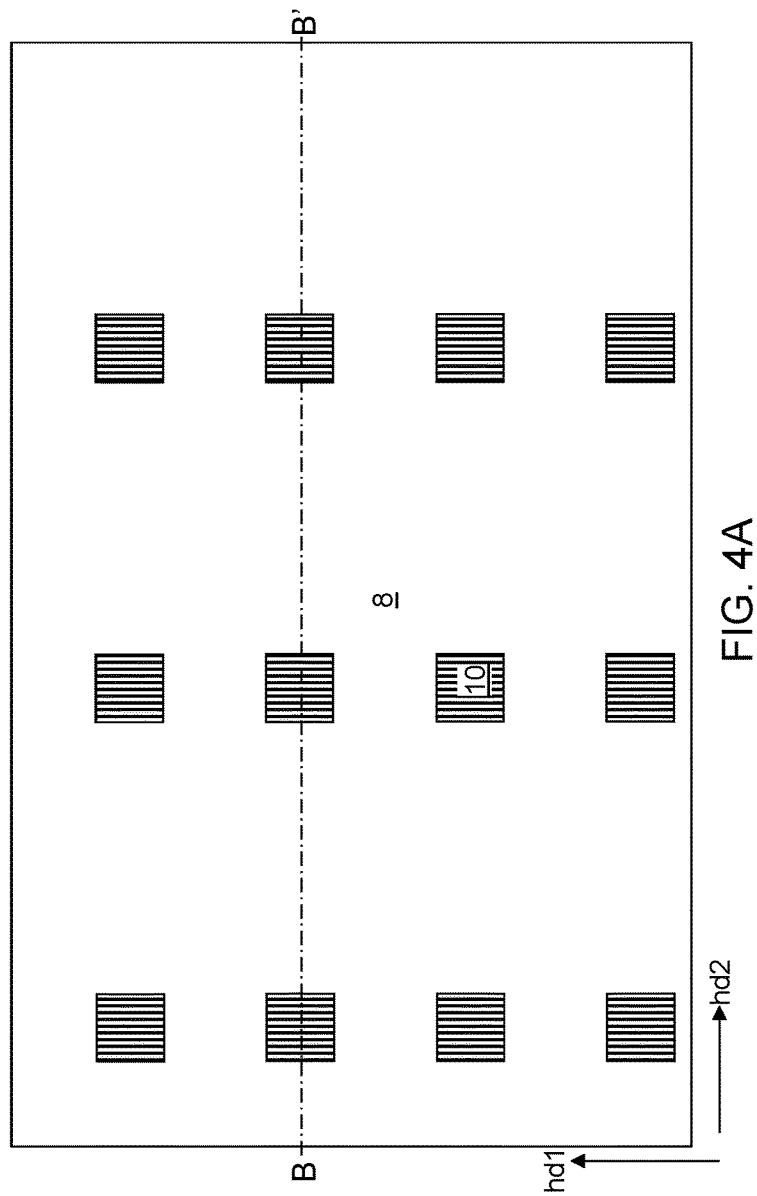
FIG. 4A is a top-down view of a third exemplary array of access nodes provided on a substrate on which any of the three-dimensional phase change memory array can be subsequently formed according to an embodiment of the present disclosure.
Figure 4B:
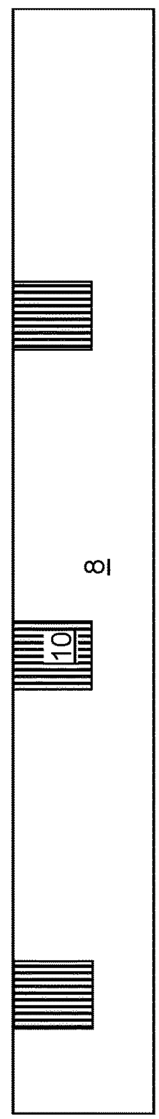
FIG. 4B is a vertical cross-sectional view along the horizontal plane B-B' of the third exemplary array of access nodes of FIG. 4A.

FIGS. 2A and 2B illustrate a first exemplary array of access nodes 10 located over the substrate 8. FIGS. 3A and 3B illustrate a second exemplary array of access nodes 10 located over the substrate 8. FIGS. 4A and 4B illustrate a third exemplary array of access nodes 10 located over the substrate. Generally, an array of access nodes 10 can be arranged as a two-dimensional array extending along a first horizontal direction hd1 and along a second horizontal direction hd2 that is perpendicular to the first horizontal direction hd1. The pitch (i.e., the minimum distance of repetition of a periodic structure) of the array of access nodes 10 along the first horizontal direction hd1 is herein referred to as a first pitch, and the pitch of the array of access nodes 10 along the second horizontal direction hd2 is herein referred to as a second pitch.

The first exemplary array of access nodes 10 illustrated in FIGS. 2A and 2B employ a rectangular array for the array of access nodes 10 with minimum pitches along the first and second horizontal directions (hd1, hd2) to provide maximum density. The second exemplary array of access nodes 10 illustrated in FIGS. 3A and 3B employ a diagonal array for the array of access nodes to reduce leakage current among neighboring memory cells to be subsequently formed along the first horizontal direction hd1 and/or along the second horizontal direction hd2. The third exemplary array of access nodes 10 illustrated in FIGS. 4A and 4B employ a relaxed pitch along the second horizontal direction to reduce leakage current among memory cells to be subsequently formed and laterally spaced apart along the second horizontal direction hd2. A three-dimensional phase change memory array can be formed on any of the exemplary array of access nodes 10 illustrated herein, or any other two-dimensional periodic array of access nodes 10.

Embodiments of the present disclosure are described employing the configuration of the first exemplary array of access nodes 10 illustrated in FIGS. 2A and 2B for simplicity. However, the bit lines of the present disclosure can be formed to match any other configuration of the underlying array of access nodes 10. Further, embodiments are expressly contemplated herein in which an array of access nodes is formed over a two-dimensional array of bit lines.

Figure 5B:
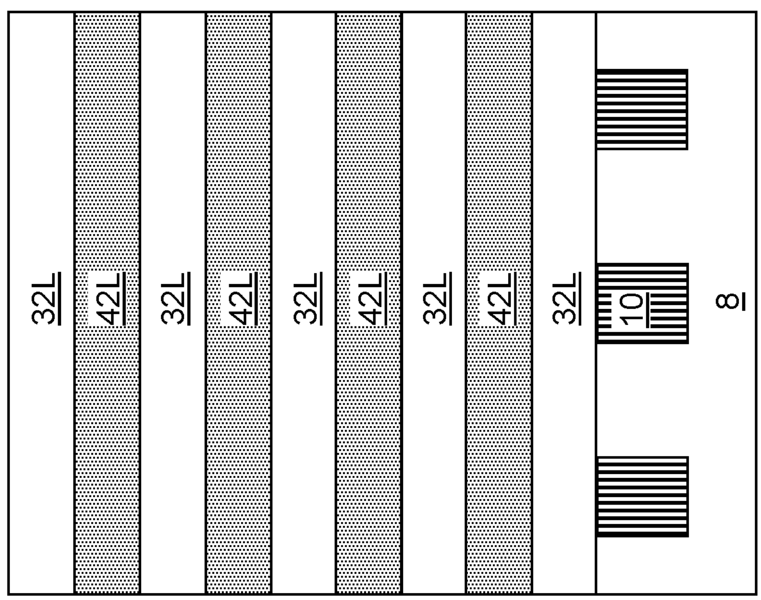
FIG. 5B is a vertical cross-sectional view along the vertical plane B-B' of the first configuration of the first exemplary structure of FIG. 5A.
Figure 5A:
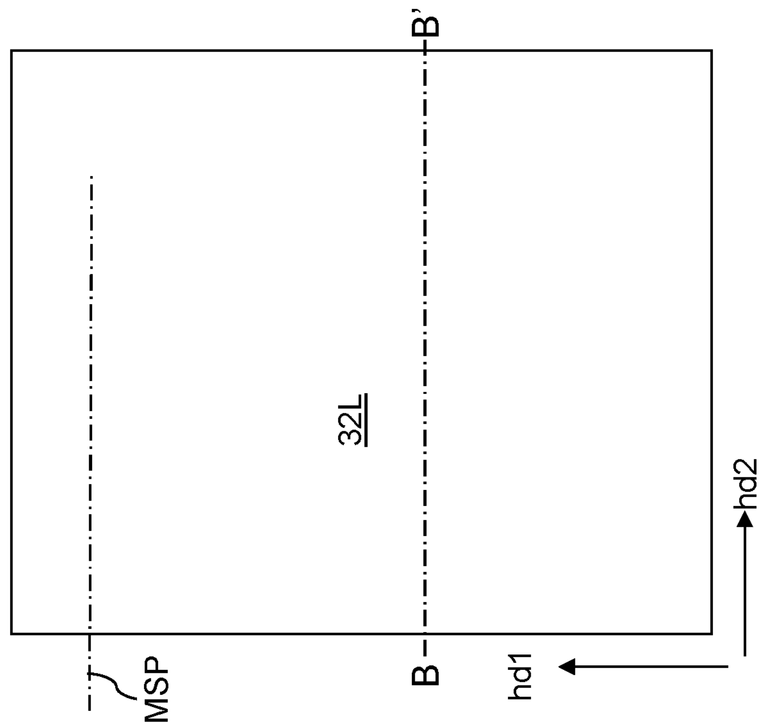
FIG. 5A is a top-down view of a first configuration of a first exemplary structure for forming a three-dimensional phase change memory device after formation of a vertically alternating sequence of continuous insulating layers and continuous sacrificial material layers over the substrate according to a first embodiment of the present disclosure.

Referring to FIGS. 5A and 5B, a first configuration of a first exemplary structure is illustrated, which can be employed to form a three-dimensional phase change memory device. A vertically alternating sequence of continuous insulating layers 32L and continuous sacrificial material layers 42L is formed over the substrate 8. As used herein, an "alternating sequence" of first elements and second elements is a structure in which the first elements and the second elements are arranged in an alternating manner along a straight direction. As used herein, a "vertically alternating sequence" of first elements and second elements refers to an alternating sequence in which the first elements and the second elements are arranged in an alternating manner along a vertical direction.

Each continuous insulating layer 32L can be a blanket (unpatterned) material layer including an insulating material such as a silicon oxide material (such as undoped silicate glass or doped silicate glass). Each continuous sacrificial material layer 42L can be a blanket sacrificial material layer including a sacrificial material that is subsequently removed. For example, the sacrificial material of the continuous sacrificial material layers 42L can include silicon nitride, amorphous or polycrystalline semiconductor material (such as silicon or a silicon-germanium alloy), or a dielectric material that can be removed selective to the silicon oxide material of the continuous insulating layers 32L (such as borosilicate glass or organosilicate glass that can provide an etch rate that is at least 10 times the etch rate of undoped silicate glass). The thickness of each continuous insulating layer 32L can be in a range from 15 nm to 80 nm, and the thickness of each continuous sacrificial material layer 42L can be in a range from 15 nm to 80 nm, although lesser or greater thicknesses can be employed for each of the continuous insulating layers 32L and the continuous sacrificial material layers 42L. The total number of repetitions of a neighboring pair of a continuous insulating layer 32L and a continuous sacrificial material layer 42L can be in a range from 2 to 1,024, such as from 4 to 512, although lesser and greater number of repetitions can also be employed. In one embodiment, the vertically alternating sequence can begin with a bottommost continuous insulating layer 32L and terminate with a topmost continuous insulating layer 32L. A mirror symmetry plane MSP may be provided, which is a vertical two-dimensional plane about which the first configuration of the first exemplary structure has a mirror symmetry.

Figure 6B:
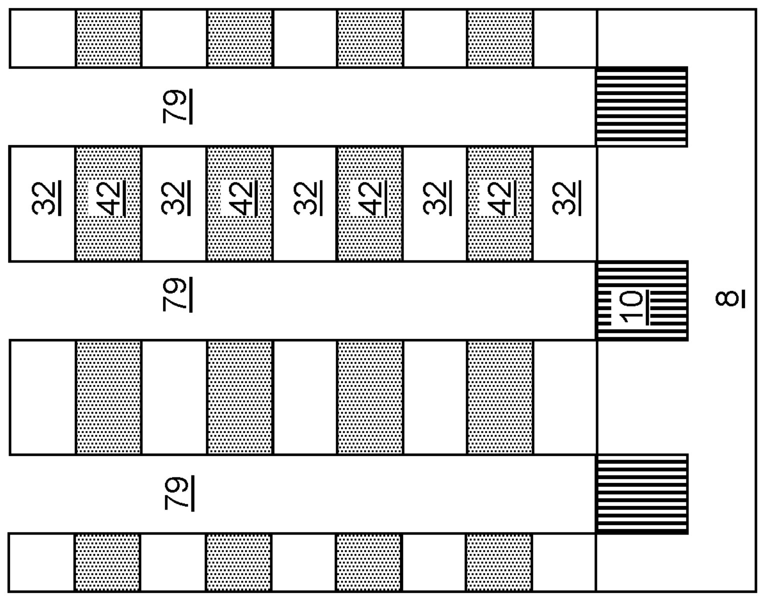
FIG. 6B is a vertical cross-sectional view along the vertical plane B-B' of the first configuration of the first exemplary structure of FIG. 6A.
Figure 6A:
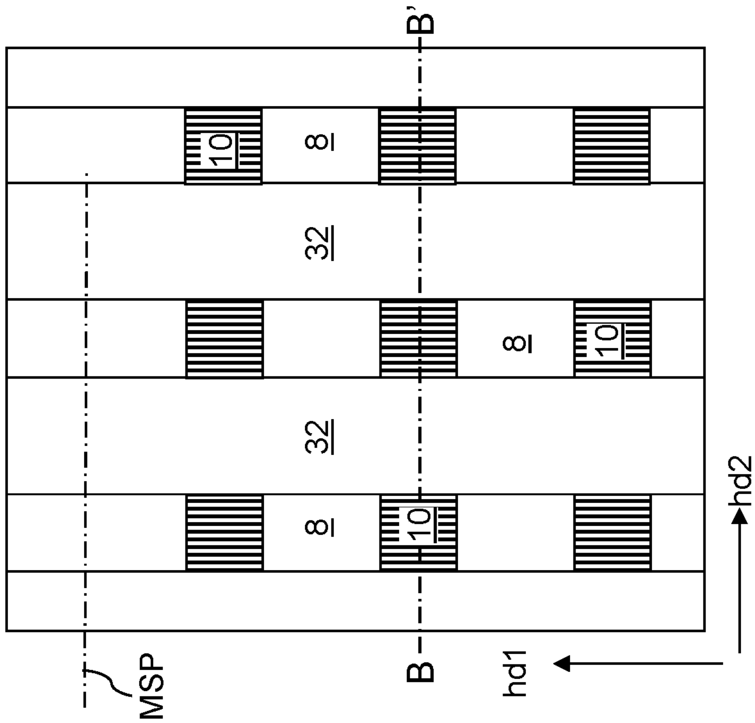
FIG. 6A is a top-down view of the first configuration of the first exemplary structure after formation of line trenches according to the first embodiment of the present disclosure.

Referring to FIGS. 6A and 6B, line trenches 79 laterally extending along the first horizontal direction hd1 can be formed through the vertically alternating sequence (32L, 42L) such that each access node 10 is physically exposed under a respective one of the line trenches 79. Patterned portions of the vertically alternating sequence (32L, 42L) comprise alternating stacks (32, 42) of insulating strips 32 and sacrificial material strips 42 that laterally extend along the first horizontal direction hd1. In one embodiment, the line trenches 79 can be formed as a periodic one-dimensional array. In this case, the alternating stacks (32, 42) can be arranged as a periodic one-dimensional array that is repeated along the second horizontal direction hd2. The alternating stacks (32, 42) can be laterally spaced apart along the second horizontal direction hd2 with an average pitch (which may be a uniform pitch if the alternating stacks (32, 42) are periodic), which is the sum of the width of an alternating stack (32, 42) along the second horizontal direction hd2 and the width of a line trench 79 along the second horizontal direction hd2. The width of each line trench 79 can be in a range from 30 nm to 200 nm, although lesser and greater widths can also be employed. The pitch of the one-dimensional array of alternating stacks (32, 42) can be in a range from 60 nm to 600 nm, although lesser and greater pitches can also be employed. A one-dimensional array of access nodes 10 can be physically exposed underneath each line trench 79.

Figure 7B:
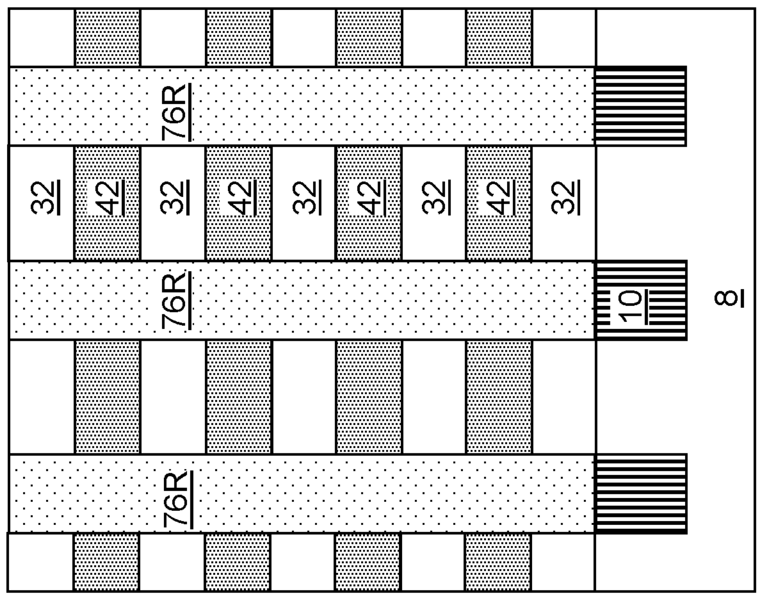
FIG. 7B is a vertical cross-sectional view along the vertical plane B-B' of the first configuration of the first exemplary structure of FIG. 7A.
Figure 7A:
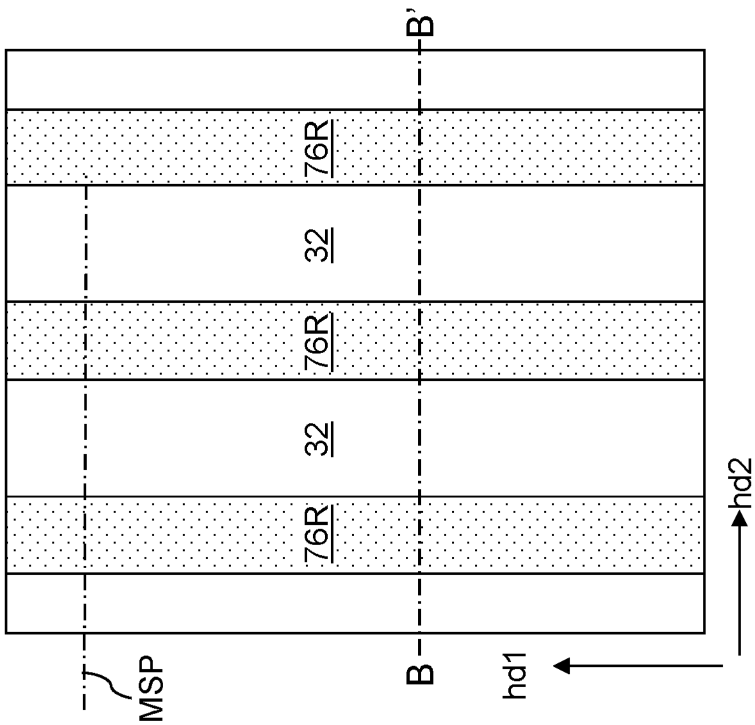
FIG. 7A is a top-down view of the first configuration of the first exemplary structure after formation of dielectric rails according to the first embodiment of the present disclosure.

Referring to FIGS. 7A and 7B, a dielectric material such as undoped silicate glass or doped silicate glass can be deposited in the line trenches 79. Excess portions of the dielectric material can be removed from above the top surfaces of the alternating stacks (32, 42) by a planarization process such as chemical mechanical planarization. Each remaining portion of the dielectric material filling a respective one of the line trenches 79 constitutes a dielectric rail 76R. As used herein, a "rail" or a "rail structure" refers to a structure having a horizontal lengthwise direction and having a uniform vertical cross-sectional shape along directions perpendicular to the horizontal lengthwise direction. In other words, a rail or a rail structure laterally extends along a lengthwise direction with a uniform vertical cross-sectional shape within planes that are perpendicular to the lengthwise direction. A laterally alternating sequence of alternating stacks (32, 42) and dielectric rails 76R is formed along the second horizontal direction.

Figure 8B:
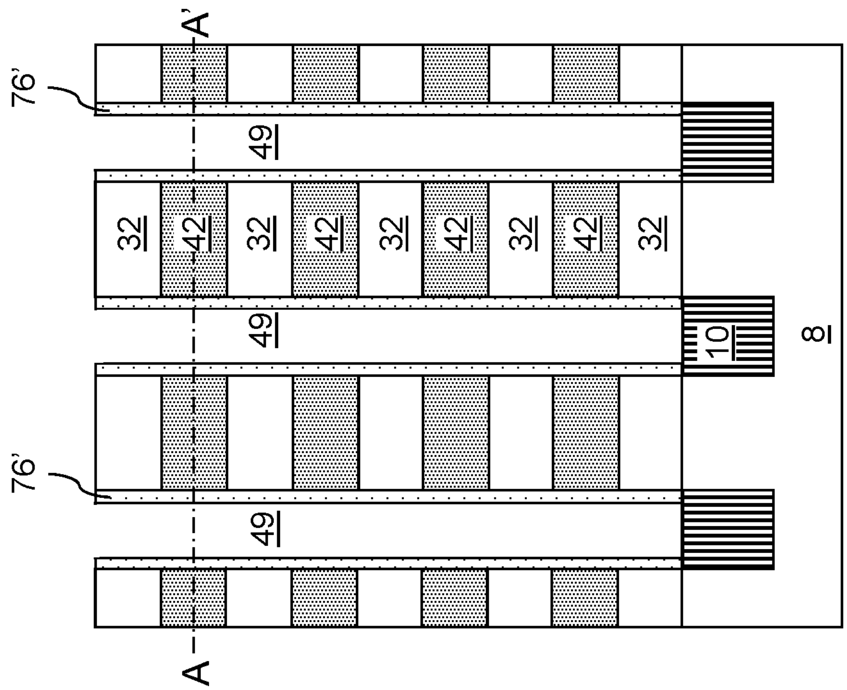
FIG. 8B is a vertical cross-sectional view along the vertical plane B-B' of the first configuration of the first exemplary structure of FIG. 8A. The horizontal plane A-A' is the plane of the horizontal cross-sectional view of FIG. 8A.
Figure 8A:
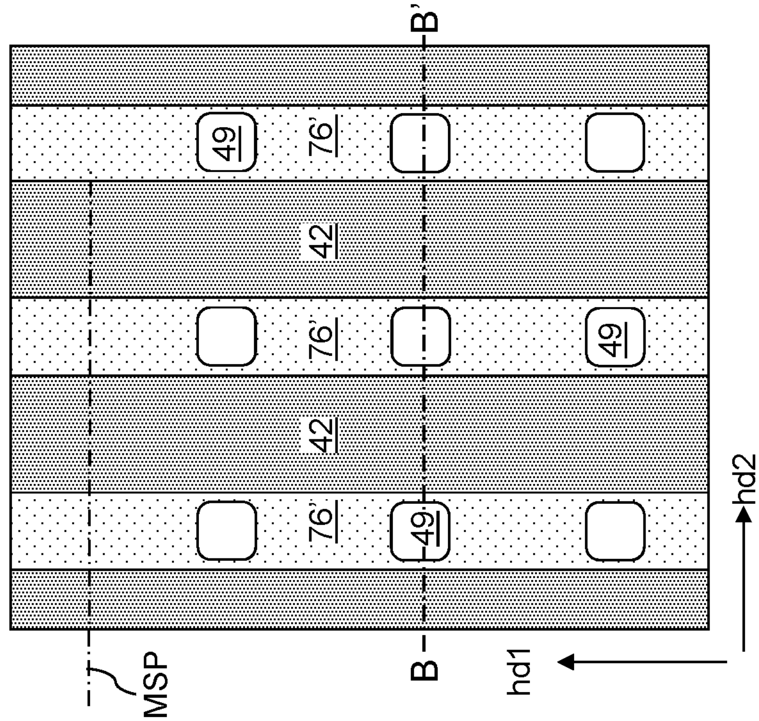
FIG. 8A is a horizontal cross-sectional view of the first configuration of the first exemplary structure after formation of pillar cavities according to the first embodiment of the present disclosure.

Referring to FIGS. 8A and 8B, a photoresist layer (not shown) can be applied over the first exemplary structure, and can be lithographically patterned to form an array of openings that directly overlie the areas of the array of access nodes 10. In one embodiment, the size of the openings in the photoresist layer can be selected such that the openings in the photoresist layer are entirely within the areas of the array of access nodes 10. For example, each periphery of the openings in the photoresist layer can be entirely within, and laterally offset inward, from the periphery of an underlying one of the access nodes 10 as seen in a plan view (i.e., a top-down view). An anisotropic etch process can be performed to transfer the pattern of the openings in the photoresist layer through the dielectric rails 76R. Pillar cavities 49 extending to a top surface of a respective one of the access nodes 10 can be formed through the dielectric rails 76R, and the dielectric rails 76R can be converted into perforated dielectric material portions 76'.

Figure 9A:
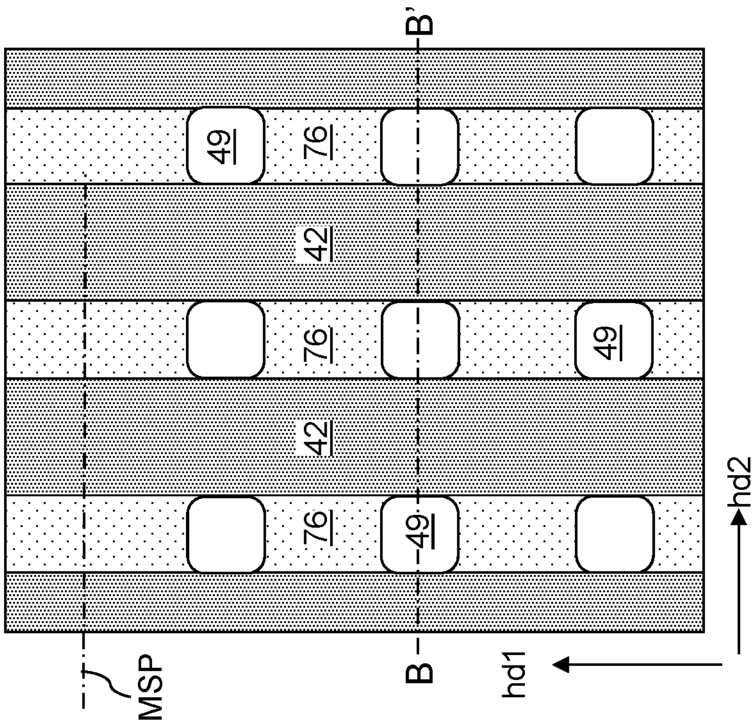
FIG. 9A is a horizontal cross-sectional view of the first configuration of the first exemplary structure after lateral expansion of the pillar cavities according to the first embodiment of the present disclosure.
Figure 9B:
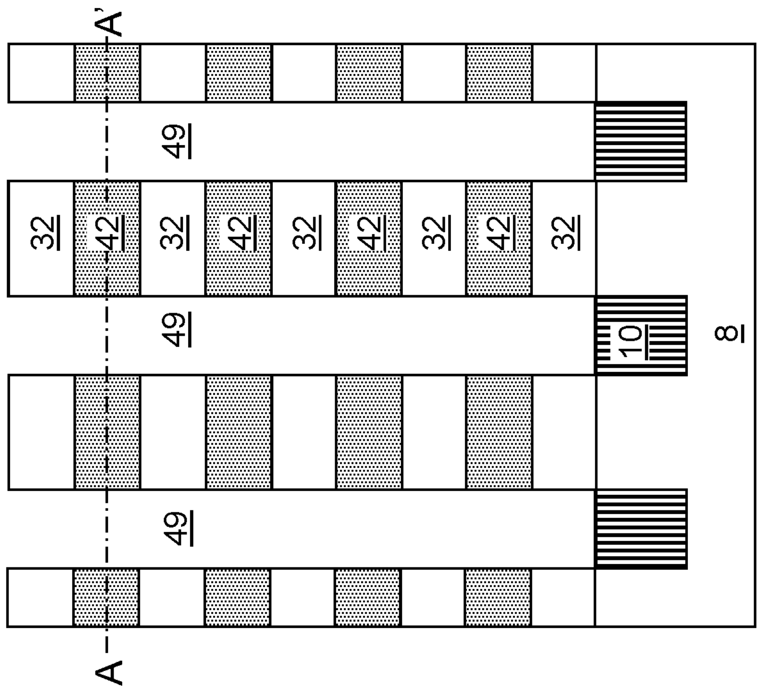
FIG. 9B is a vertical cross-sectional view along the vertical plane B-B' of the first configuration of the first exemplary structure of FIG. 8A. The horizontal plane A-A' is the plane of the horizontal cross-sectional view of FIG. 8A.
Figure 9C:
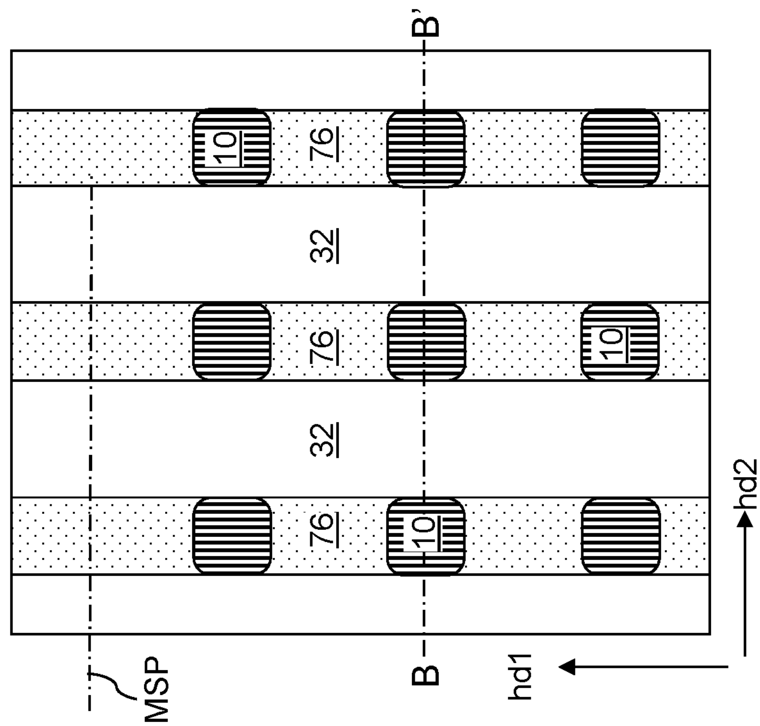
FIG. 9C is a top-down view of the first configuration of the first exemplary structure of FIGS. 9A and 9B.

Referring to FIGS. 9A-9C, the pillar cavities 49 can be laterally isotropically expanded by an isotropic etch process. For example, a wet etch process employing hydrofluoric acid can be employed to laterally expand the pillar cavities 49. In one embodiment, the sidewalls of each pillar cavity 49 can include sidewalls of a respective neighboring pair of alternating stacks (32, 42). In this case, the perforated dielectric material portions 76' can be divided into a respective row of remaining dielectric material portions, which are herein referred to as dielectric isolation pillars 76. As used herein, a "pillar" or a "pillar structure" refers to a structure that extends primarily along a vertical direction, i.e., having lesser lateral dimensions than a maximum vertical dimension.

A laterally alternating sequence of pillar cavities 49 and dielectric isolation pillars 76 is formed within each of the line trenches 79. In one embodiment, a two-dimensional array of pillar cavities 49 can be formed through the dielectric rails 76R by formation and lateral expansion of the pillar cavities 49. The remaining portions of the dielectric rails 76R comprise the dielectric isolation pillars 76. In one embodiment, the pillar cavities 49 can be formed as a two-dimensional periodic array.

Figure 10B:
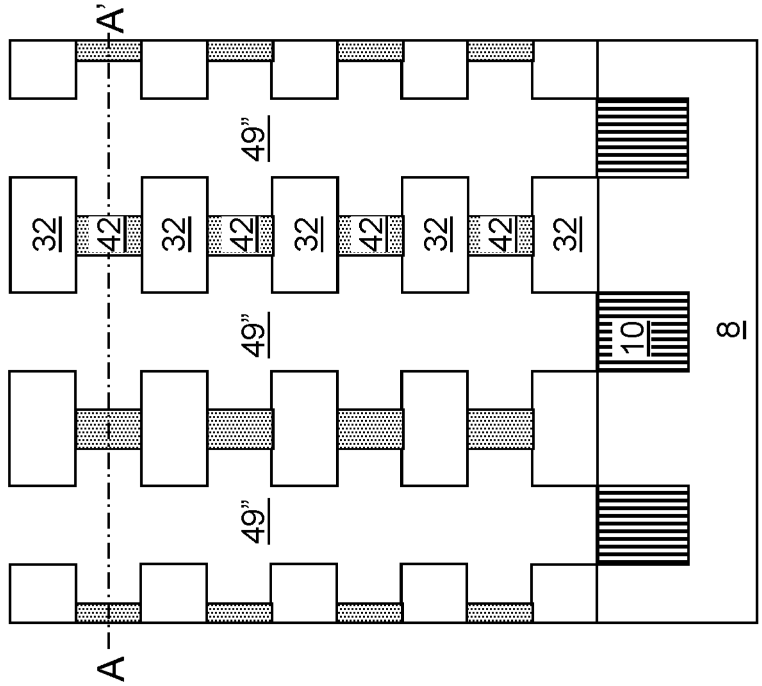
FIG. 10B is a vertical cross-sectional view along the vertical plane B-B' of the first configuration of the first exemplary structure of FIG. 10A. The horizontal plane A-A' is the plane of the horizontal cross-sectional view of FIG. 10A.
Figure 10A:
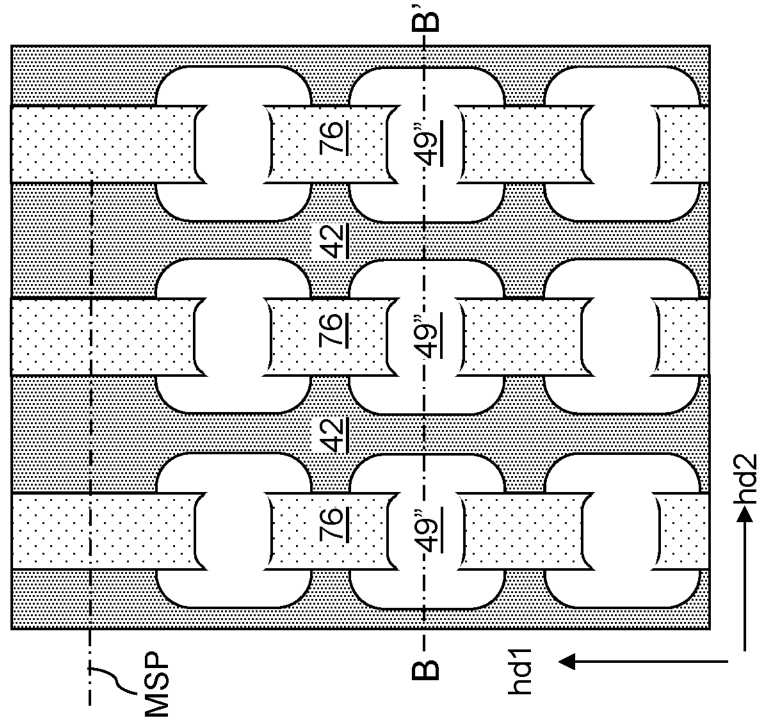
FIG. 10A is a horizontal cross-sectional view of the first configuration of the first exemplary structure after further lateral expansion of the pillar cavities according to the first embodiment of the present disclosure.

Referring to FIGS. 10A and 10B, an isotropic etch process that etches the sacrificial material of the sacrificial material strips 42 selective to the materials of the insulating strips 32 and the dielectric isolation pillars 76 can be performed. An isotropic etchant that etches the sacrificial material can be introduced into the laterally-expanded pillar cavities 49". For example, if the sacrificial material strips 42 include silicon nitride, the isotropic etch process can include a wet etch process employing hot deionized water or hot phosphoric acid. Alternatively, an isotropic dry etch process such as chemical dry etch (CDE) process can be employed to isotropically laterally recess the sacrificial material strips 42. The duration of the isotropic etch process can be selected such that the lateral recess distance of the sidewalls of the sacrificial material strips 42 is less than one half of the width of the sacrificial material strips 42. For example, the lateral recess distance of the sidewalls of the sacrificial material strips 42 can be in a range from 1% to 40%, such as from 3% to 20%, of the width of the sacrificial material strips 42. Laterally-expanded cavities 49" are formed, which have a greater lateral extent at levels of the sacrificial material strips 42 than at levels of the insulating strips 32.

Figure 11A:
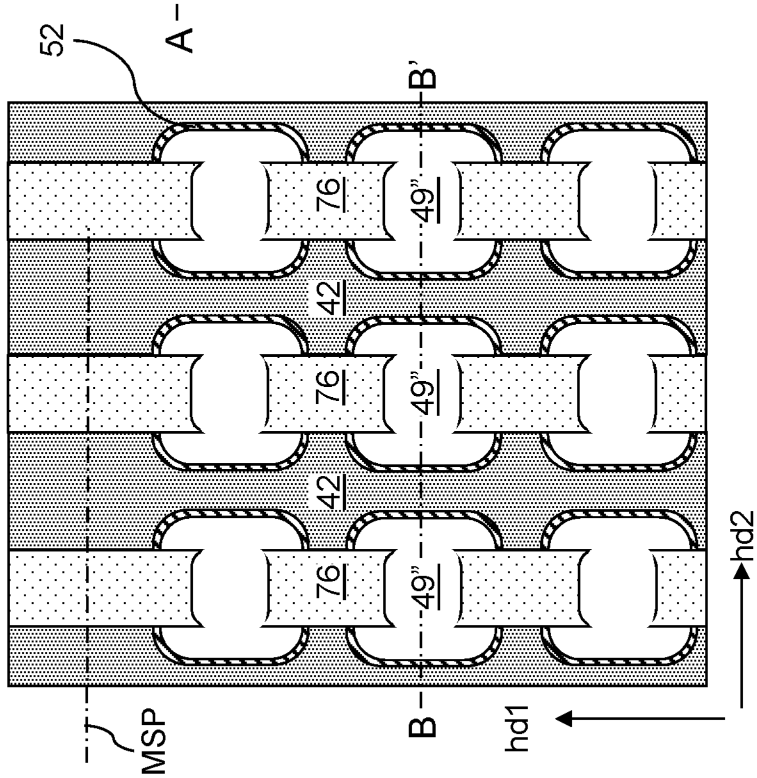
FIG. 11A is a horizontal cross-sectional view of the first configuration of the first exemplary structure after formation of discrete metal portions according to the first embodiment of the present disclosure.
Figure 11B:
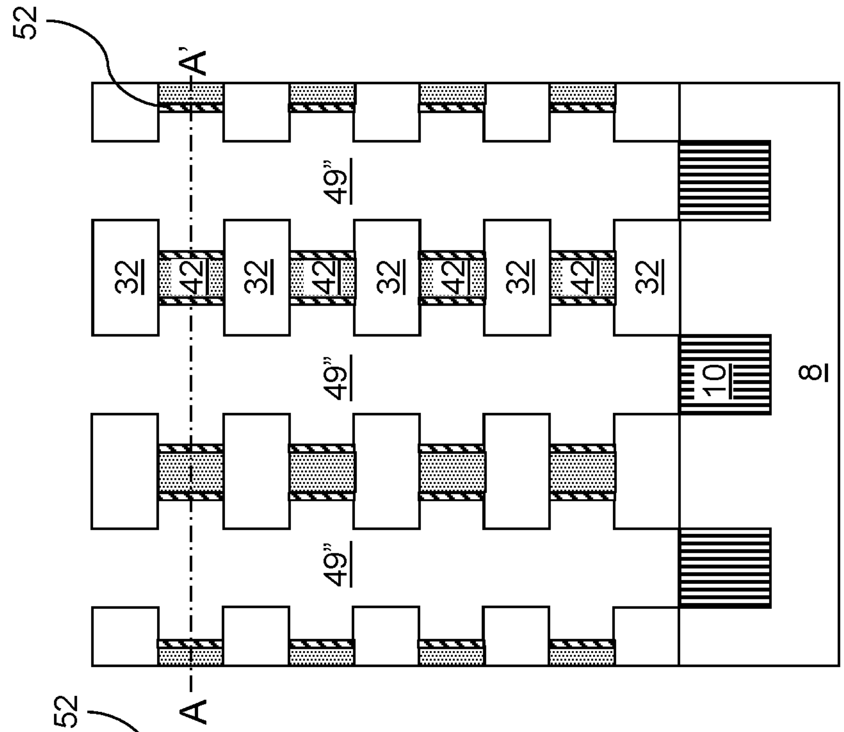
FIG. 11B is a vertical cross-sectional view along the vertical plane B-B' of the first configuration of the first exemplary structure of FIG. 11A. The horizontal plane A-A' is the plane of the horizontal cross-sectional view of FIG. 11A.

Referring to FIGS. 11A and 11B, discrete metal portions 52 including a metal can be grown only from the physically exposed surfaces of the sacrificial material strips 42 while growth from the surfaces of the insulating strips 32, the dielectric isolation pillars 76, the access nodes 10, and the substrate 8 is suppressed. The metallic element of the discrete metal portions 52 is selected among elements that can be deposited by a selective metal deposition process. For example, the discrete metal portions 52 can comprise, and/or consist essentially of, ruthenium, which can be formed by an atomic layer deposition (ALD) process in which a ruthenium precursor of $RuO_4$ and a reducing agent such as $H_2$ are alternately flowed into a process chamber to induce deposition of ruthenium only on silicon nitride surfaces of the sacrificial material strips 42 while suppressing growth of ruthenium from silicon oxide surfaces of the insulating strips 32 and the dielectric isolation pillars 76. In another example, the discrete metal portions 52 can comprise, and/or consist essentially of, molybdenum, which can be formed by an atomic layer deposition (ALD) process in which a molybdenum precursor of $MoCl_6$ and a reducing agent such as $H_2$ are alternately flowed into a process chamber to induce deposition of molybdenum only on silicon nitride surfaces of the sacrificial material strips 42 while suppressing growth of molybdenum from silicon oxide surfaces of the insulating strips 32 and the dielectric isolation pillars 76. Generally, the elemental metal of the discrete metal portions 52 can be selected such that a selective deposition process can provide selective growth of the elemental metal of the discrete metal portions 52 only from the surfaces of the sacrificial material strips 42 while growth from surfaces of the insulating strips 32, the dielectric isolation pillars 76, the access nodes 10, and the substrate 8 is suppressed. In one embodiment, an intermetallic alloy may be employed in lieu of an elemental metal for the discrete metal portions 52.

The discrete metal portions 52 function as middle electrodes of phase change memory cells to be subsequently formed. The middle electrodes can enhance device characteristics of the phase change memory cells by providing an optimized material interface on a phase change memory material portion and/or on a selector element. The thickness of the discrete metal portions 52 can be in a range from 1 nm to 20 nm, such as from 2 nm to 10 nm, although lesser and greater thicknesses can also be employed.

Figure 12B:
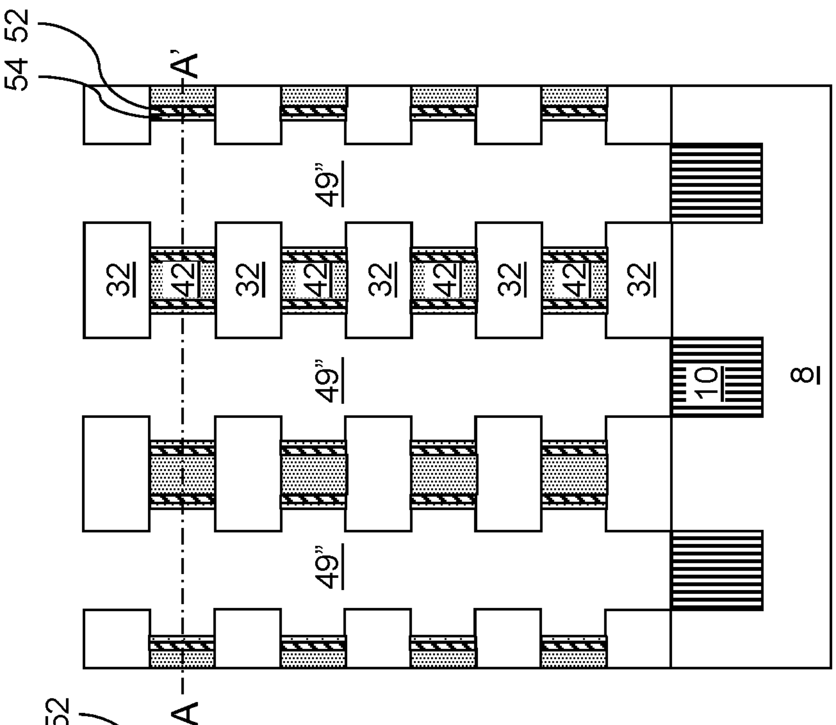
FIG. 12B is a vertical cross-sectional view along the vertical plane B-B' of the first configuration of the first exemplary structure of FIG. 12A. The horizontal plane A-A' is the plane of the horizontal cross-sectional view of FIG. 12A.
Figure 12A:
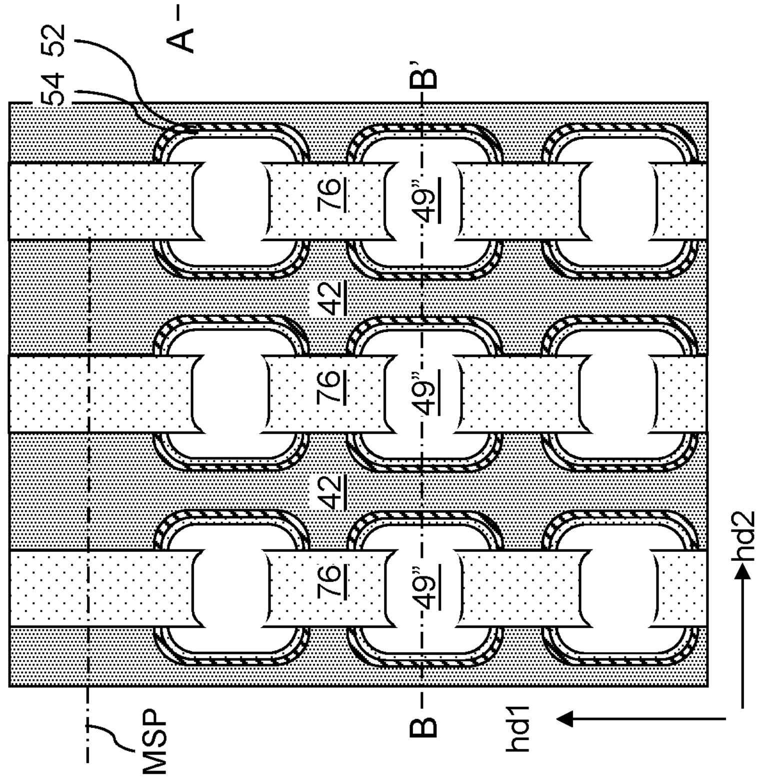
FIG. 12A is a horizontal cross-sectional view of the first configuration of the first exemplary structure after formation of discrete selector material portions according to the first embodiment of the present disclosure.

Referring to FIGS. 12A and 12B, discrete selector material portions 54 can be formed on a respective one of the discrete metal portions 52. The discrete selector material portions 54 include a selector material. As used herein, a "selector material" refers to a non-Ohmic material that provide a change in resistivity by at least two orders of magnitude depending on electrical bias conditions. Thus, a selector material with optimized dimensions may provide electrical connection of electrical isolation depending on the magnitude and/or the polarity of an externally applied voltage bias thereacross. Each selector material portion can be formed as a discrete selector material portion 54 that contacts only a single one of the discrete metal portions 52.

In one embodiment, the discrete selector material portions 54 can include an ovonic threshold switch material. As used herein, an "ovonic threshold switch material" refers to a material that displays a non-linear resistivity curve under an applied external bias voltage such that the resistivity of the material decreases with the magnitude of the applied external bias voltage. In other words, an ovonic threshold switch material is non-Ohmic, and becomes more conductive under a higher external bias voltage than under a lower external bias voltage. An ovonic threshold switch material can be non-crystalline (for example, by being amorphous) at a non-conductive state, and can remain non-crystalline (for example, by remaining amorphous) at a conductive state, and can revert back to a high resistance state when a high voltage bias thereacross is removed, i.e., when not subjected to a large voltage bias across a layer of the ovonic threshold voltage material. Throughout the resistive state changes, the ovonic threshold switch material can remain amorphous. In one embodiment, the ovonic threshold switch material can comprise a chalcogenide material which exhibits hysteresis in both the write and read states. The chalcogenide material may be a GeTe compound or a Ge—Se compound doped with a dopant selected from As, N, and C, such as a Ge—Se—As compound semiconductor material. The discrete selector material portions 54 can include any ovonic threshold switch material. In one embodiment, the ovonic threshold switch material layer can include, and/or can consist essentially of, a GeSeAs alloy, a GeSe alloy, a SeAs alloy, a GeTe alloy, or an SiTe alloy.

In one embodiment, the material of the discrete selector material portions 54 can be selected such that the resistivity of the discrete selector material portions 54 decreases at least by two orders of magnitude (i.e., by more than a factor of 100) upon application of an external bias voltage that exceeds a critical bias voltage magnitude. In one embodiment, the composition and the thickness of the discrete selector material portions 54 can be selected such that the critical bias voltage magnitude can be in a range from 1 V to 4 V, although lesser and greater voltages can also be employed for the critical bias voltage magnitude.

In one embodiment, the discrete selector material portions 54 can be formed by a selective deposition process that deposits the selector material of the discrete selector material portions 54 only on the physically exposed surfaces of the discrete metal portions 52. Processes for depositing a chalcogenide selector material only on metallic surfaces while suppressing deposition of the chalcogenide selector material on insulator surfaces are disclosed, for example, in C. H. (Kees) de Groot et al., Highly Selective Chemical Vapor deposition of Tin Diselenide Thin Films onto Patterned Substrates via Single Source Diselenoether Precursors, Chem. Mater., 2012, 24 (22), pp 4442-4449 and in Sophie L. Benjamin et al., Controlling the nanostructure of bismuth telluride by selective chemical vapor deposition from a single source precursor, J. Materials Chem., A, 2014, 2, 4865-4869. The thickness of the discrete selector material portions 54 can be in a range from 1 nm to 40 nm, such as from 2 nm to 20 nm, although lesser and greater thicknesses can also be employed.

Alternatively or additionally, the discrete selector material portions 54 may include an alternative non-Ohmic material such as a p-n or p-i-n junction diode. In this case, the discrete selector material portions 54 become conductive only under electrical bias condition of one polarity, and become electrically non-conductive under electrical bias condition of the opposite polarity. Alternatively or additionally, the discrete selector material portions 54 may include another alternative non-Ohmic material such as a metal oxide layer in which conductive filaments are formed under an application of a first voltage and in which the conductive filaments are dissipated under an application of a second voltage different from the first voltage. An example of such filament forming metal oxide layers include nickel oxide or hafnium oxide layers. A combination of a conformal deposition process and at least one etch back process can be employed to form the discrete selector material portions 54. For example, doped semiconductor material portions can be formed by deposition of a respective doped semiconductor material layer and a subsequent etch back process that removes the doped semiconductor material layer from outside the lateral recesses.

Figure 13B:
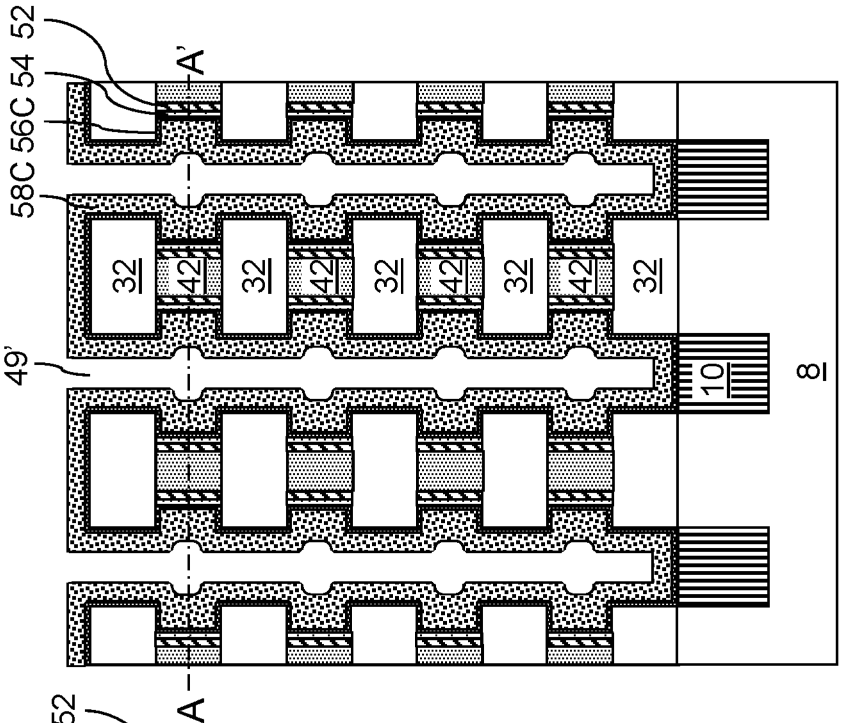
FIG. 13B is a vertical cross-sectional view along the vertical plane B-B' of the first configuration of the first exemplary structure of FIG. 13A. The horizontal plane A-A' is the plane of the horizontal cross-sectional view of FIG. 13A.
Figure 13A:
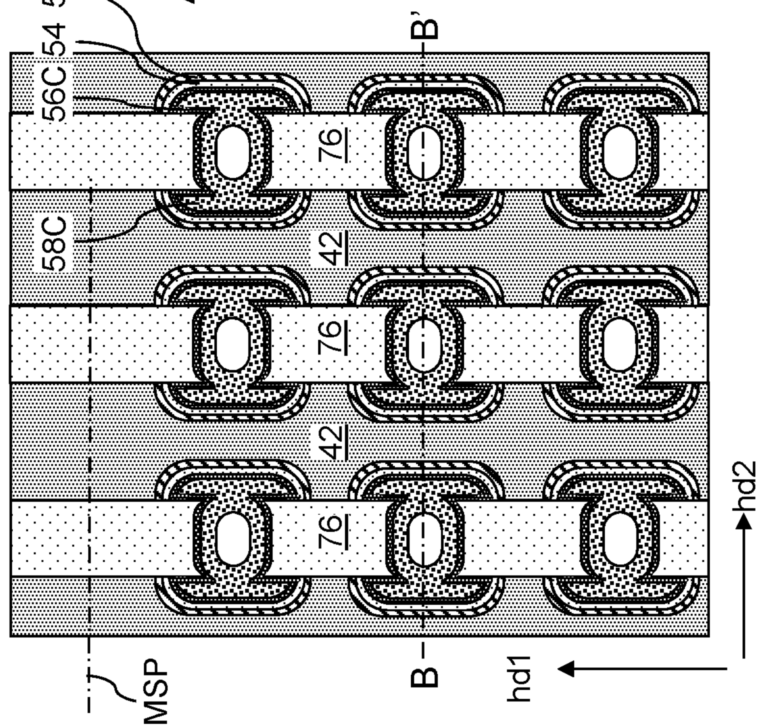
FIG. 13A is a horizontal cross-sectional view of the first configuration of the first exemplary structure after formation of an optional continuous carbon layer and a continuous phase change memory material layer according to the first embodiment of the present disclosure.

Referring to FIGS. 13A and 13B, an optional continuous carbon layer 56C can be deposited on the physically exposed surfaces of the first exemplary structure by a conformal deposition method such as atomic layer deposition. The continuous carbon layer 56C can include amorphous carbon or diamond-like carbon (DLC). The thickness of the continuous carbon layer 56C can be in a range from 1 nm to 20 nm, although lesser and greater thicknesses can also be employed.

A continuous layer 58C of phase change material (PCM), which is also referred to herein as a "phase change memory material" herein when used as the memory or phase switching material of the memory device, can be subsequently deposited by a conformal deposition process. The continuous phase change memory material layer 58C is a continuous material layer including a phase change memory material. As used herein, a "phase change memory material" refers to a material having at least two different phases providing different resistivity. The at least two different phases can be provided, for example, by controlling the rate of cooling from a heated state. For example, the at least two states can include an amorphous state having a high resistivity and a polycrystalline state having a low resistivity. In this case, the high resistivity state of the phase change memory material can be achieved by quenching of the phase change memory material after heating to a glass state, and the low resistivity state of the phase change memory material can be achieved by slow cooling of the phase change memory material after heating to a glass state.

Exemplary phase change memory materials include, but are not limited to, germanium antimony telluride compounds such as $Ge_2Sb_2Te_5$ (GST), germanium antimony compounds, indium germanium telluride compounds, aluminum selenium telluride compounds, indium selenium telluride compounds, and aluminum indium selenium telluride compounds. These compounds (e.g., compound semiconductor material) may be doped (e.g., nitrogen doped GST) or undoped. Thus, the continuous phase change memory material layer 58C can include, and/or can consist essentially of, a material selected from a germanium antimony telluride compound, germanium antimony compound, an indium germanium telluride compound, an aluminum selenium telluride compound, an indium selenium telluride compound, or an aluminum indium selenium telluride compound. The thickness of the continuous phase change memory material layer 58C can be in a range from 1 nm to 60 nm, such as from 3 nm to 40 nm and/or from 10 nm to 25 nm, although lesser and greater thicknesses can also be employed. The continuous phase change memory material layer 58C can be formed by chemical vapor deposition or atomic layer deposition. At least a portion of each lateral recess at the levels of the sacrificial material strips 42 is filled with the continuous phase change memory material layer 58C. Each unfilled volume of the laterally-expanded cavities 49" is herein referred to as a memory cavity 49'. Each memory cavity 49' can have a greater lateral extent at levels of the sacrificial material strips 42 than at levels of the insulating strips 32.

Figure 14B:
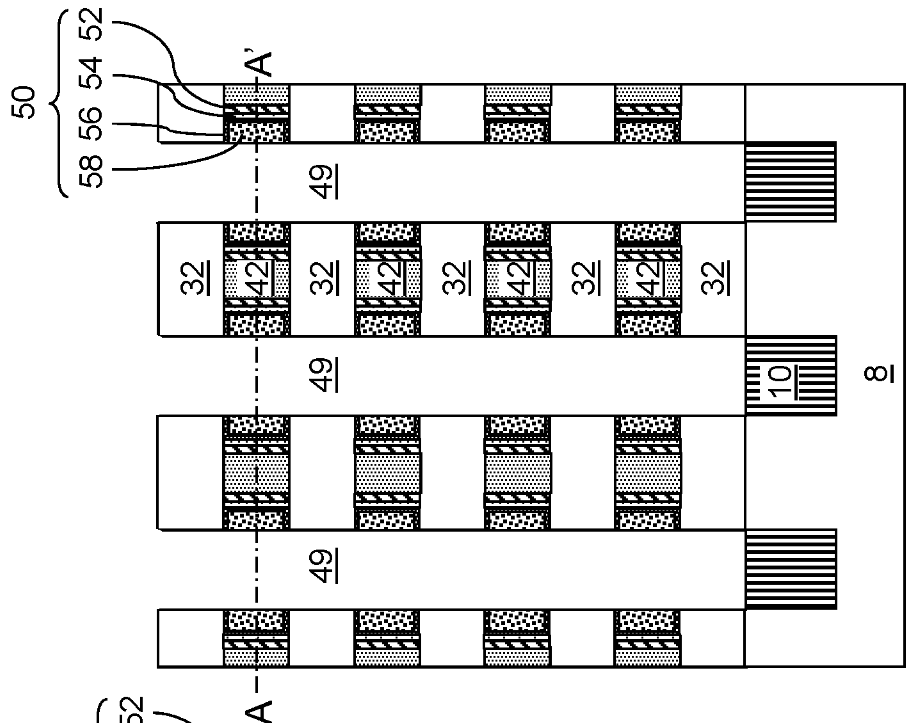
FIG. 14B is a vertical cross-sectional view along the vertical plane B-B' of the first configuration of the first exemplary structure of FIG. 14A. The horizontal plane A-A' is the plane of the horizontal cross-sectional view of FIG. 14A.
Figure 14A:
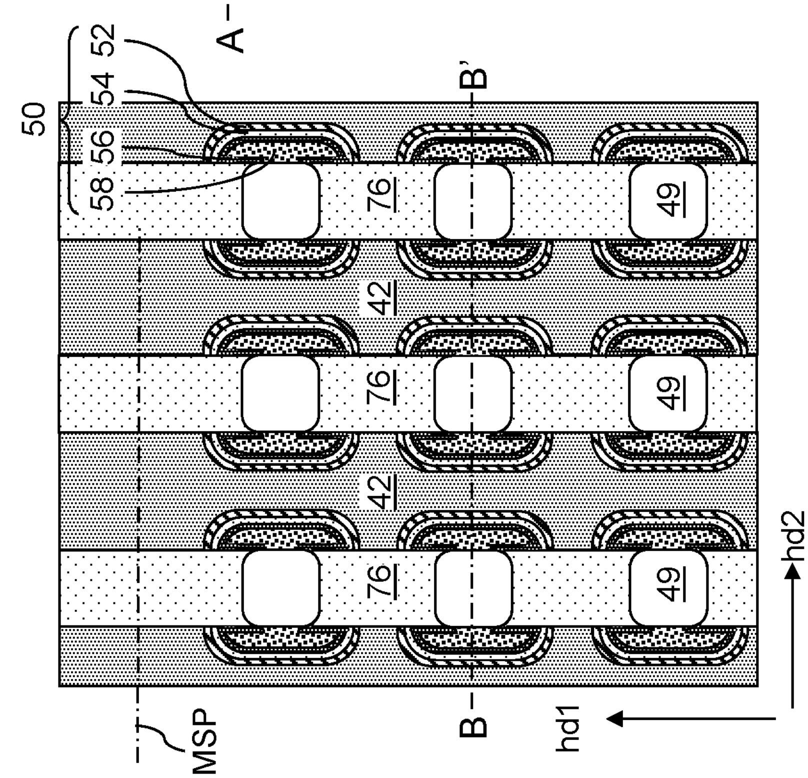
FIG. 14A is a horizontal cross-sectional view of the first configuration of the first exemplary structure after formation of discrete phase change memory material portions according to the first embodiment of the present disclosure.

Referring to FIGS. 14A and 14B, portions of the continuous phase change memory material layer 58C and the optional continuous carbon layer 56C are etched back from volumes of the pillar cavities 49 employing an etch back process. For example, an anisotropic etch process can be performed to remove portions of the continuous phase change memory material layer 58C and the optional continuous carbon layer 56C that are not located inside recess regions at the levels of the sacrificial material strips 42. Horizontal portions of the continuous phase change memory material layer 58C and the optional continuous carbon layer 56C located above the alternating stacks (32, 42) and at bottom portions of the pillar cavities 49 can be removed by the anisotropic etch process. Further, portions of the continuous phase change memory material layer 58C and the optional continuous carbon layer 56C that are located within volumes of the pillar cavities 49 as provided at the processing steps of FIGS. 9A and 9B can be removed. Each remaining portion of the continuous phase change memory material layer 58C constitutes a discrete phase change memory material portion 58. Each remaining portion of the continuous carbon layer 56C constitutes a discrete carbon portion 56. Alternatively, after forming discrete phase change memory material portion 58 by etching, the exposed portions of the continuous carbon layer 56C located in the pillar cavities 49 over the insulating strips 32 can be removed by ashing to leave the discrete carbon portions 56 located in the recesses behind the respective discrete phase change memory material portions 58.

A three-dimensional array of phase change memory cells 50 is thus provided. Each phase change memory cell 50 includes a discrete metal portion 52, a phase change memory material portion 58, and a selector material portion 54. Each phase change memory cell 50 may optionally include a discrete carbon portion 56. A two-dimensional array of phase change memory cells 50 is formed at each level of the sacrificial material strips 42. Two vertical stacks of phase change memory cells 50 can be formed at a periphery of each of the pillar cavities 49. Each phase change memory cell 50 can be formed on a respective sacrificial material strips electrically conductive strip 46 around a respective pillar cavity 49 among the two-dimensional array of pillar cavities 49.

In the first configuration of the first exemplary structure, each of the discrete metal portions 52 is formed directly on an inner sidewall of a respective one of the sacrificial material strips 42. Each of the discrete selector material portions 54 is formed directly on an inner sidewall of a respective one of the discrete metal portions 52. Each of the discrete carbon portions 56 is formed directly on an inner sidewall of a respective one of the discrete selector material portions 54. Each of the discrete phase change memory material portion 58 is formed directly on an inner sidewall of a respective one of the discrete carbon portions 56. Each of the discrete metal portions 52, the discrete selector material portions 54, the discrete carbon portions 56, and the discrete phase change memory material portions 58 can have a vertical planar outer sidewall segment and a pair of vertical convex outer sidewall segments. Each of the discrete metal portions 52, the discrete selector material portions 54, and the discrete carbon portions 56 can have a vertical planar inner sidewall segment and a pair of vertical convex inner sidewall segments, as shown in FIG. 14A.

Figure 15B:
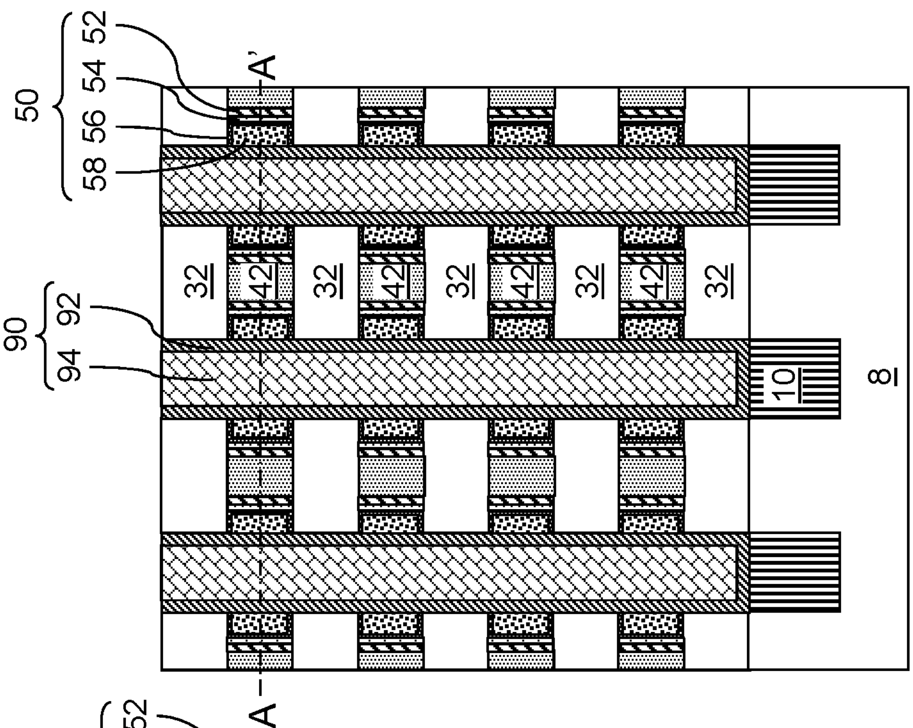
FIG. 15B is a vertical cross-sectional view along the vertical plane B-B' of the first configuration of the first exemplary structure of FIG. 15A. The horizontal plane A-A' is the plane of the horizontal cross-sectional view of FIG. 15A.
Figure 15A:
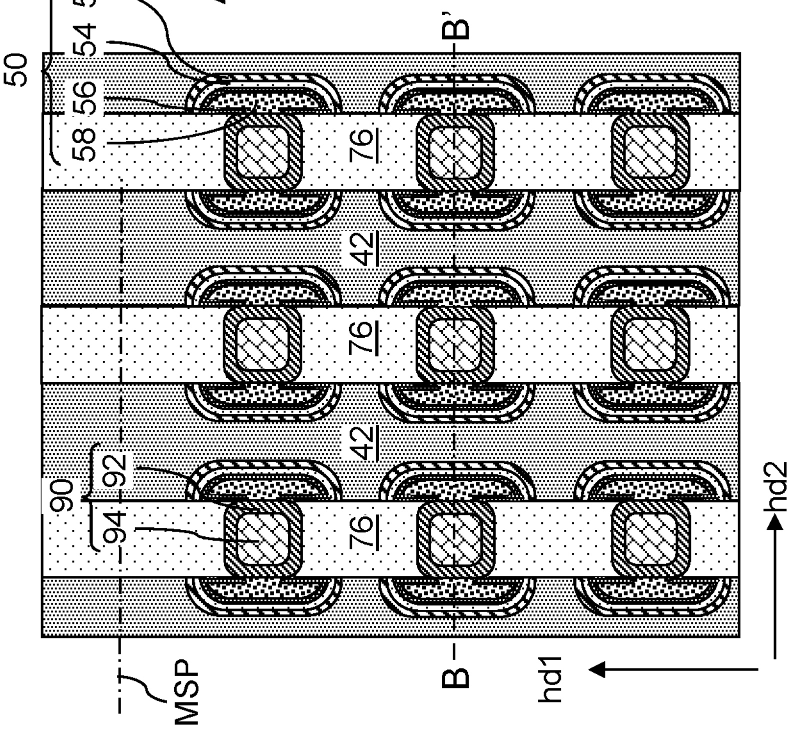
FIG. 15A is a horizontal cross-sectional view of the first configuration of the first exemplary structure after formation of vertical bit lines according to the first embodiment of the present disclosure.

Referring to FIGS. 15A and 15B, vertical bit lines 90 can be formed in the two-dimensional array of pillar cavities 49. For example, a metallic liner (e.g., diffusion barrier) material including a conductive metallic nitride material such as TiN, TaN, or WN can be deposited on the surfaces of the pillar cavities 49, and a metallic fill material such a W, Cu, Co, Ru, Mo, or combinations or alloys thereof can be subsequently deposited to fill remaining volumes of the pillar cavities 49. Excess portions of the metallic fill material and the metallic liner material can be removed from above the topmost surfaces of the alternating stacks (32, 42) by a planarization process, which can employ a recess etch and/or chemical mechanical planarization. Each remaining portion of the metallic liner material constitutes a metallic liner 92. Each remaining portion of the metallic fill material constitutes a metallic fill material portion 94. Each contiguous combination of a metallic liner 92 and a metallic fill material portion 94 constitutes a vertical bit line 90. Each vertical bit line 90 can contact a respective one of the access nodes 10.

Figure 16B:
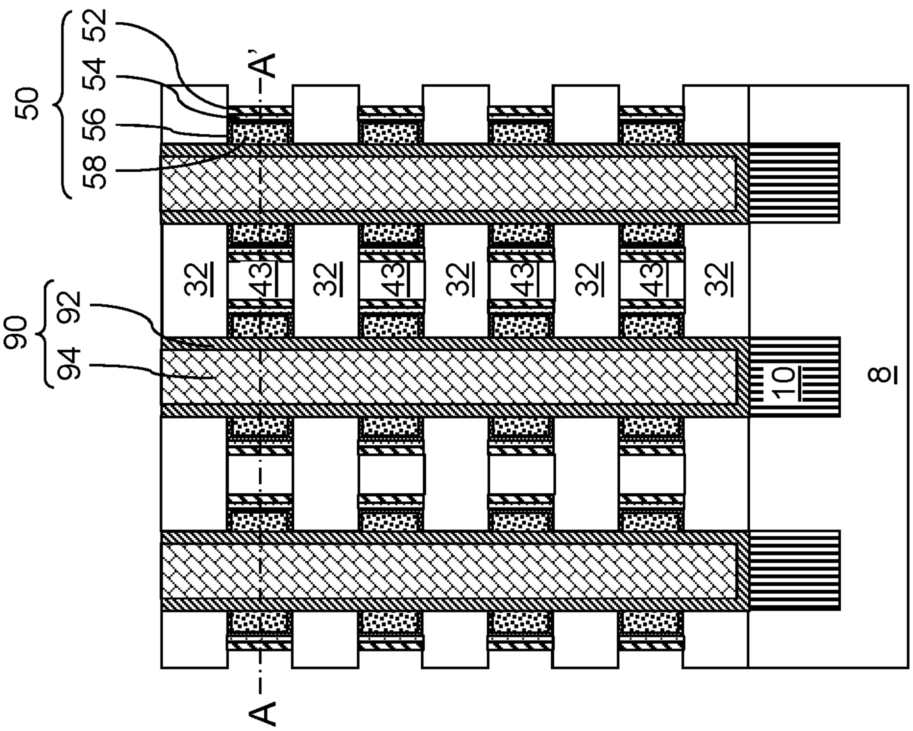
FIG. 16B is a vertical cross-sectional view along the vertical plane B-B' of the first configuration of the first exemplary structure of FIG. 16A. The horizontal plane A-A' is the plane of the horizontal cross-sectional view of FIG. 16A.
Figure 16A:
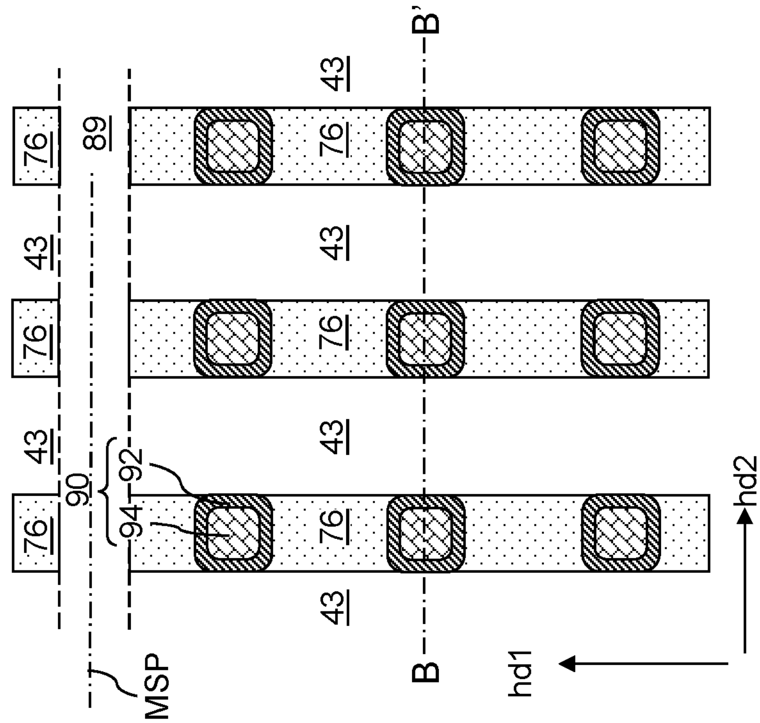
FIG. 16A is a horizontal cross-sectional view of the first configuration of the first exemplary structure after formation of a backside trench according to the first embodiment of the present disclosure.
Figure 16C:
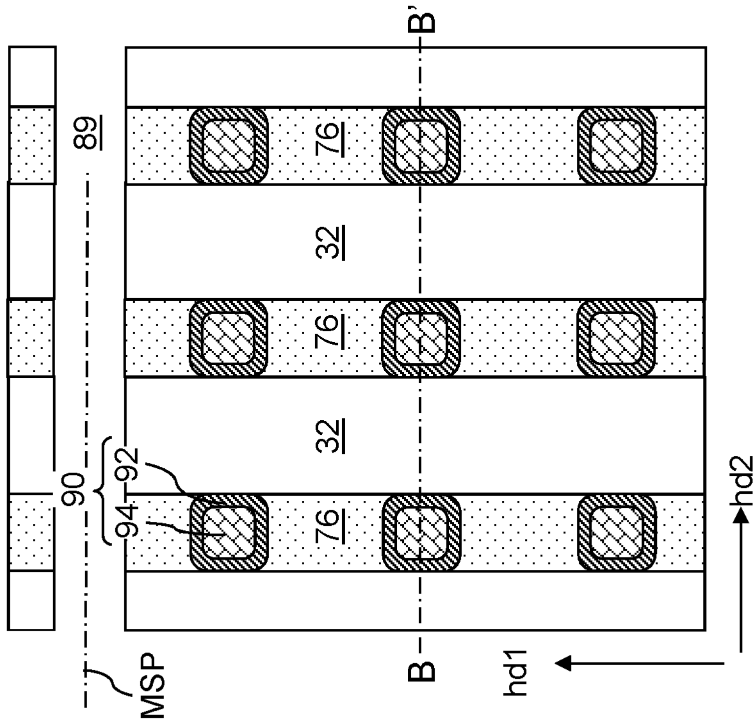
FIG. 16C is a top-down view of the first configuration of the first exemplary structure of FIGS. 16A and 16B.

Referring to FIGS. 16A-16C, a backside trench 89 extending along the second horizontal direction hd2 can be formed through the alternating stacks (32, 42) and the dielectric isolation pillars 76. For example, a photoresist layer can be applied over the first exemplary structure, and can be lithographically patterned to form an elongated opening extending along the second horizontal direction hd2. In one embodiment, the geometric center of the backside trench 89 can be formed at the mirror symmetry plane MSP. The width of the backside trench 89 can be greater than the thickness of the sacrificial material strips 42, and can be in a range from 60 nm to 600 nm, although lesser and greater widths can also be employed. The backside trench 89 can be formed through each alternating stack of insulating strips 32 and sacrificial material strips 42, and thus, can divide each alternating stack of insulating strips 32 and sacrificial material strips 42 into two alternating stacks (32, 42). A first group of alternating stacks (32, 42) can be formed on one side of the backside trench 89, and a second group of alternating stacks (32, 42) can be formed on another side of the backside trench 89.

The sacrificial material strips 42 can be removed employing an isotropic etch process. An isotropic etchant that etches the sacrificial material strips 42 selective to the materials of the insulating strips 32 and the dielectric isolation pillars 76 is introduced into the backside trench 89 and etches the sacrificial material strips 42. In case the sacrificial material strips 42 include silicon nitride and the insulating strips 32 and the dielectric isolation pillars 76 include silicon oxide materials, a wet etch employing hot phosphoric acid can be employed to remove the sacrificial material strips 42. The sacrificial material strips 42 can be completely removed, and backside recesses 43 can be formed in volumes from which the sacrificial material strips 42 are removed.

Figures 17A, 17B:
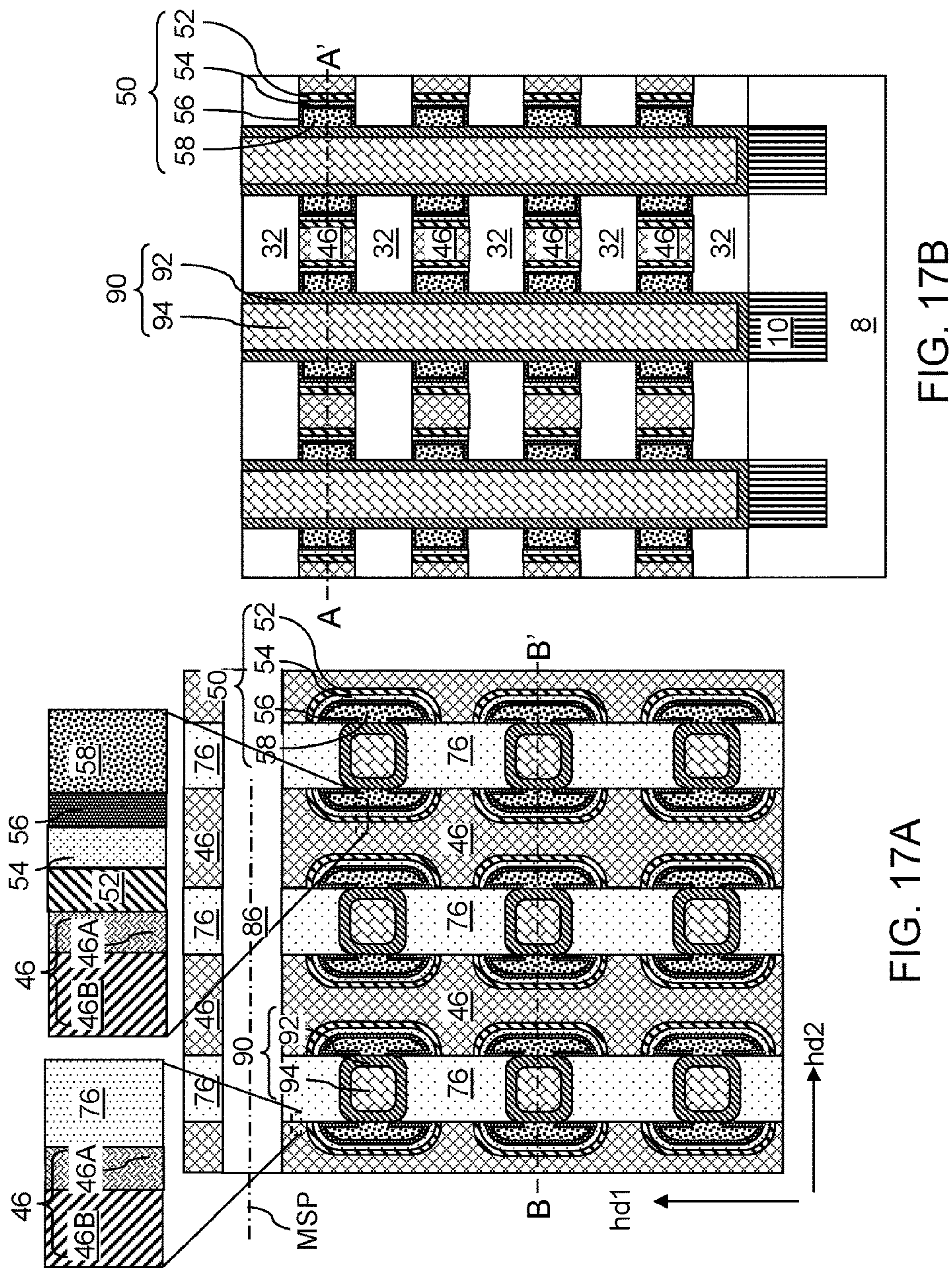
FIG. 17A is a horizontal cross-sectional view of the first configuration of the first exemplary structure after formation of electrically conductive strips and a dielectric wall structure according to the first embodiment of the present disclosure.
FIG. 17B is a vertical cross-sectional view along the vertical plane B-B' of the first configuration of the first exemplary structure of FIG. 17A. The horizontal plane A-A' is the plane of the horizontal cross-sectional view of FIG. 17A.
Figure 17C:
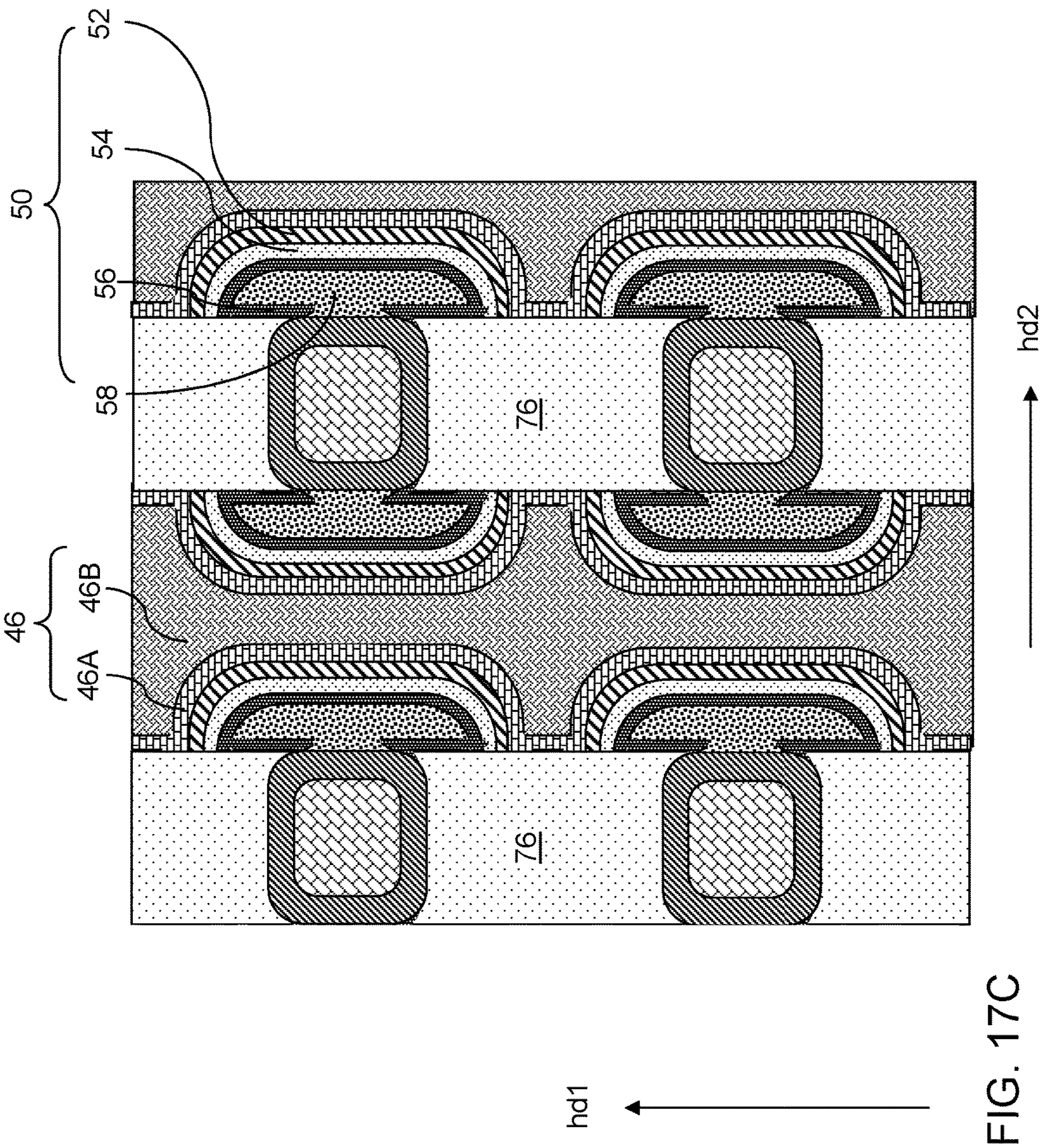
FIG. 17C is a magnified view of a region of FIGS. 17A and 17B.

Referring to FIGS. 17A-17C, at least one conductive material can be deposited in the backside recesses 43 by at least one conformal deposition process. At least one reactant for depositing the at least one conductive material through the backside trench 89 into the backside cavities 43. For example, the at least one conductive material can include a metallic barrier material such as TaN, TiN, and/or WN and a metallic fill material such as W, Cu, Co, Ru, and/or Mo. Any collaterally deposited conductive material can be removed from inside the backside trenches 89. For example, portions of the at least one conductive material can be removed from above the topmost insulating strips 32 and from inside the backside trench 89 by an anisotropic etch process. Remaining portions of the at least one conductive material in the backside recesses 43 constitute electrically conductive strips 46. Each electrically conductive strip 46 can fill the volume of a respective backside recess 43, and can include a conformal metallic liner 46A (which is a remaining portion of the metallic barrier material) and a metallic fill material portion 46B (which is a remaining portion of the metallic fill material). Thus, remaining portions of the sacrificial material strips 42 after formation of the backside trench 89 can be replaced with the electrically conductive strips 46.

The electrically conductive strips 46 can function as word lines of a three-dimensional memory device including a three-dimensional array of phase memory array cells 50. Each phase change memory cell 50 is located between a respective pair of a bit line 90 and an electrically conductive strip 46 (i.e., word line). A dielectric material such as silicon oxide can be deposited in the backside trench 89. Excess portions of the dielectric material can be removed from above the top surface of the topmost layers within the alternating stacks (32, 46) of the insulating strips 32 and the electrically conductive strips 46 by a planarization process. A dielectric wall structure 86 can be formed within the backside trench 89.

Figure 18B:
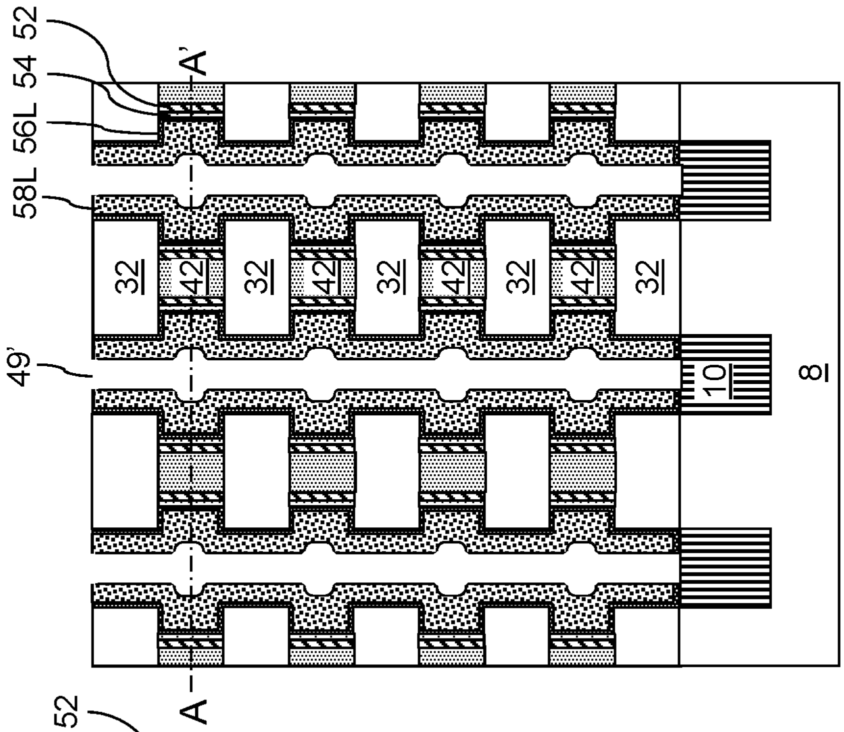
FIG. 18B is a vertical cross-sectional view along the vertical plane B-B' of the second configuration of the first exemplary structure of FIG. 18A. The horizontal A-A' is the plane of the horizontal cross-sectional view of FIG. 18A.
Figure 18A:
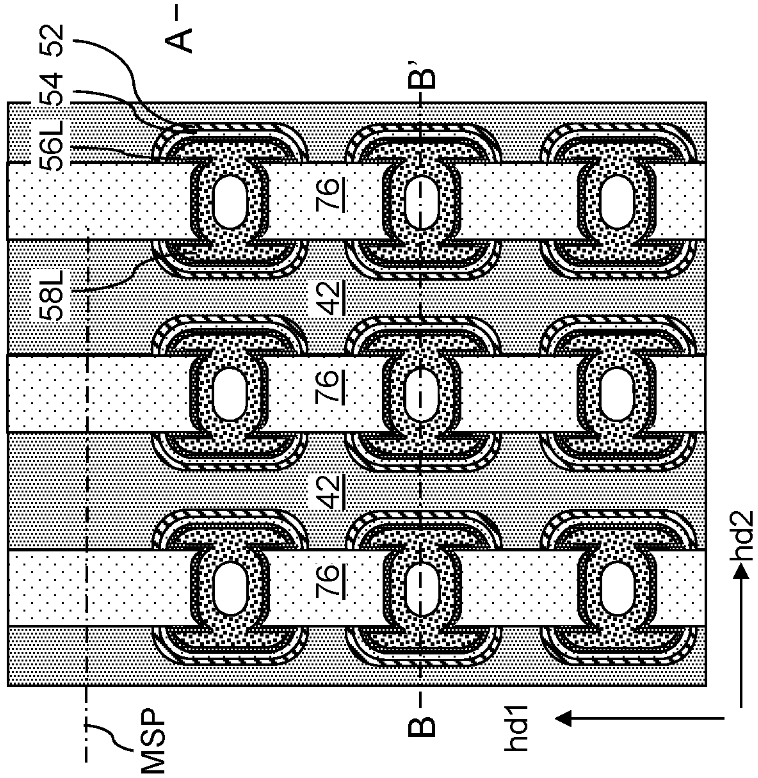
FIG. 18A is a horizontal cross-sectional view of a second configuration of the first exemplary structure after formation of phase change memory material layers according to the first embodiment of the present disclosure.

Referring to FIGS. 18A and 18B, a second configuration of the first exemplary structure can be derived from the first configuration of the first exemplary structure of FIGS. 13A and 13B by performing an anisotropic etch process that removes horizontal portions of the continuous phase change memory material layer 58C and the optional continuous carbon layer 56C. The duration of the anisotropic etch process is selected such that only the horizontal portions of the continuous phase change memory material layer 58C and the optional continuous carbon layer 56C are removed by the anisotropic etch process, and vertical portions of the continuous phase change memory material layer 58C and the optional continuous carbon layer 56C in around the memory cavities 49' are not removed by the anisotropic etch process.

A vertically-extending portion of the continuous phase change memory material layer 58C remains around each memory cavity 49', which is herein referred to as a phase change memory material layer 58. If the optional continuous carbon layer 56C is employed, a vertically-extending portion of the continuous carbon layer 56C remains around each memory cavity 49', which is herein referred to as a carbon layer 56. A top surface of an access node 10 can be physically exposed at the bottom of each memory cavity 49'.

A three-dimensional array of phase change memory cells 50 is thus provided. Each phase change memory cell 50 includes a discrete metal portion 52, a phase change memory material portion that is a portion of a respective phase change memory material layer 58L located at the same level as the discrete metal portion 52, and a selector material portion 54. Each phase change memory cell 50 may optionally include a carbon portion which is a portion of a respective carbon layer 56L located at the same level as the discrete metal portion 52. A two-dimensional array of phase change memory cells 50 is formed at each level of the sacrificial material strips 42. Two vertical stacks of phase change memory cells 50 can be formed at a periphery of each of the pillar cavities 49. Each phase change memory cell 50 can be formed on a respective electrically conductive strip 46 around a respective pillar cavity 49 among the two-dimensional array of pillar cavities 42.

In the second configuration of the first exemplary structure, each of the discrete metal portions 52 is formed directly on an inner sidewall of a respective one of the sacrificial material strips 42. Each selector material portion is formed as a discrete selector material portion 54 that contacts only a single one of the discrete metal portions 52. Each of the discrete selector material portions 54 is formed directly on an inner sidewall of a respective one of the discrete metal portions 52. Each carbon layer 56L can be formed on two vertical stacks of discrete selector material portions 54. Each phase change memory material portion is a respective portion within a phase change memory material layer 58L formed at a periphery of a respective one of the pillar cavities 49. Each phase change memory material layer 58L is formed directly on an inner sidewall of a respective carbon layer 56L.

Each of the discrete metal portions 52 and the discrete selector material portions 54 can have a vertical planar outer sidewall segment and a pair of vertical convex outer sidewall segments. Each of the discrete metal portions 52 and the discrete selector material portions 54 can have a vertical planar inner sidewall segment and a pair of vertical convex inner sidewall segments. Each carbon layer 56L can vertically extend from a pair of bottommost insulating strips 32 to a pair of topmost insulating strips 32 and/or from a bottommost level of the electrically conductive strips 46 to a topmost level of the electrically conductive strips 46. Each phase change memory material layer 58L can vertically extend from a pair of bottommost insulating strips 32 to a pair of topmost insulating strips 32 and/or from a bottommost level of the electrically conductive strips 46 to a topmost level of the electrically conductive strips 46. Each carbon layer 56L can vertically extend with a respective laterally undulating profile and contact a top surface of a respective underlying access node 10. Each phase change memory material layer 58L can vertically extend with a respective laterally undulating profile and contact a top surface of a respective underlying access node 10.

Figure 19B:
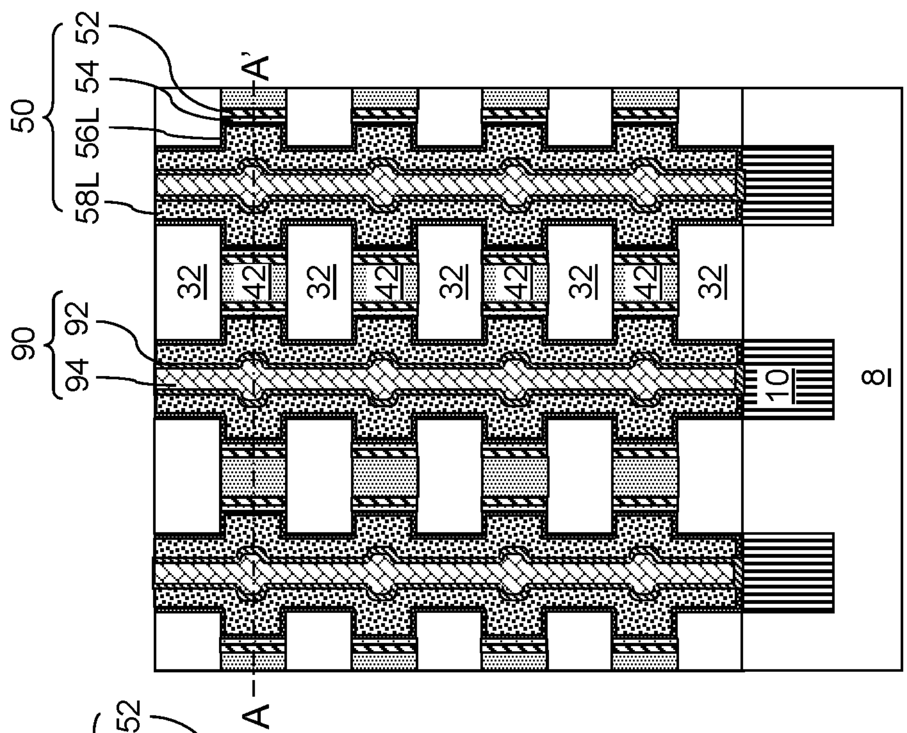
FIG. 19B is a vertical cross-sectional view along the vertical plane B-B' of the second configuration of the first exemplary structure of FIG. 19A. The horizontal A-A' is the plane of the horizontal cross-sectional view of FIG. 19A.
Figure 19A:
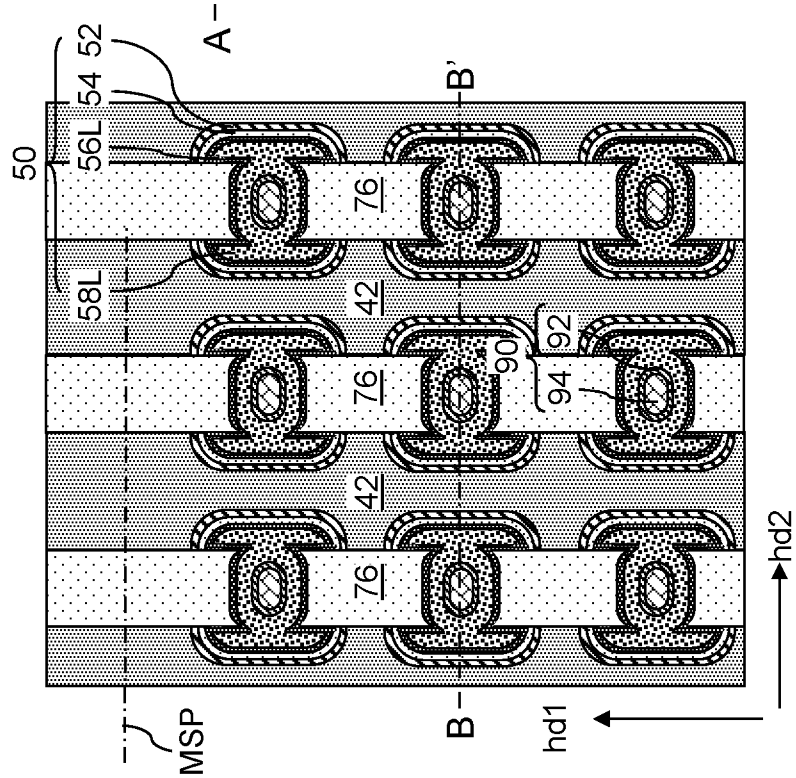
FIG. 19A is a horizontal cross-sectional view of the second configuration of the first exemplary structure after formation of vertical bit lines according to the first embodiment of the present disclosure.

Referring to FIGS. 19A and 19B, vertical bit lines 90 can be formed in the two-dimensional array of memory cavities 49' by performing the processing steps of FIGS. 15A and 15B. Each vertical bit line 90 can include a combination of a metallic liner 92 and a metallic fill material portion 94, and can contact a respective one of the access nodes 10. Each vertical bit line 90 can be formed directly on a respective phase change memory material layer 58L. Specifically, the sidewall of each vertical bit line 90 can continuously contact an inner sidewall of the respective phase change memory material layer 58L. Each vertical bit line 90 vertically extends through each level of the alternating stacks (32, 42), and has a laterally undulating vertical cross-sectional profile.

Figure 20B:
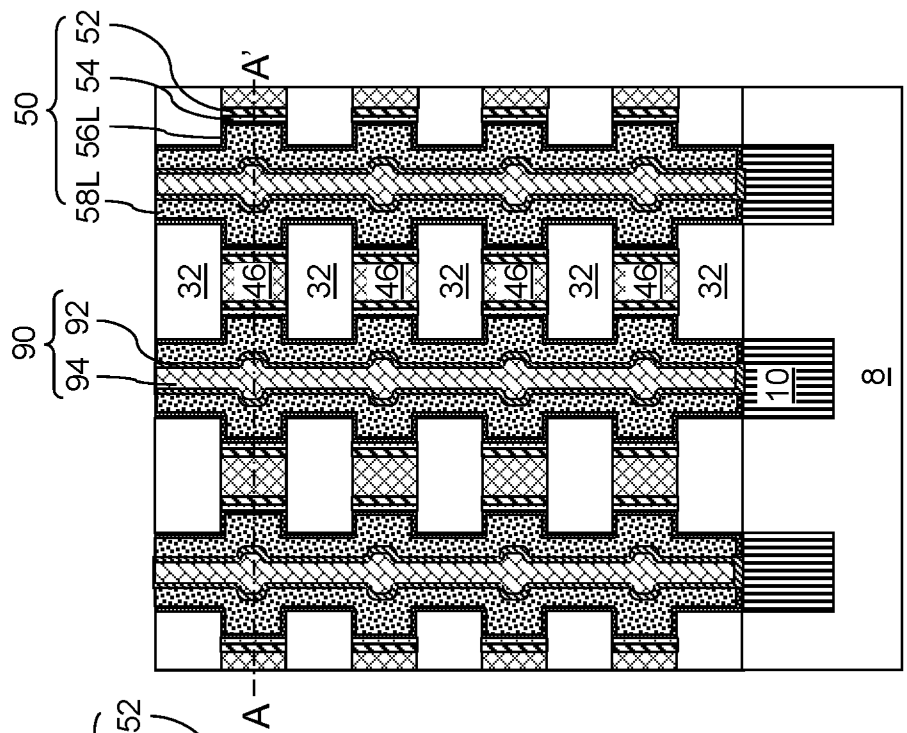
FIG. 20B is a vertical cross-sectional view along the vertical plane B-B' of the second configuration of the first exemplary structure of FIG. 20A. The horizontal A-A' is the plane of the horizontal cross-sectional view of FIG. 20A.
Figure 20A:
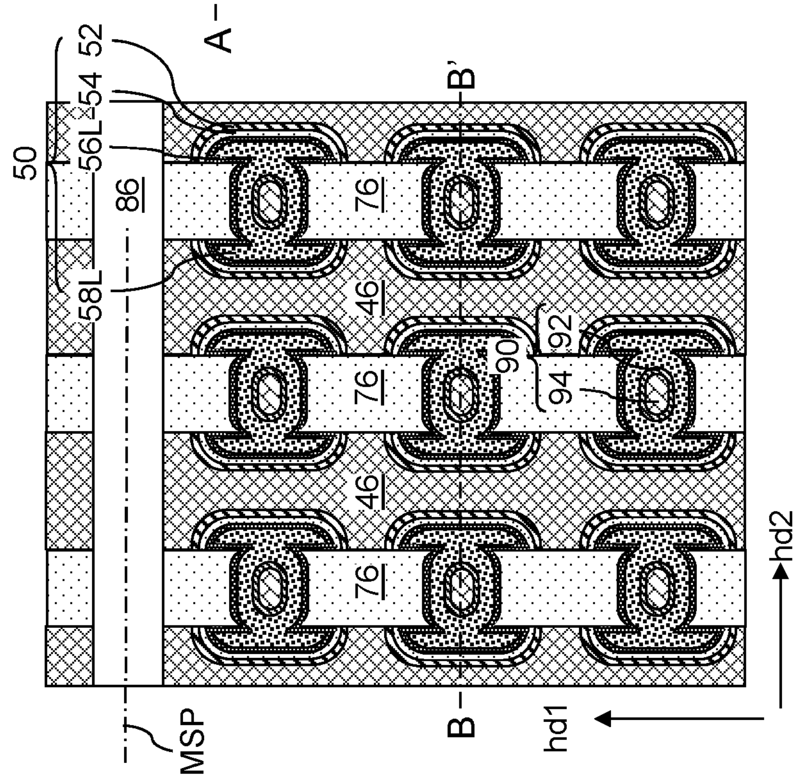
FIG. 20A is a horizontal cross-sectional view of the second configuration of the first exemplary structure after formation of a backside trench, replacement of the sacrificial material strips with electrically conductive strips, and formation of a dielectric wall structure according to the first embodiment of the present disclosure.

Referring to FIGS. 20A and 20B, the processing steps of FIGS. 16A-16C and 17A-17C can be performed to form a backside trench 89, to replace the sacrificial material strips 42 with electrically conductive strips 46, and to form a dielectric wall structure 86 in the backside trench 89. The second configuration of the first exemplary structure employs a phase change memory material layer 58L in lieu of discrete phase change memory material portions 58 in the first configuration of the first exemplary structure. Further, the second configuration of the first exemplary structure employs a carbon layer 56L in lieu of discrete carbon portions 56 in the first configuration of the first exemplary structure.

Figure 21B:
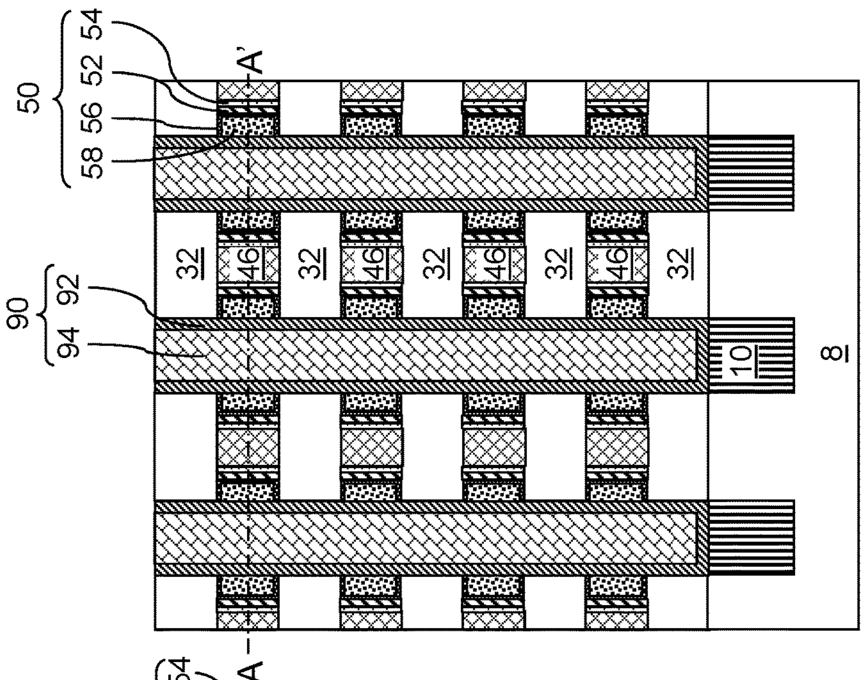
FIG. 21B is a vertical cross-sectional view along the vertical plane B-B' of the third configuration of the first exemplary structure of FIG. 21A. The horizontal A-A' is the plane of the horizontal cross-sectional view of FIG. 21A.
Figure 21A:
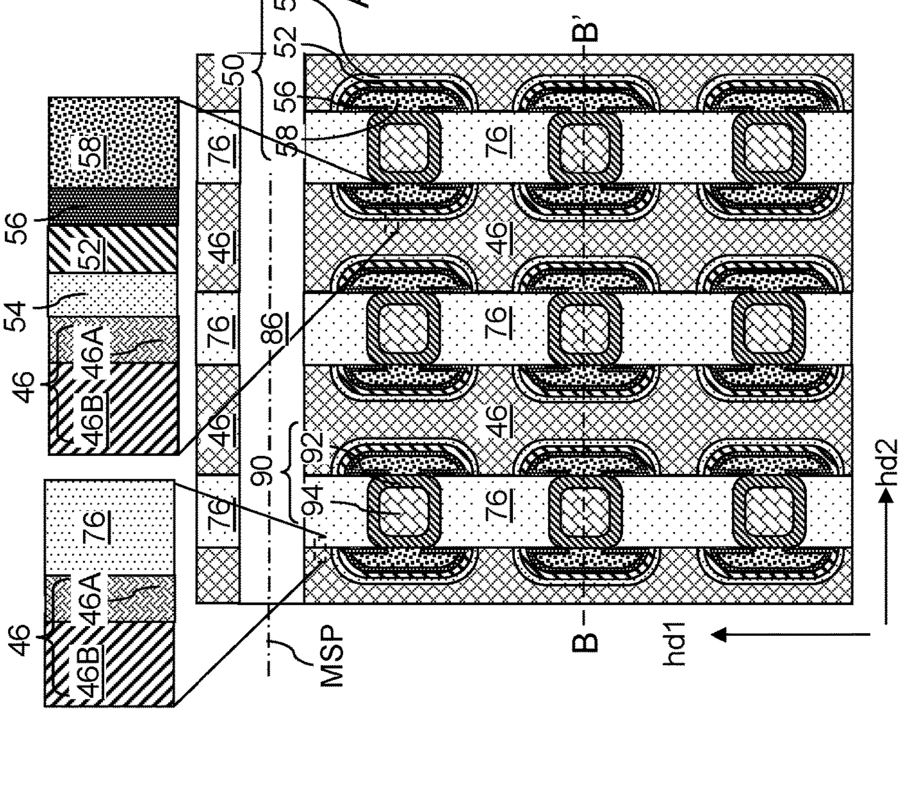
FIG. 21A is a horizontal cross-sectional view of a third configuration of the first exemplary structure after formation of a backside trench, replacement of the sacrificial material strips with electrically conductive strips, and formation of a dielectric wall structure according to the first embodiment of the present disclosure.

Referring to FIGS. 21A and 21B, a third configuration of the first exemplary structure can be derived from the first configuration of the first exemplary structure by reversing the order of formation for the discrete metal portions 52 and the discrete selector material portions 54. In this case, the discrete selector material portions 54 can be formed directly on physically exposed sidewalls of the sacrificial material strips 42 after the processing steps of FIGS. 10A and 10B.

In this case, a selective deposition process can be employed, which deposits the material of the discrete selector material portions 54 on the sidewalls of the sacrificial material strips 42 while suppressing growth of the material of the discrete selector material portions 54 from the surfaces of the insulating strips 32 and the dielectric pillar structures 76. Alternatively, the material of the discrete selector material portions 54 can be deposited by a non-selective conformal deposition process, and an anisotropic etch process can be performed to remove the material of the discrete selector material portions 54 from outside the recess regions at the levels of the sacrificial material strips 42, i.e., from the volumes of the pillar cavities 49 as formed at the processing steps of FIGS. 9A-9C. An additional isotropic etch can recess the discrete selector material portions 54 into recesses between each pair of adjacent insulating strips 32.

Another selective deposition process can be performed to deposit the metal of the discrete metal portions 52. In this case, the selective deposition process deposits the metal of the discrete metal portions 52 only on the physically exposed sidewalls of the discrete selector material portions 54 while suppressing growth of the metal from the surfaces of the insulating strips 32 and the dielectric pillar structures 76. Alternatively, the metal of the discrete metal portions 52 can be deposited by a non-selective conformal deposition process, and an anisotropic etch process can be performed to remove the metal of the discrete metal portions 52 from outside the recess regions at the levels of the sacrificial material strips 42, i.e., from the volumes of the pillar cavities 49 as formed at the processing steps of FIGS. 9A-9C.

In the third configuration of the first exemplary structure, each discrete selector material portions 54 has an outer sidewall that contacts a sidewall of a respective electrically conductive strip 46. Each discrete metal portion 52 has an outer sidewall that contacts an inner sidewall of a respective selector material portion 54. Each selector material portion is formed as a discrete selector material portion 54 that contacts only a single one of the discrete metal portions 52. Each of the discrete carbon portions 56 is formed directly on an inner sidewall of a respective one of the discrete metal portions 52. Each of the discrete phase change memory material portion 58 is formed directly on an inner sidewall of a respective one of the discrete carbon portions 56.

Figure 22B:
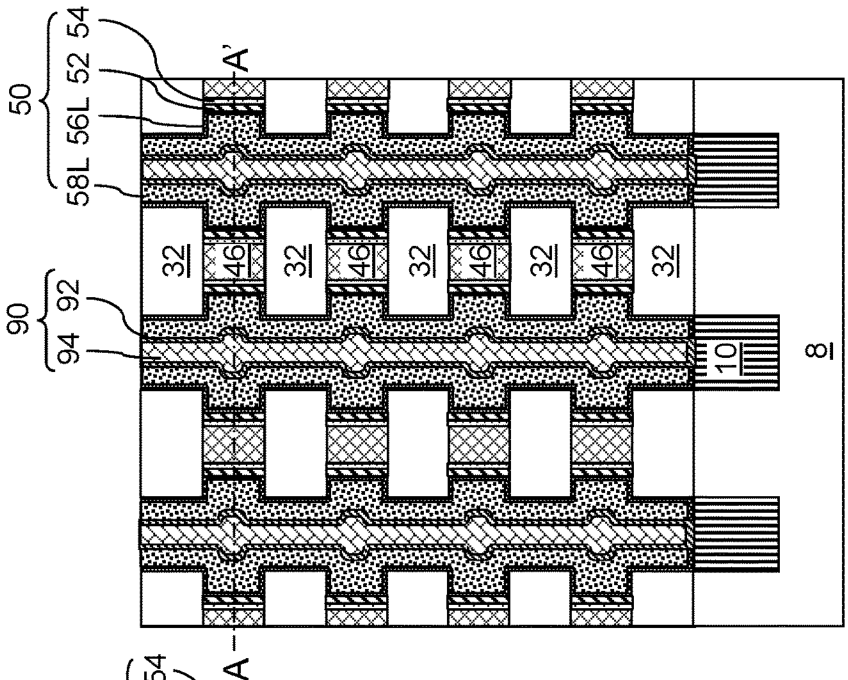
FIG. 22B is a vertical cross-sectional view along the vertical plane B-B' of the fourth configuration of the first exemplary structure of FIG. 22A. The horizontal A-A' is the plane of the horizontal cross-sectional view of FIG. 22A.
Figure 22A:
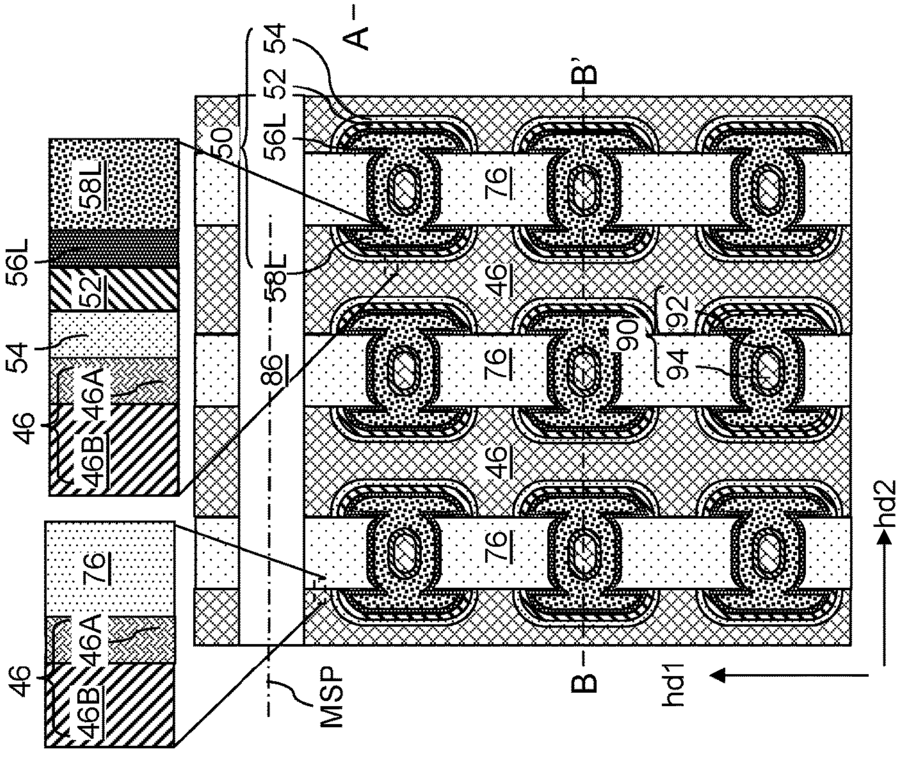
FIG. 22A is a horizontal cross-sectional view of a fourth configuration of the first exemplary structure after formation of a backside trench, replacement of the sacrificial material strips with electrically conductive strips, and formation of a dielectric wall structure according to the first embodiment of the present disclosure.

Referring to FIGS. 22A and 22B, a fourth configuration of the first exemplary structure can be derived from the second configuration of the first exemplary structure by reversing the order of formation for the discrete metal portions 52 and the discrete selector material portions 54. In other words, the same changes in the processing steps that are employed to form the third configuration are made to the processing steps that are employed to form the second configuration of the first exemplary structure. Each phase change memory material portion is a respective portion within a phase change memory material layer 58L formed at a periphery of a respective one of the pillar cavities 49. Each vertical bit line 90 is formed directly on a respective phase change memory material layer 58L.

In the fourth configuration of the first exemplary structure, each discrete selector material portions 54 has an outer sidewall that contacts a sidewall of a respective electrically conductive strip 46. Each discrete metal portion 52 has an outer sidewall that contacts an inner sidewall of a respective selector material portion 54. Each selector material portion is formed as a discrete selector material portion 54 that contacts only a single one of the discrete metal portions 52. Each of the discrete metal portions 52 is formed between a phase change memory material portion and a discrete selector material portion 54 within a respective phase change memory cell 50. Each phase change memory material layer 58L can have a greater lateral extent at levels of the electrically conductive strips 46 than at levels of the insulating strips 32.

The fourth configuration of the first exemplary structure employs a phase change memory material layer 58L in lieu of discrete phase change memory material portions 58 in the third configuration of the first exemplary structure. Further, the fourth configuration of the first exemplary structure employs a carbon layer 56L in lieu of discrete carbon portions 56 in the third configuration of the first exemplary structure. Each carbon portion of a phase change memory cell 50, if present, is a portion of a carbon layer 56 that contacts two vertical stacks of discrete metal portions 52. Each phase change memory material portion of a phase change memory cell 50 is a portion of a phase change memory material layer 58L that contacts a laterally-undulating inner sidewall of a respective carbon layer 56L (in case the carbon layers 56L are employed), or inner sidewalls of two vertical stacks of discrete metal portions 52.

Figure 23B:
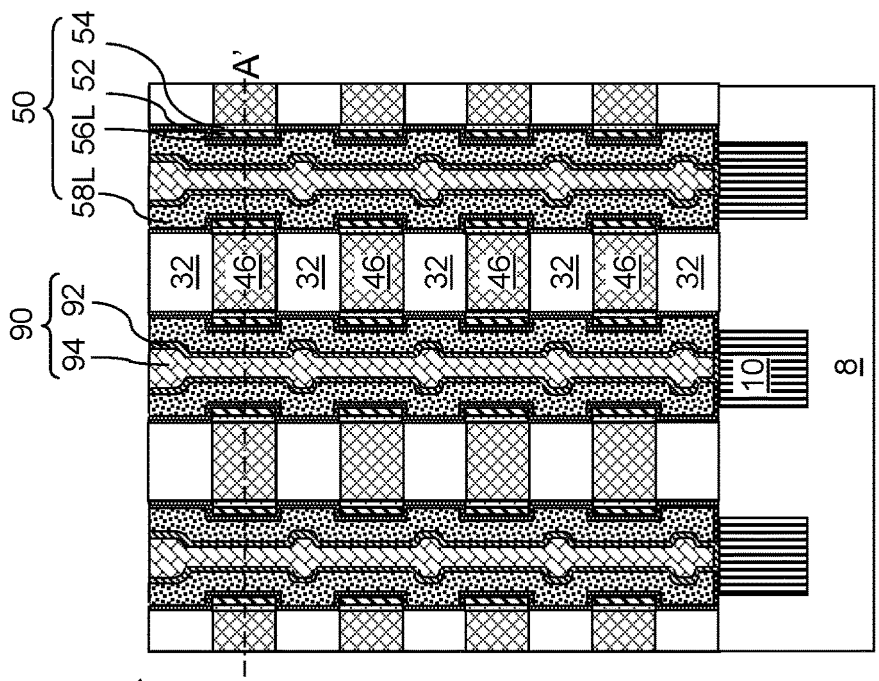
FIG. 23B is a vertical cross-sectional view along the vertical plane B-B' of the fifth configuration of the first exemplary structure of FIG. 23A. The horizontal A-A' is the plane of the horizontal cross-sectional view of FIG. 23A.
Figure 23A:
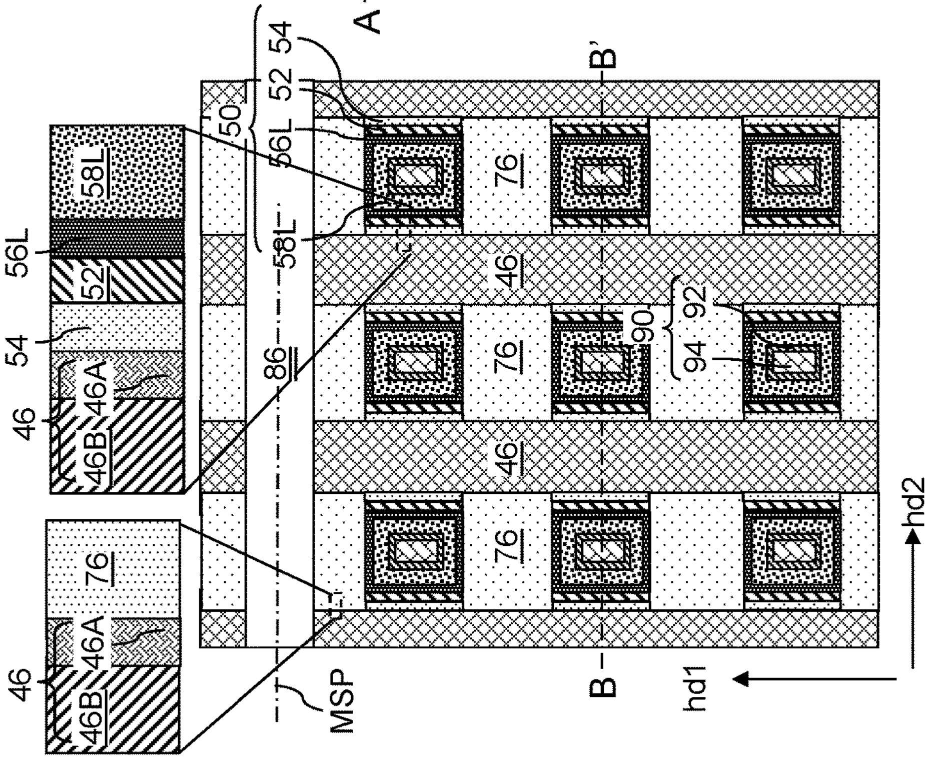
FIG. 23A is a horizontal cross-sectional view of a fifth configuration of the first exemplary structure derived by omitting lateral recessing of the sacrificial material strips according to the first embodiment of the present disclosure.

Referring to FIGS. 23A and 23B, a fifth configuration of the first exemplary structure can be derived from the fourth configuration of the first exemplary structure by omitting lateral recessing of the sacrificial material strips 42 at the processing steps of FIGS. 10A and 10B. In this case, the width of the line trenches 79 and/or the volume of the pillar cavities 49 may be adjusted to accommodate the phase change memory cells to be subsequently formed in the pillar cavities 49. The discrete selector material portions 54 can be formed within a respective vertical plane including sidewalls of insulating strips 32 and sidewalls of the sacrificial material strips 42. Each sacrificial material strip 42 can have a uniform width throughout along the second horizontal direction hd2.

Each selector material portion can be formed as a discrete selector material portion 54 that contacts only a single one of the discrete metal portions 52 and a respective electrically conductive strip 42. Each phase change memory material portion is a portion of a phase change memory material layer 58L that is formed at a periphery of a respective one of the pillar cavities 49 and extends from a bottommost insulating strip 32 to a topmost insulating strip 32. Each of the discrete metal portions 52 can be formed between a phase change memory material portion and a selector material portion within a respective phase change memory cell 50. Each vertical bit line 90 is formed directly on a respective phase change memory material layer 58L. Each phase change memory material layer 58L can have a greater lateral extent at levels of the insulating strips 32 than at levels of the electrically conductive strips 42. Each combination of a vertical bit line 90 and an adjoining pair of vertical stacks of phase change memory cells 50 can be located within a respective pillar cavity 49 including straight sidewalls that extend from a pair of bottommost insulating strips 32 to a pair of topmost insulating strips 32 an/or from a bottommost level of the electrically conductive strips 46 to a topmost level of the electrically conductive strips 46.

Figures 24A, 24B:
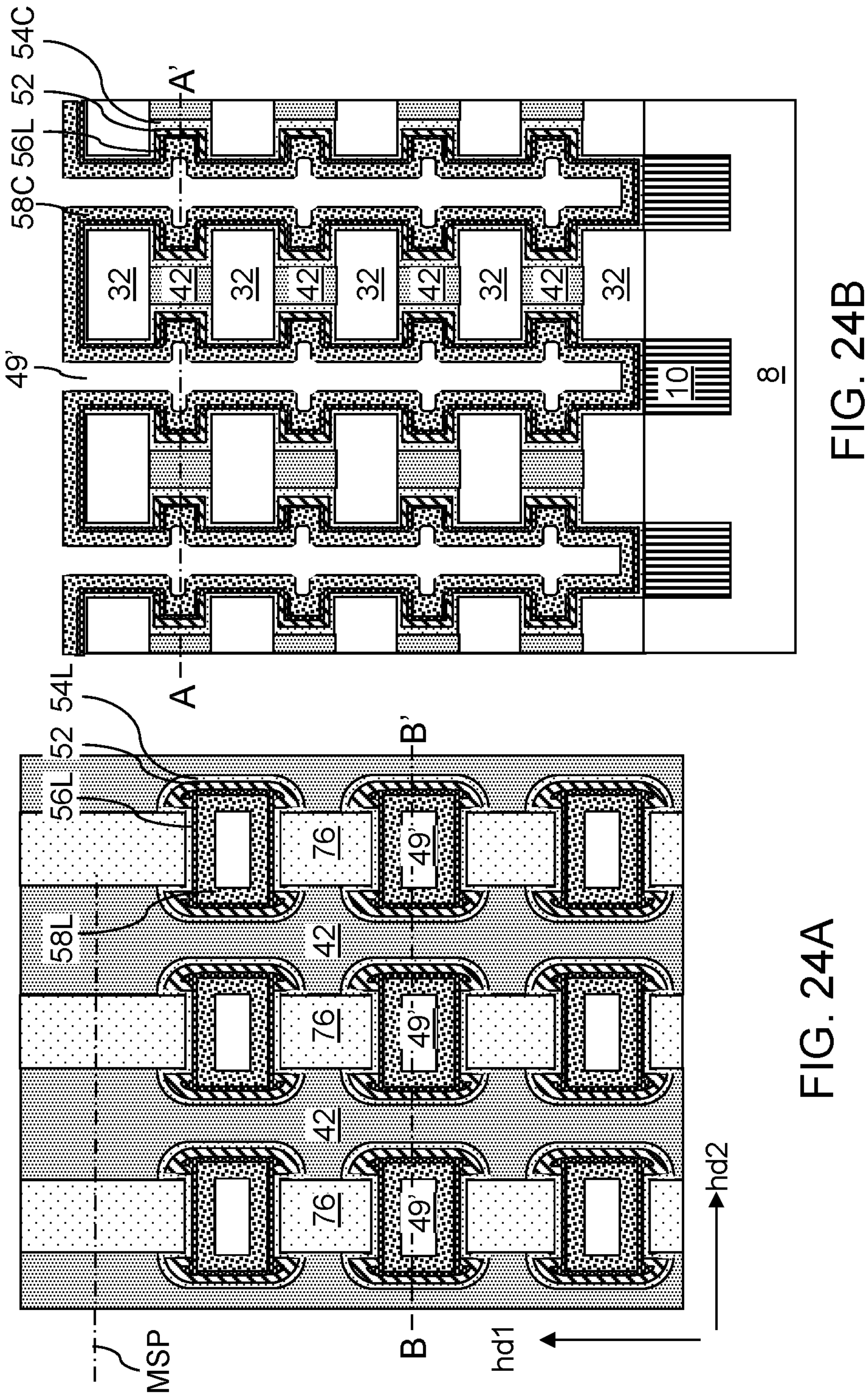
FIG. 24A is a horizontal cross-sectional view of a sixth configuration of the first exemplary structure after formation of a phase change memory material layer according to the first embodiment of the present disclosure.
FIG. 24B is a vertical cross-sectional view along the vertical plane B-B' of the sixth configuration of the first exemplary structure of FIG. 24A. The horizontal A-A' is the plane of the horizontal cross-sectional view of FIG. 24A.

Referring to FIGS. 24A and 24B, a sixth configuration of the first exemplary structure can be derived from the third configuration of the first exemplary structure by forming a continuous selector material layer 54C in lieu of discrete selector material portions 54. The sacrificial material strips 42 are laterally recessed selective to the insulating strips 32 to form lateral recesses. The continuous selector material layer 54C can be formed by a non-selective deposition method directly on all physically exposed surfaces of the first exemplary structure illustrated in FIGS. 10A and 10B. Subsequently, a continuous metal layer can be formed by a conformal non-selective deposition process such as chemical vapor deposition process. An anisotropic etch process can be performed to remove portions of the continuous metal layer that are not located within the recess regions of the laterally-expanded cavities 49". An optional isotropic etch can be performed to further recess the discrete metal portions 52 into lateral recesses at each level of the sacrificial material strips 42 between each pair of adjacent insulating strips 32. Each remaining discrete portion of the continuous metal layer constitutes a discrete metal portion 52. Thus, the discrete metal portions 52 are formed within a respective one of the lateral recesses at each level of the sacrificial material strips 42. The discrete metal portions 52 can include a metal such as W, Co, Ru, Mo, TiN, TaN, WN, or a combination or an alloy thereof. Subsequently, a continuous carbon layer 56C and a continuous phase change memory material layer 58C can be deposited by performing the processing steps of FIGS. 13A and 13B. At least a portion of each lateral recess is filled with the continuous phase change memory material layer 58C.

Figure 25B:
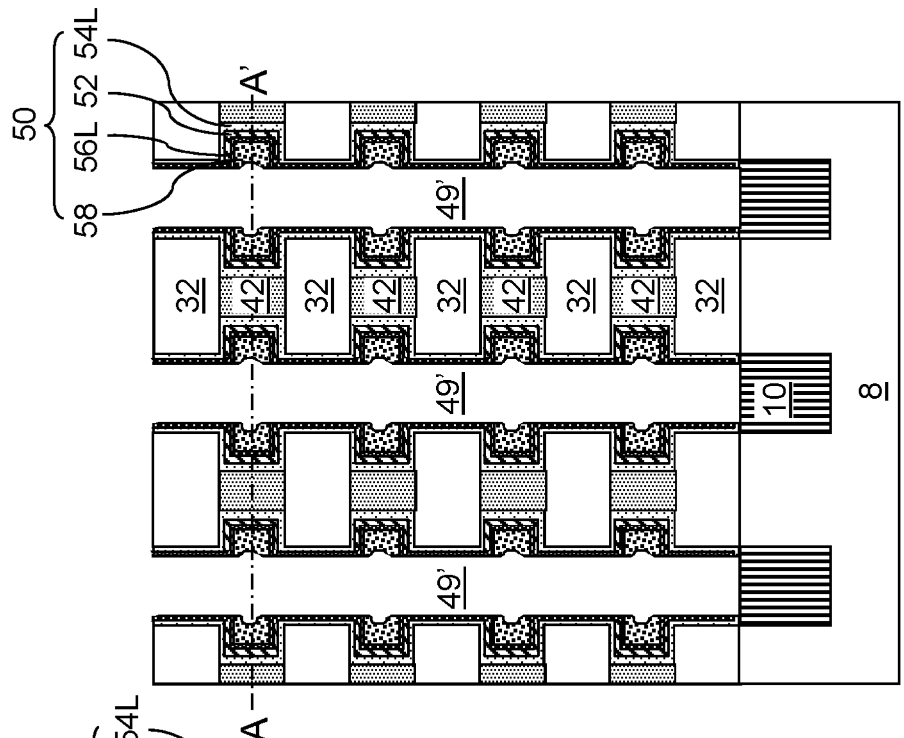
FIG. 25B is a vertical cross-sectional view along the vertical plane B-B' of the sixth configuration of the first exemplary structure of FIG. 25A. The horizontal A-A' is the plane of the horizontal cross-sectional view of FIG. 25A.
Figure 25A:
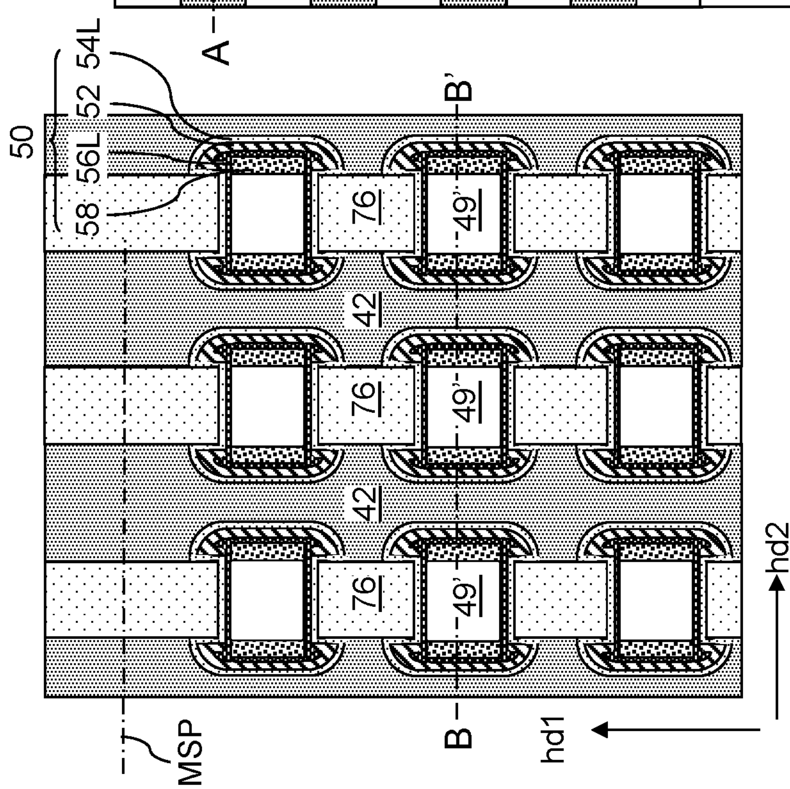
FIG. 25A is a horizontal cross-sectional view of the sixth configuration of the first exemplary structure after formation of discrete phase change memory material portions according to the first embodiment of the present disclosure.

Referring to FIGS. 25A and 25B, portions of the continuous phase change memory material layer 58C are etched back from volumes of the pillar cavities 49 (as formed at the processing steps of FIGS. 9A-9C) employing an etch back process. For example, an anisotropic etch process can be performed to remove portions of the continuous phase change memory material layer 58C from within the volumes of the memory cavities 49'. Each remaining portion of the continuous phase change memory material layer 58C can be located at a level of a respective one of the sacrificial material strips 42, and constitutes a discrete phase change memory material portion 58. In one embodiments, the discrete phase change memory material portions 58 can be clam-shaped, i.e., can have a respective vertically-extending portion, a respective top horizontal portion adjoined to an upper edge of the respective vertically-extending portion, and a respective bottom horizontal portion adjoined to a lower edge of the respective vertically-extending portion. Two vertical stacks of discrete phase change memory material portions 58 can be provided around each memory cavity 49'.

Horizontal portions of the continuous carbon layer 56C and the continuous selector material layer 54C can be removed by the anisotropic etch. Vertical portions of the continuous carbon layer 56C and the continuous selector material layer 54C may, or may not, be removed from the volumes of the pillar cavities 49 as formed at the processing steps of FIGS. 9A-9C. In case only horizontal portions of the continuous carbon layer 56C are removed by the anisotropic etch process, a carbon layer 56 (which is a remaining portion of the continuous carbon layer 56C) can vertically extend from a pair of bottommost insulating strips 32 to a pair of topmost insulating strips 32 and/or from a bottommost level of the electrically conductive strips 46 to a topmost level of the electrically conductive strips 46 around each memory cavity 49. In case only horizontal portions of the continuous selector material layer 54C are removed by the anisotropic etch process, a selector material layer 54 can vertically extend from a pair of bottommost insulating strips 32 to a pair of topmost insulating strips and/or from a bottommost level of the electrically conductive strips 46 to a topmost level of the electrically conductive strips 46 around each memory cavity 49.

Figure 26B:
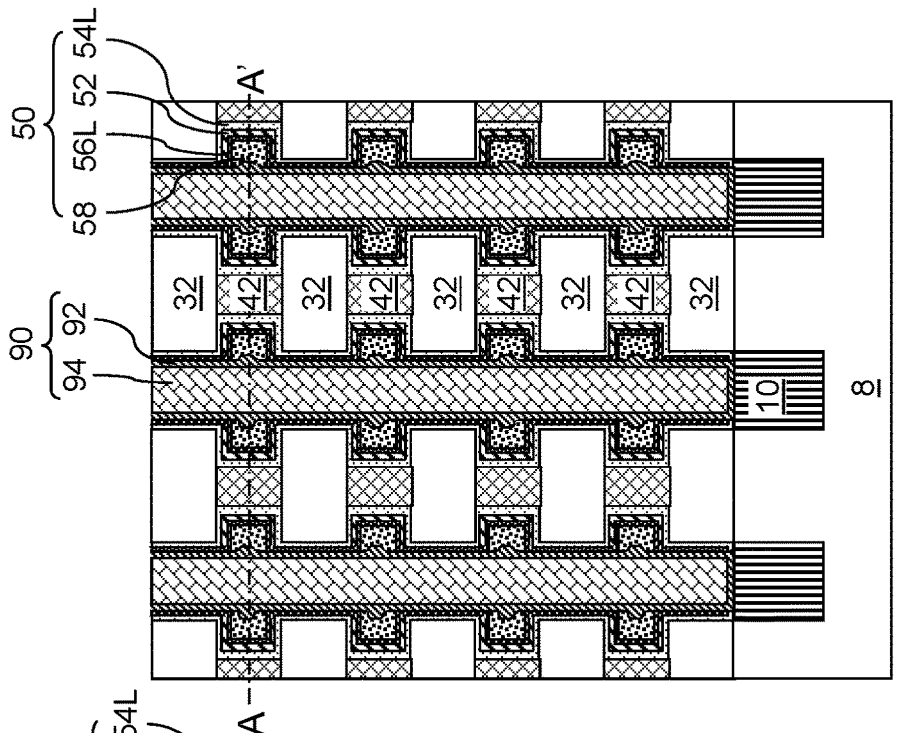
FIG. 26B is a vertical cross-sectional view along the vertical plane B-B' of the sixth configuration of the first exemplary structure of FIG. 26A. The horizontal A-A' is the plane of the horizontal cross-sectional view of FIG. 26A.
Figure 26A:
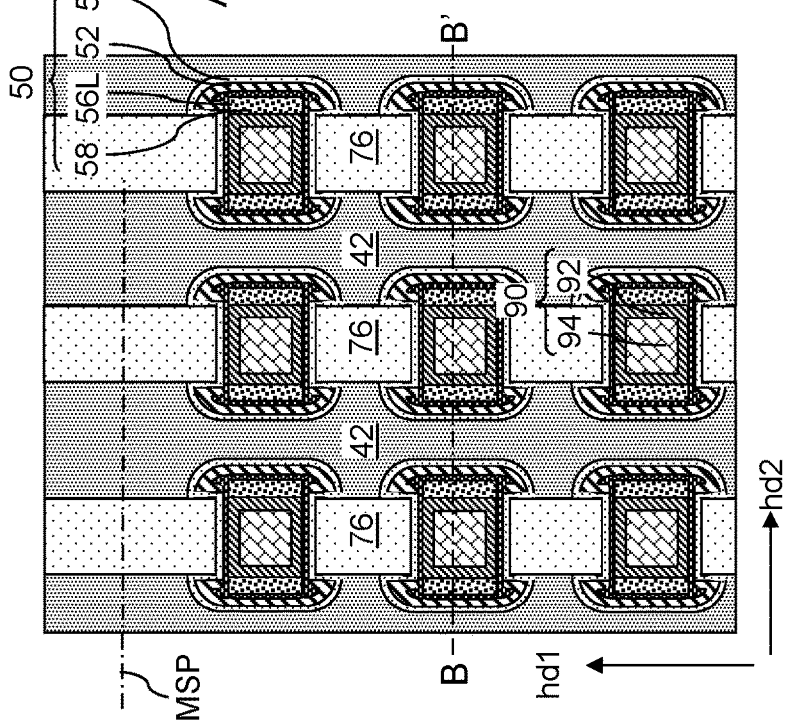
FIG. 26A is a horizontal cross-sectional view of the sixth configuration of the first exemplary structure after formation of vertical bit lines according to the first embodiment of the present disclosure.

Referring to FIGS. 26A and 26B, the processing steps of FIGS. 15A and 15B can be performed to form a vertical bit line 90 within each memory cavity 49'.

Figure 27B:
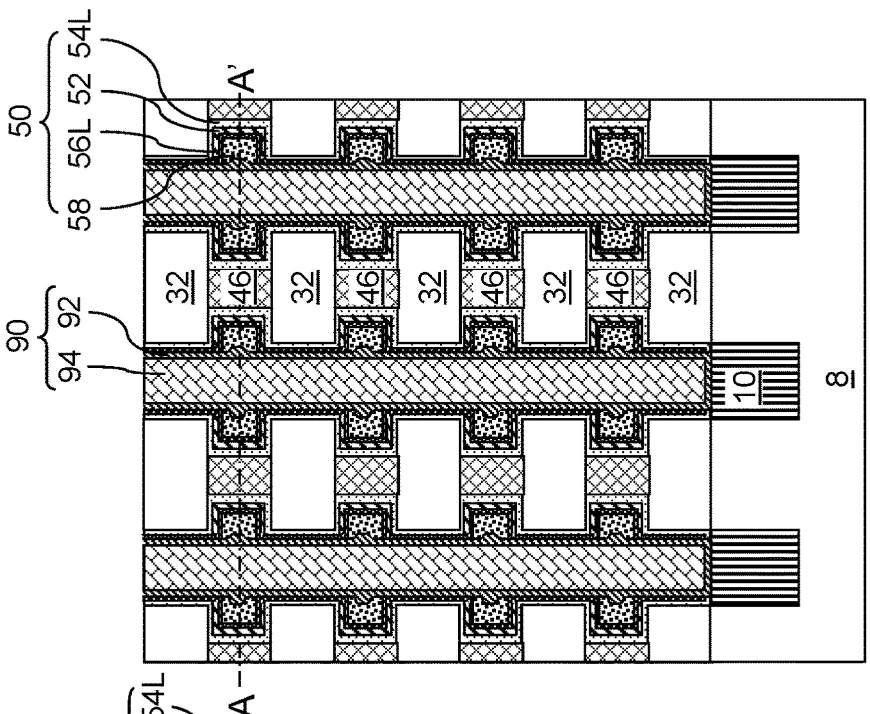
FIG. 27B is a vertical cross-sectional view along the vertical plane B-B' of the sixth configuration of the first exemplary structure of FIG. 27A. The horizontal A-A' is the plane of the horizontal cross-sectional view of FIG. 27A.
Figure 27A:
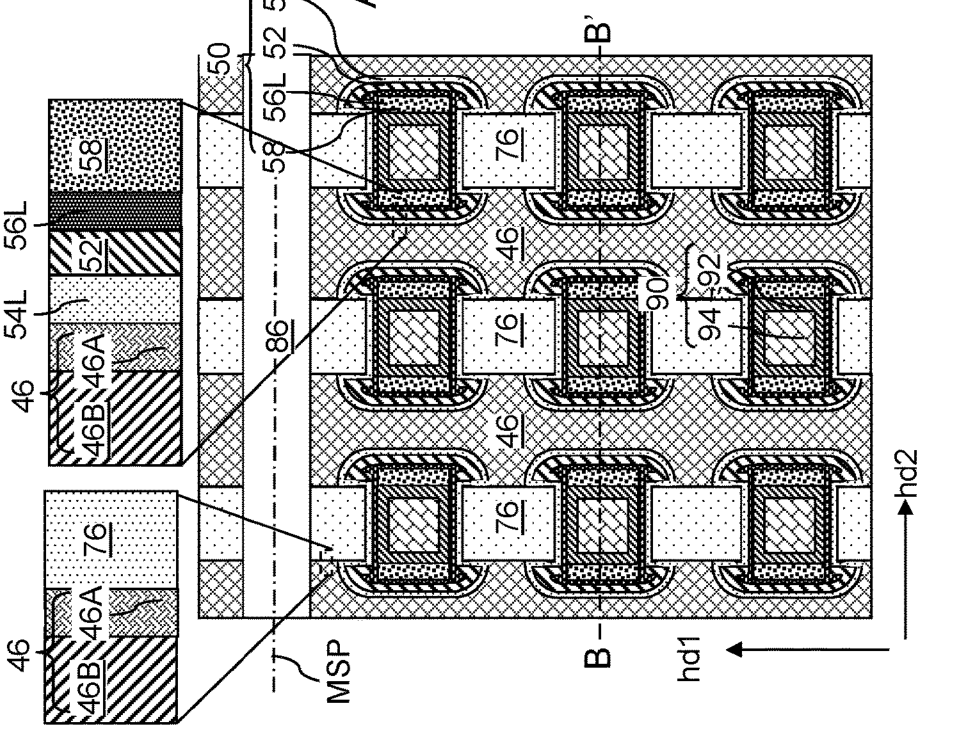
FIG. 27A is a horizontal cross-sectional view of the sixth configuration of the first exemplary structure after formation of a backside trench, replacement of the sacrificial material strips with electrically conductive strips, and formation of a dielectric wall structure according to the first embodiment of the present disclosure.

Referring to FIGS. 27A and 27B, the processing steps of FIGS. 16A-16C and 17A-17C can be performed to form a backside trench 89, to replace the sacrificial material strips 42 with electrically conductive strips 46, and to form a dielectric wall structure 86 in the backside trench 89.

In the sixth configuration of the first exemplary structure, each selector material portion may be formed as a respective portion within a selector material layer 54L that laterally surrounds a respective one of the vertical bit lines 90 and continuously extends vertically from a bottommost level of the insulating strips 32 to a topmost level of the insulating strips 32 and/or from a bottommost level of the electrically conductive strips 46 to a topmost level of the electrically conductive strips 46. Alternatively, each selector material portion may be formed as a clam-shaped discrete selector material portion. The phase change memory material portions can be formed as discrete remaining phase change memory material portions 58 that are patterned after the etch back process. Each of the discrete metal portions 52 can be formed between a phase change memory material portion and a selector material portion within a respective phase change memory cell 50. Each vertical bit line 90 is formed directly on two vertical stacks of discrete phase change memory material portions 58.

Figure 28B:
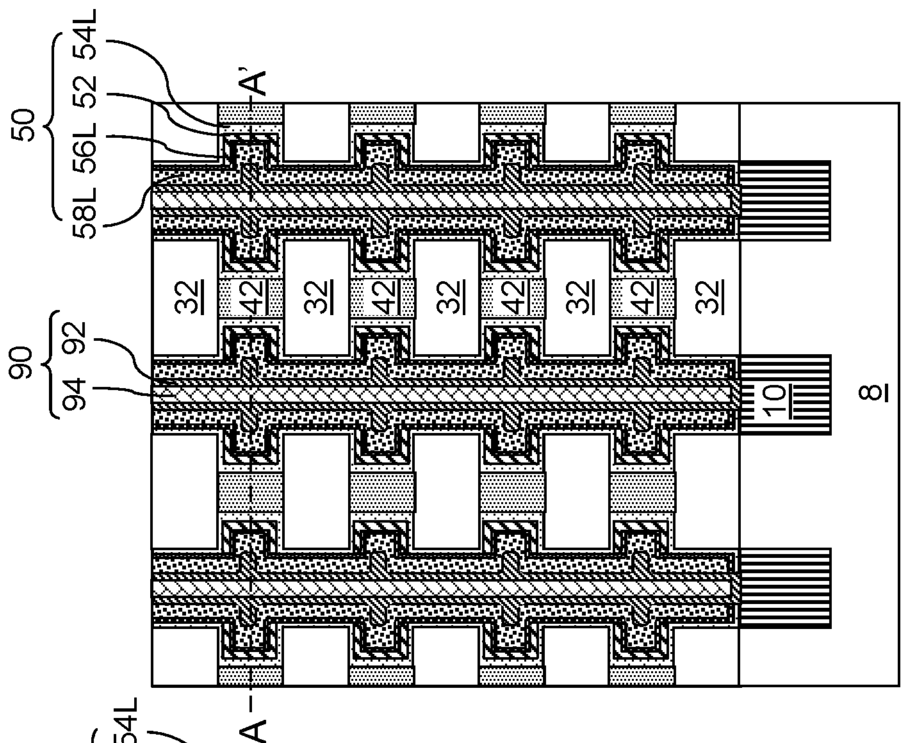
FIG. 28B is a vertical cross-sectional view along the vertical plane B-B' of the seventh configuration of the first exemplary structure of FIG. 28A. The horizontal A-A' is the plane of the horizontal cross-sectional view of FIG. 28A.
Figure 28A:
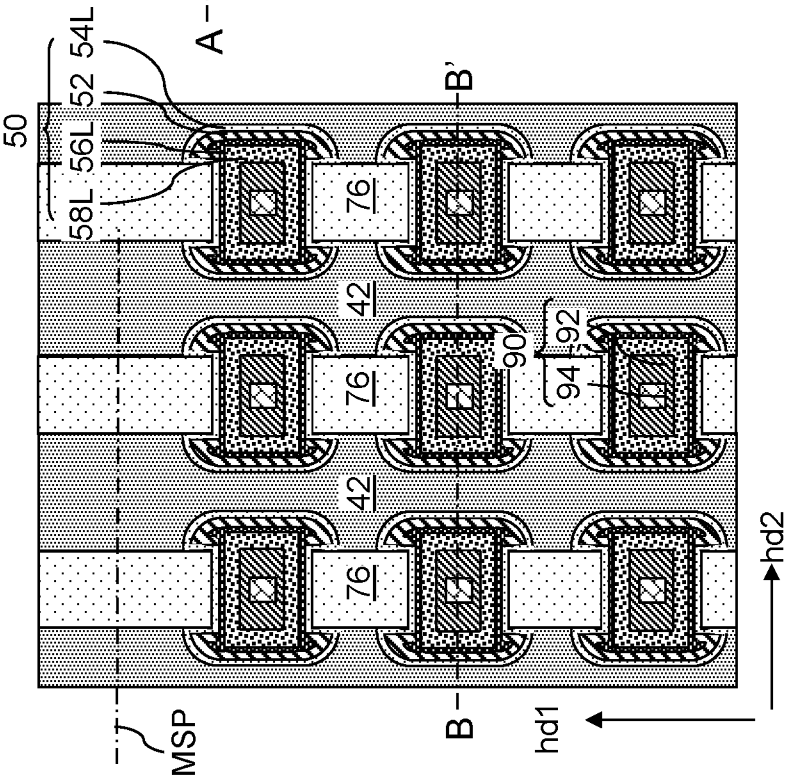
FIG. 28A is a horizontal cross-sectional view of a seventh configuration of the first exemplary structure after formation of vertical bit lines according to the first embodiment of the present disclosure.

Referring to FIGS. 28A and 28B, a seventh configuration of the first exemplary structure can be derived from the sixth exemplary configuration of the first exemplary structure of FIGS. 24A and 24B by anisotropically etching only horizontal portions of the continuous phase change memory material layer 58C, the continuous carbon layer 56C, and the continuous selector material layer 54C without removing vertical portions of the continuous phase change memory material layer 58C, the continuous carbon layer 56C, and the continuous selector material layer 54C. In this case, the duration of each step of the anisotropic etch process that etches the materials of the continuous phase change memory material layer 58C, the continuous carbon layer 56C, and the continuous selector material layer 54C can be selected to minimize any overetch step after removal of the horizontal portions of each layer (58C, 56C, 54C).

Each remaining vertical portion of the continuous phase change memory material layer 58C constitutes a phase change memory material layer 58L that vertically extends from the level of the bottommost insulating strips 32 to the topmost insulating strips 32 and/or from a bottommost level of the electrically conductive strips 46 to a topmost level of the electrically conductive strips 46 with lateral undulation. Each remaining vertical portion of the continuous carbon layer 56C (if employed) constitutes a carbon layer 56 that vertically extends from the level of the bottommost insulating strips 32 to the topmost insulating strips 32 with lateral undulation. Each remaining vertical portion of the continuous selector material layer 54C constitutes a selector material layer 54 that vertically extends from the level of the bottommost insulating strips 32 to the topmost insulating strips 32 and/or from a bottommost level of the electrically conductive strips 46 to a topmost level of the electrically conductive strips 46 with lateral undulation.

Figure 29B:
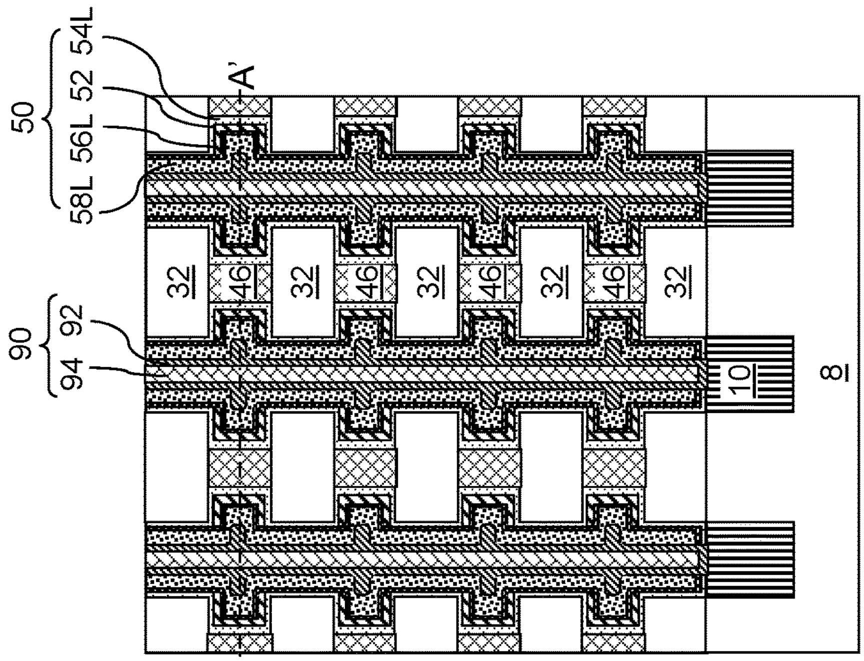
FIG. 29B is a vertical cross-sectional view along the vertical plane B-B' of the seventh configuration of the first exemplary structure of FIG. 29A. The horizontal A-A' is the plane of the horizontal cross-sectional view of FIG. 29A.
Figure 29A:
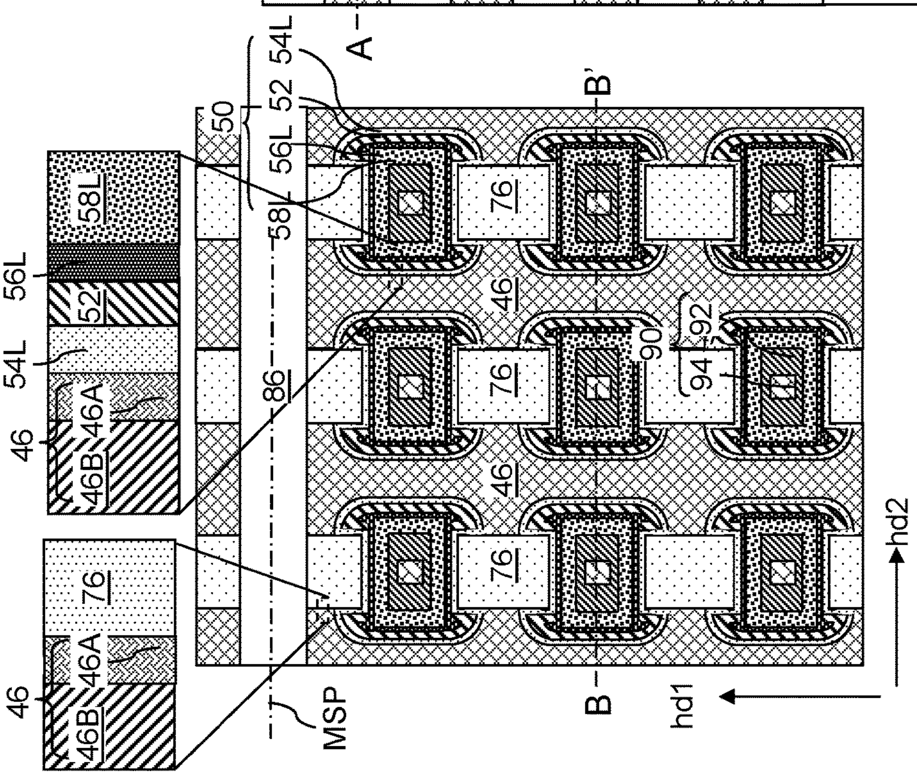
FIG. 29A is a horizontal cross-sectional view of the seventh configuration of the first exemplary structure after formation of a backside trench, replacement of the sacrificial material strips with electrically conductive strips, and formation of a dielectric wall structure according to the first embodiment of the present disclosure.

Referring to FIGS. 29A and 29B, the processing steps of FIGS. 16A-16C and 17A-17C can be performed to form a backside trench 89, to replace the sacrificial material strips 42 with electrically conductive strips 46, and to form a dielectric wall structure 86 in the backside trench 89.

In the seventh configuration of the first exemplary structure, each phase change memory material portion is a respective portion within a phase change memory material layer 58L formed at a periphery of a respective one of the pillar cavities 49. Each vertical bit line 90 is formed directly on a respective phase change memory material layer 58L. Each selector material portion is formed as a respective portion within a selector material layer 54L that laterally surrounds a respective one of the vertical bit lines 90 and continuously extends vertically from a bottommost level of the electrically conductive strips 46 to a topmost level of the electrically conductive strips 46. Each of the discrete metal portions 52 is formed between a phase change memory material layer 58L and a selector material layer 54 within a respective phase change memory cell 50.

Figure 30B:
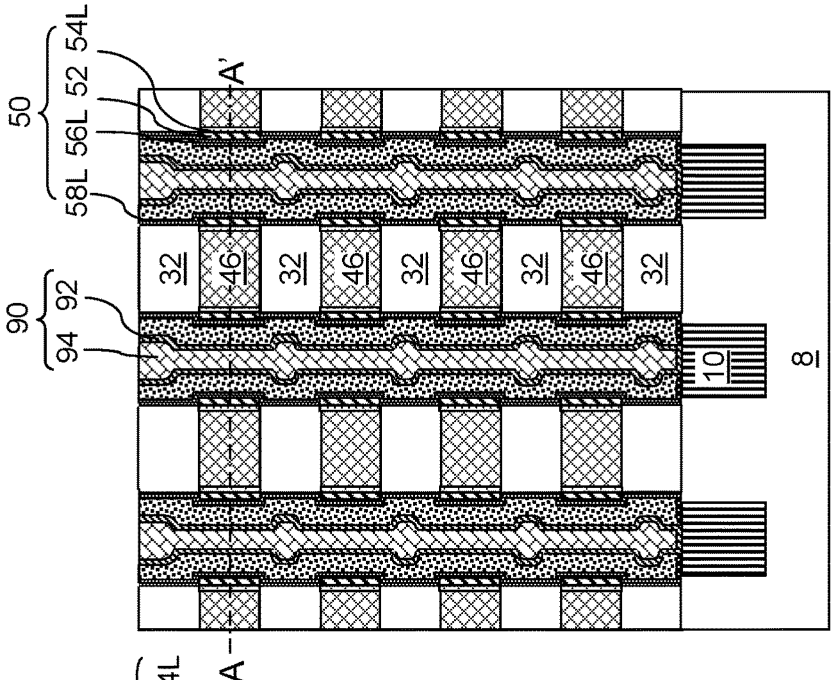
FIG. 30B is a vertical cross-sectional view along the vertical plane B-B' of the sixth configuration of the first exemplary structure of FIG. 30A. The horizontal A-A' is the plane of the horizontal cross-sectional view of FIG. 30A.
Figure 30A:
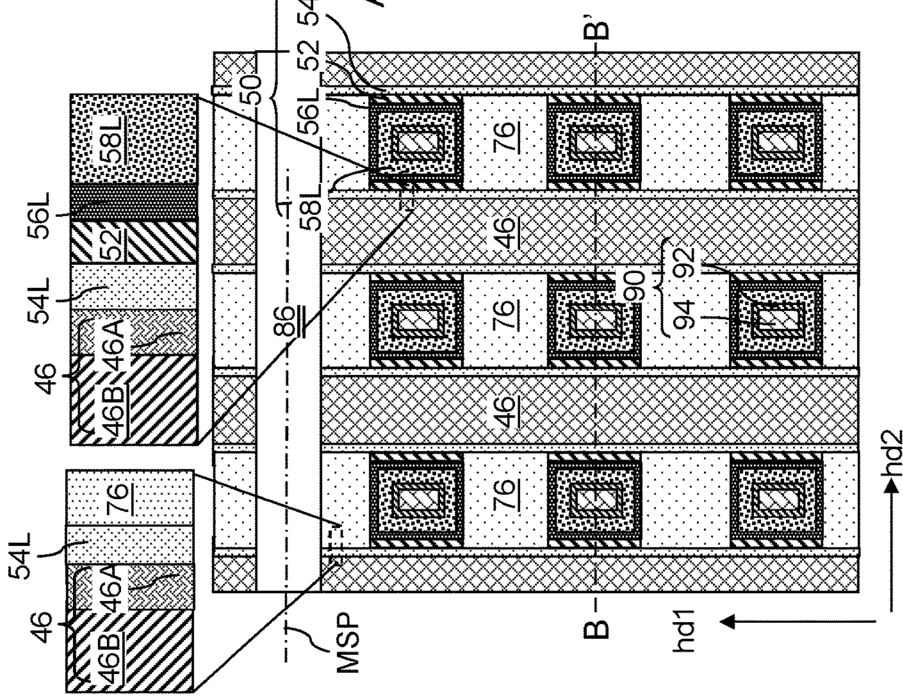
FIG. 30A is a horizontal cross-sectional view of an eighth configuration of the first exemplary structure after formation of a backside trench, replacement of the sacrificial material strips with electrically conductive strips, and formation of a dielectric wall structure according to the first embodiment of the present disclosure.

Referring to FIGS. 30A and 30B, an eighth configuration of the first exemplary structure can be derived from the first exemplary structure of FIGS. 9A-9C by omitting lateral expansion of the pillar cavities 49, i.e., by omitting the processing steps of FIGS. 10A and 10B. In this case, the width of the line trenches 79 and/or the volume of the pillar cavities 49 may be adjusted to accommodate the phase change memory cells to be subsequently formed in the pillar cavities 49. The processing steps of FIGS. 11A and 11B can be performed without performing the processing steps of FIGS. 12A and 12B. The processing steps of FIGS. 13A and 13B can be performed to form a continuous carbon layer 56C and a continuous phase change memory material layer 58C in the pillar cavities 49. Thus, formation of selector material portions 54 or a continuous selector material layer 54C is omitted between formation of the discrete metal portions 52 and formation of a continuous phase change memory material layer 58C. The processing steps of FIGS. 18A and 18B can be performed to pattern the continuous carbon layer 56C and the continuous phase change memory material layer 58C into carbon layers 56L and phase change memory material layers 58L, respectively.

The processing steps of FIGS. 19A and 19B can be performed to form vertical bit lines 90. The processing steps of FIGS. 16A-16C can be subsequently performed to form a backside trench 89 and backside recesses. A selector material layer 54L can be formed within each backside recess 43. The selector material layer 54L extends continuously in the backside recesses in first horizontal direction, as shown in FIG. 30A, but is not continuous in the vertical direction in the pillar cavities 49 as shown in FIG. 30B. In contrast, in the fifth configuration of the first exemplary structure shown in FIGS. 23A and 23B, the selector material portions 54 are discontinuous in the first horizontal direction hd1. Electrically conductive strips 46 can be formed in remaining volumes of the backside recesses 43. After removal of collaterally deposited conductive material portions that are simultaneously deposited with formation of the electrically conductive strips 46 from the backside trench 89, the backside trench 89 is filled with a dielectric material to form a dielectric wall structure 86.

In the eighth configuration of the first exemplary structure, each electrically conductive strip 46 can have a uniform vertical cross-sectional shape that is invariant along the first horizontal direction hd1. Each selector material portion is formed as a respective portion within a selector material layer 54L that surrounds a respective electrically conductive strip 46. For example, each selector material layer 54 can include an upper horizontal portion, a lower horizontal portion, and a pair of sidewall portions that connect the upper horizontal portion and the lower horizontal portion. Each selector material layer 54L between a pair of line trenches 79 can contact two rows of discrete metal portions 52. Each contact each phase change memory material portion is a respective portion within a phase change memory material layer 58L formed at a periphery of a respective one of the pillar cavities 49. Each selector material portion is a respective portion of a selector material layer 54L that extends along the first horizontal direction and contacts at least one row, such as two rows, of discrete metal portions 52. Each of the discrete metal portions 52 is formed between a phase change memory material portion and a selector material portion within a respective phase change memory cell 50. Each vertical bit line 90 is formed directly on a respective phase change memory material layer 58L.

The various configurations of the first exemplary structure include a three-dimensional phase change memory device. The three-dimensional phase change memory device comprises: a first group of alternating stacks (32,46) of insulating strips 32 and electrically conductive strips 46 located over a substrate 8 (i.e., a group located on one side of the dielectric wall structure 86), wherein each of the insulating strips 32 and electrically conductive strips 46 within the first group of alternating stacks (32, 46) laterally extends along a first horizontal direction hd1, and the alternating stacks (32, 46) within the first group are laterally spaced apart along a second horizontal direction hd2; laterally alternating sequences of vertical bit lines 90 and dielectric isolation pillars 76 located between each neighboring pair of alternating stacks (32, 46); and a phase change memory cell 50 including a discrete metal portion 52, a phase change memory material portion (58 or 58L), and a selector material portion (54 or 54L) is located in each intersection region between the electrically conductive strips 46 and the vertical bit lines 90. As used herein, an "intersection region" refers to a region in any horizontal plane parallel to the top surface of the substrate 8 between a portion of a respective vertical bit line 90 and an adjacent electrically conductive strip 46 which are located in the horizontal plane.

In one embodiment, the three-dimensional phase change memory device further comprises a second group of alternating stacks (32, 46) of insulating strips 32 and electrically conductive strips 46 located over the substrate 8 (for example, due to the mirror symmetry about the mirror symmetry plane MSP), wherein: each of the insulating strips 32 and electrically conductive strips 46 within the second group of alternating stacks (32, 46) laterally extends along the first horizontal direction hd1, and the alternating stacks (32, 46) within the second group are laterally spaced apart along the second horizontal direction hd2. A backside trench 89 laterally extends along the second horizontal direction hd2 between the first and second groups of alternating stacks, and including a dielectric wall structure 86 therein. The dielectric wall structure 86 includes a first lengthwise sidewall that contacts sidewalls of each insulating strip 32 and sidewalls of each electrically conductive strip 46 within the first group of alternating stacks (32, 46), and the dielectric wall structure 86 includes a second lengthwise sidewall that contacts sidewalls of each insulating strip 32 and sidewalls of each electrically conductive strip 46 within the second group of alternating stacks (32, 46).

In one embodiment, the alternating stacks within first and second groups are laterally spaced apart along a second horizontal direction hd2 with an average pitch, which may be a uniform pitch if the alternating stacks (32, 46) are periodic.

In one embodiment, each of the electrically conductive strips 46 comprises: a respective conformal metallic liner 46A, and a respective metallic fill material portion 46B that is not in direct contact with any of the dielectric isolation pillars 76 (due to the metallic liner 46A). In one embodiment, each conformal metallic liner 46A contacts a respective area of the first lengthwise sidewall of the dielectric wall structure 86; and each metallic fill material portion 46B contacts a respective area of the first lengthwise sidewall of the dielectric wall structure 86.

In one embodiment, the phase change memory cell 50 further comprises a carbon portion (56 or 56L) located between the selector material portion (54 or 54L) and the phase change memory material portion (58 or 58L).

In one embodiment, a vertical stack of phase change memory cells 50 is formed directly on each of the dielectric isolation pillars 76, wherein the vertical stack of phase change memory cells 50 comprises a set of phase change memory cells 50 formed at each level of the electrically conductive strips 46.

In one embodiment, each of the dielectric isolation pillars 76 contacts at least one vertical stack of phase change memory cells 50 located at each level of the electrically conductive strips 46. Each of the discrete metal portions 52 is in direct contact with a respective one of the electrically conductive strips 46.

In one embodiment, each of the discrete metal portions 52 is located between a phase change memory material portion (58 or 58L) and a selector material portion (54 or 54L) within a respective phase change memory cell 50.

In one embodiment, each phase change memory material portion is a respective portion within a phase change memory material layer 58L that laterally surrounds a respective one of the vertical bit lines 90 and continuously extends vertically along the respective one of the vertical bit lines 90 from a bottommost level of the electrically conductive strips 46 to a topmost level of the electrically conductive strips 46 and/or from a bottommost level of the insulating strips 32 to a topmost level of the insulating strips 32.

In one embodiment, each phase change memory material portion is a discrete phase change memory material portion 58 having a maximum vertical extent that is equal to, or less than, a thickness of an electrically conductive strip 46 located at a same level as the phase change memory material portion. In one embodiment, each selector material portion is a respective portion within a selector material layer 54L that laterally surrounds a respective one of the vertical bit lines 90 and continuously extends vertically from a bottommost level of the electrically conductive strips 46 to a topmost level of the electrically conductive strips 46 and/or from a bottommost level of the insulating strips 32 to a topmost level of the insulating strips 32. In one embodiment, each selector material portion (54 or 54L) contacts only a single one of the discrete metal portions 52.

Figure 31B:
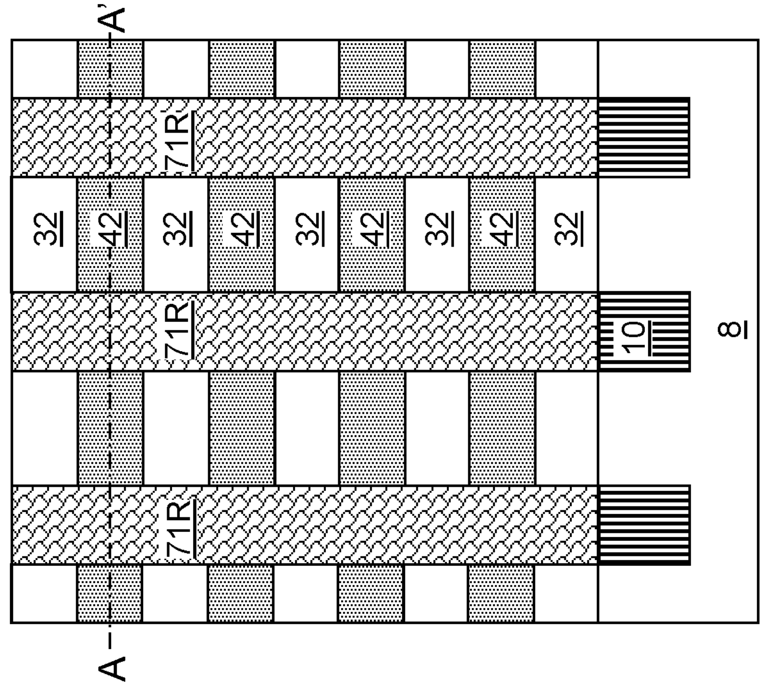
FIG. 31B is a vertical cross-sectional view along the vertical plane B-B' of the first configuration of the second exemplary structure of FIG. 31A.
Figure 31A:
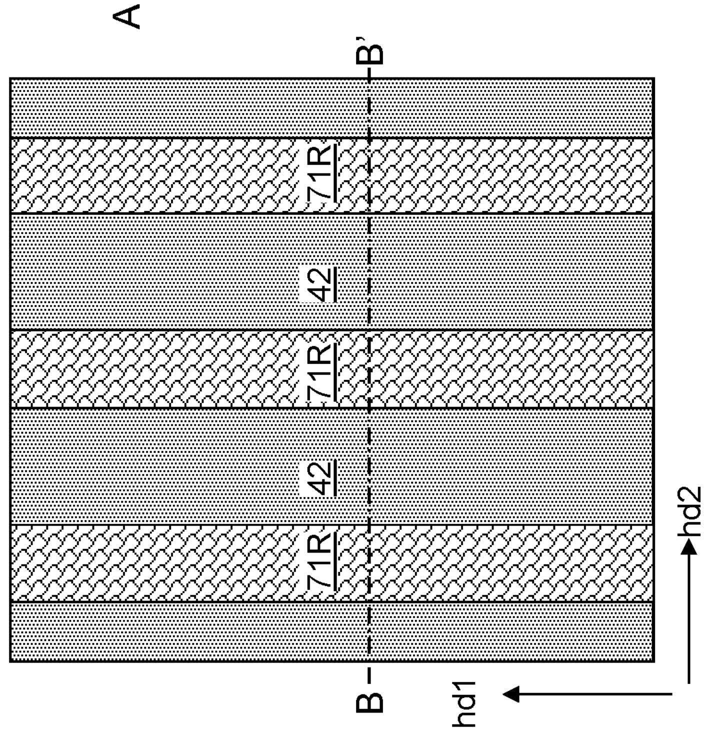
FIG. 31A is a top-down view of a first configuration of a second exemplary structure for forming a three-dimensional phase change memory device after formation of sacrificial rails according to a second embodiment of the present disclosure.

Referring to FIGS. 31A and 31B, a first configuration of a second exemplary structure according to a second embodiment of the present disclosure can be derived from the first exemplary structure of FIGS. 6A and 6B by forming sacrificial rails 71R in the line trenches 79. The sacrificial rails 71R can be formed by depositing a sacrificial fill material that is different from the materials of the insulating strips 32, the sacrificial material strips 42, and the materials of the physically exposed surfaces of the substrate 8 and the access nodes 10 underlying the line trenches 79. The sacrificial fill material can include, for example, a semiconductor material such as amorphous silicon, polysilicon, or a silicon-germanium alloy. In one embodiment, the sacrificial fill material can comprise a heavily doped polysilicon or amorphous silicon that provides enhanced oxidation rates compared to undoped silicon. The sacrificial fill material can be deposited in the line trenches 79, and excess portions of the semiconductor material can be removed from above the topmost surfaces of the alternating stacks (32, 42) by a planarization process such as a recess etch or chemical mechanical planarization. Each remaining portion of the sacrificial fill material constitutes a sacrificial rail 71R. The sacrificial rails 71R can comprise, and/or can consist essentially of, a semiconductor material such as a doped semiconductor material.

In the second embodiment, the array of access nodes 10 can be an array of field effect transistors, such as vertical thin film transistors (VTFTs), which are located between each respective overlying local vertical bit line 90 and the respective underlying global bit line. Any suitable transistor, such as VTFT can be used, such as the VTFT disclosed in U.S. patent application Ser. No. 15/672,929 (filed Aug. 9, 2017), Ser. No. 15/720,490 (filed Sep. 29, 2017), Ser. No. 15/715,532 (filed Sep. 26, 2017) or Ser. No. 15/711,075 (filed Sep. 21, 2017), which are incorporated herein by reference in their entirety.

Figure 32B:
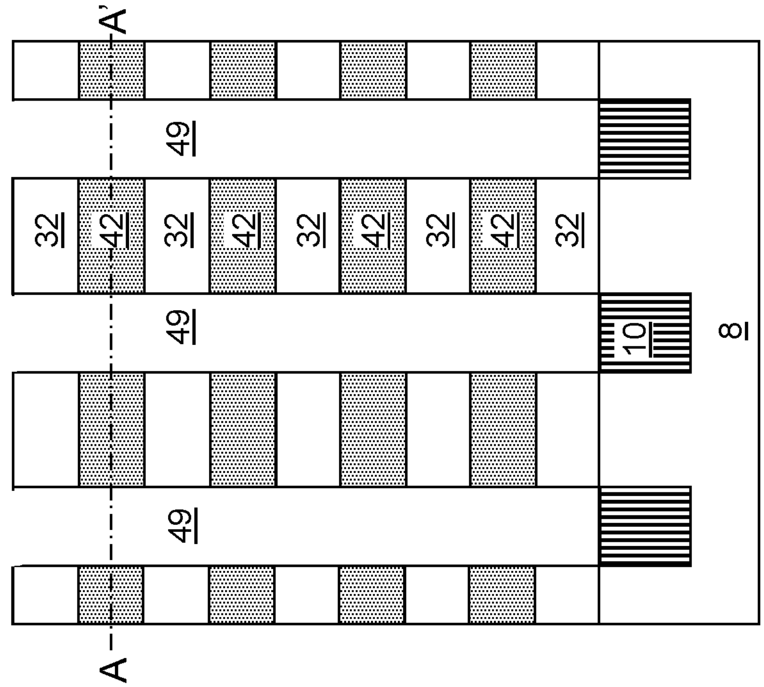
FIG. 32B is a vertical cross-sectional view along the vertical plane B-B' of the first configuration of the second exemplary structure of FIG. 32A. The horizontal plane A-A' is the plane of the horizontal cross-sectional view of FIG. 32A.
Figure 32A:
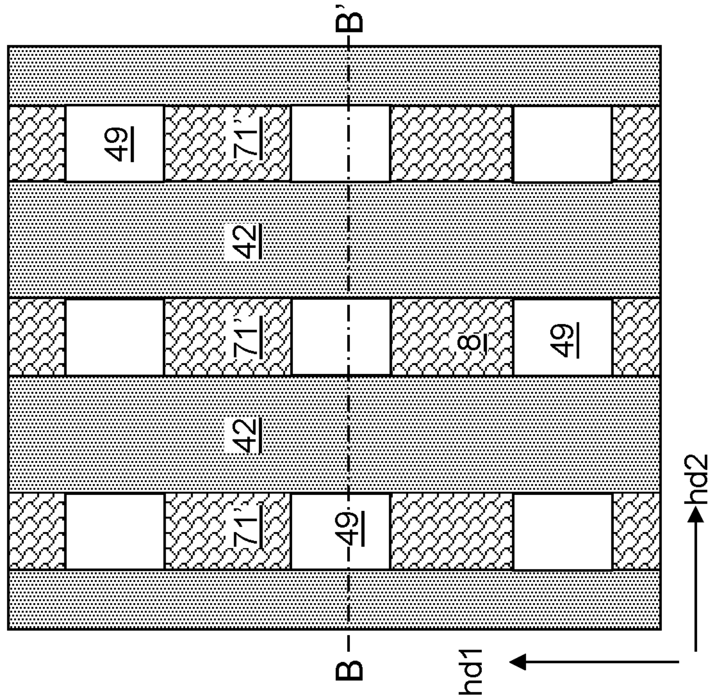
FIG. 32A is a horizontal cross-sectional view of the first configuration of the second exemplary structure after formation of pillar cavities according to the second embodiment of the present disclosure.

Referring to FIGS. 32A and 32B, a photoresist layer (not shown) can be applied over the second exemplary structure, and can be lithographically patterned to form an array of openings that directly overlie the areas of the array of access nodes 10. An anisotropic etch process can be performed to transfer the pattern of the openings in the photoresist layer through the sacrificial rails 71R. Pillar cavities 49 extending to a top surface of a respective one of the access nodes 10 can be formed through the sacrificial rails 71R, and the sacrificial rails 71R can be divided into a respective row of sacrificial material pillars 71'. Each row of sacrificial material pillars 71' can laterally extend along the first horizontal direction hd1. A laterally alternating sequence of pillar cavities 49 and sacrificial material pillars 71' is formed within each of the line trenches 79. In one embodiment, the pillar cavities 49 can be formed as a two-dimensional periodic array. Upon formation of a two-dimensional array of pillar cavities 49 through the sacrificial rails 71R, remaining portions of the sacrificial rails 71R can comprise a two-dimensional array of sacrificial material pillars 71'. In one embodiment, the sacrificial material pillars 71' can be formed as a two-dimensional periodic array having the same periodicities along the first horizontal direction hd1 and along the second horizontal direction hd2 as the two-dimensional periodic array of the pillar cavities 49.

Figure 33B:
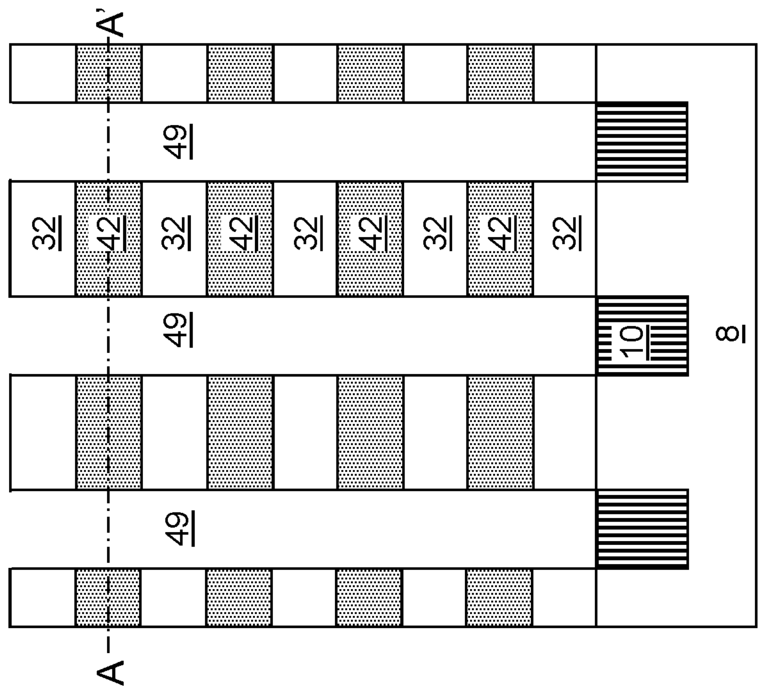
FIG. 33B is a vertical cross-sectional view along the vertical plane B-B' of the first configuration of the second exemplary structure of FIG. 33A. The horizontal plane A-A' is the plane of the horizontal cross-sectional view of FIG. 33A.
Figure 33A:
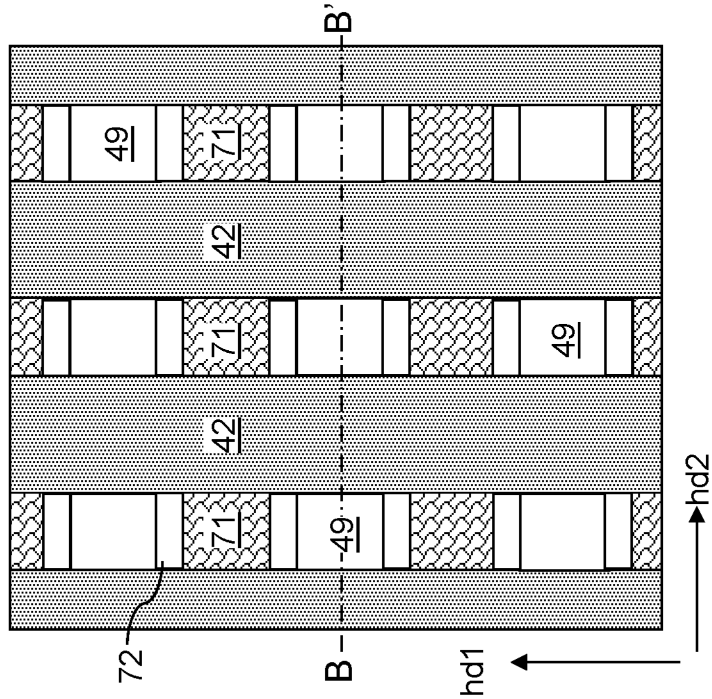
FIG. 33A is a horizontal cross-sectional view of the first configuration of the second exemplary structure after formation of doped semiconductor oxide pillars according to the second embodiment of the present disclosure.

Referring to FIGS. 33A and 33B, in case the sacrificial material pillars 71' include a doped semiconductor material, surface regions of the two-dimensional array of sacrificial material pillars 71' can be oxidized to form doped semiconductor oxide pillars 72. A thermal oxidation process or a plasma oxidation process can be employed to convert the surface portions of the sacrificial material pillars 71' into the doped semiconductor oxide pillars 72. Unoxidized portions of the sacrificial material pillars 71' constitute sacrificial pillar structures 71. A laterally alternating sequence of pillar cavities 49 and sacrificial pillar structures 71 can be formed within each of the line trenches 79. In an illustrative example, the sacrificial pillar structures 71 can include boron-doped silicon, phosphorus-doped silicon, or arsenic-doped silicon, and the doped semiconductor oxide pillars 72 can include boron-doped silicon oxide, phosphorus-doped silicon oxide, or arsenic-doped silicon oxide. The lateral thickness of each doped semiconductor oxide pillars 72 can be in a range from 5 nm to 50 nm, such as from 10 nm to 25 nm, although lesser and greater thicknesses can also be employed.

Figure 34B:
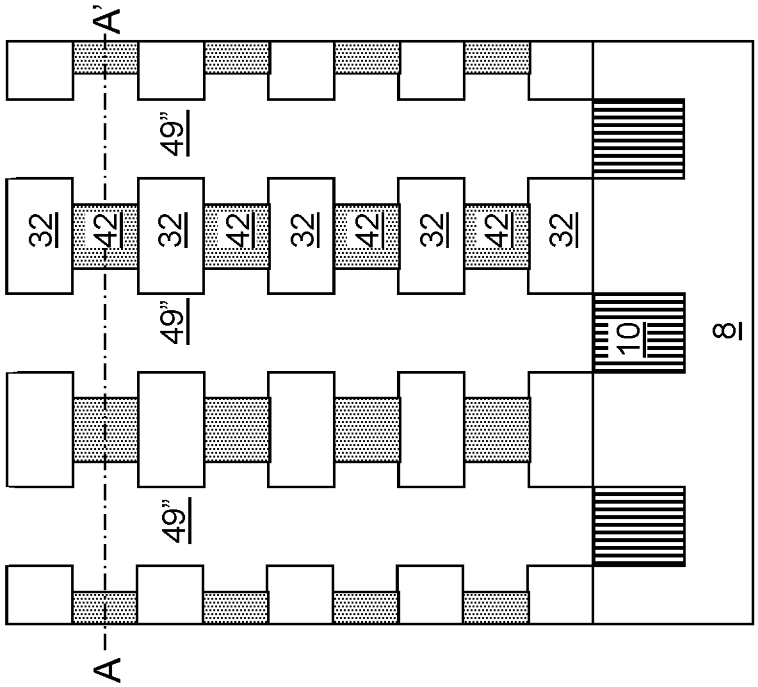
FIG. 34B is a vertical cross-sectional view along the vertical plane B-B' of the first configuration of the second exemplary structure of FIG. 34A. The horizontal plane A-A' is the plane of the horizontal cross-sectional view of FIG. 34A.
Figure 34A:
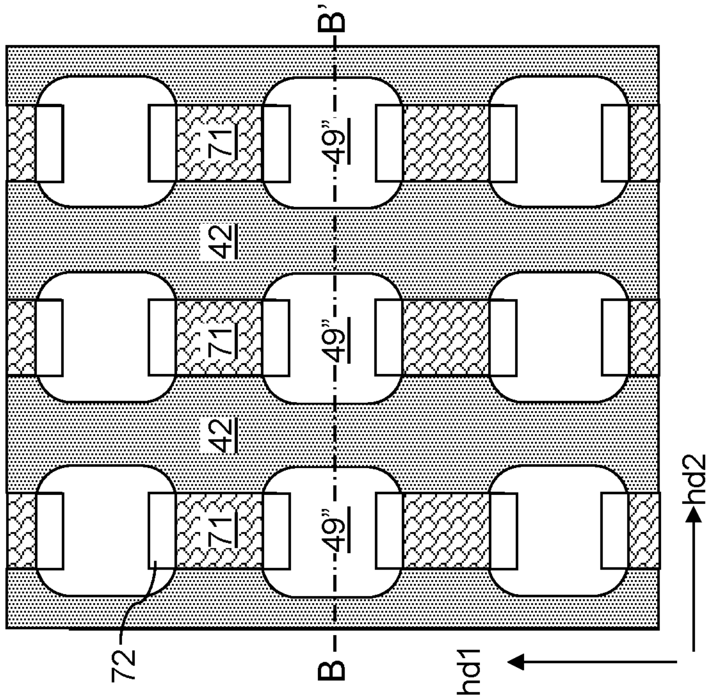
FIG. 34A is a horizontal cross-sectional view of the first configuration of the second exemplary structure after lateral expansion of the pillar cavities at levels of the sacrificial material strips according to the second embodiment of the present disclosure.

Referring to FIGS. 34A and 34B, an isotropic etch process that etches the sacrificial material of the sacrificial material strips 42 selective to the materials of the insulating strips 32 and the doped semiconductor oxide pillars 72 can be performed. An isotropic etchant that etches the sacrificial material can be introduced into the laterally-expanded pillar cavities 49". For example, if the sacrificial material strips 42 include silicon nitride, the isotropic etch process can include a wet etch process employing hot deionized water or hot phosphoric acid. Alternatively, an isotropic dry etch process such as chemical dry etch (CDE) process can be employed to isotropically laterally recess the sacrificial material strips 42. The duration of the isotropic etch process can be selected such that the lateral recess distance of the sidewalls of the sacrificial material strips 42 is less than one half of the width of the sacrificial material strips 42. For example, the lateral recess distance of the sidewalls of the sacrificial material strips 42 can be in a range from 1% to 40%, such as from 3% to 20%, of the width of the sacrificial material strips 42. Laterally-expanded cavities 49" are formed, which have a greater lateral extent at levels of the sacrificial material strips 42 than at levels of the insulating strips 32.

Figure 35B:
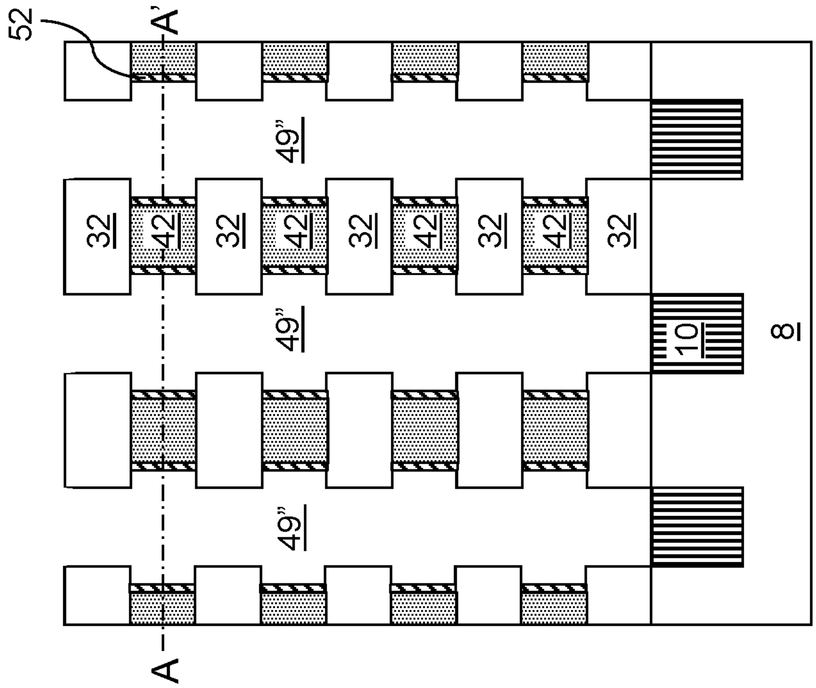
FIG. 35B is a vertical cross-sectional view along the vertical plane B-B' of the first configuration of the second exemplary structure of FIG. 35A. The horizontal plane A-A' is the plane of the horizontal cross-sectional view of FIG. 35A.
Figure 35A:
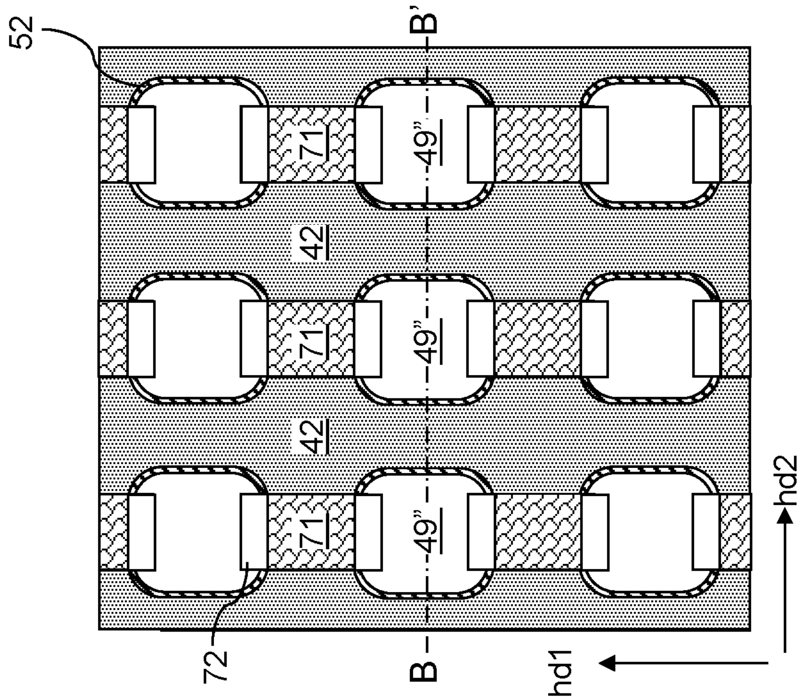
FIG. 35A is a horizontal cross-sectional view of the first configuration of the second exemplary structure after formation of discrete metal portions according to the second embodiment of the present disclosure.

Referring to FIGS. 35A and 25B, discrete metal portions 52 including a metal can be grown only from the physically exposed surfaces of the sacrificial material strips 42 while growth from the surfaces of the insulating strips 32, the doped semiconductor oxide pillars 72, the access nodes 10, and the substrate 8 is suppressed. The metallic element of the discrete metal portions 52 is selected among elements that enable such selective metal deposition process. For example, the discrete metal portions 52 can comprise, and/or consist essentially of, ruthenium, which can be formed by an atomic layer deposition (ALD) process in which a ruthenium precursor of $RuO_4$ and a reducing agent such as $H_2$ are alternately flowed into a process chamber to induce deposition of ruthenium only on silicon nitride surfaces of the sacrificial material strips 42 while suppressing growth of ruthenium from silicon oxide surfaces of the insulating strips 32 and the doped semiconductor oxide pillars 72. In another example, the discrete metal portions 52 can comprise, and/or consist essentially of, ruthenium, which can be formed by an atomic layer deposition (ALD) process in which a molybdenum precursor of $MoCl_6$ and a reducing agent such as $H_2$ are alternately flowed into a process chamber to induce deposition of molybdenum only on silicon nitride surfaces of the sacrificial material strips 42 while suppressing growth of molybdenum from silicon oxide surfaces of the insulating strips 32 and the doped semiconductor oxide pillars 72. Generally, the elemental metal of the discrete metal portions 52 can be selected such that a selective deposition process can provide selective growth of the elemental metal of the discrete metal portions 52 only from the surfaces of the sacrificial material strips 42 while growth from surfaces of the insulating strips 32, the doped semiconductor oxide pillars 72, the access nodes 10, and the substrate 8 is suppressed. In one embodiment, an intermetallic alloy may be employed in lieu of an elemental metal for the discrete metal portions 52.

Each of the discrete metal portions 52 is formed directly on a respective one of the sacrificial material strips 42. The discrete metal portions 52 function as middle electrodes of phase change memory cells to be subsequently formed. The middle electrodes can enhance device characteristics of the phase change memory cells by providing an optimized material interface on a phase change memory material portion and/or on a selector element. The thickness of the discrete metal portions 52 can be in a range from 1 nm to 20 nm, such as from 2 nm to 10 nm, although lesser and greater thicknesses can also be employed.

Figure 36B:
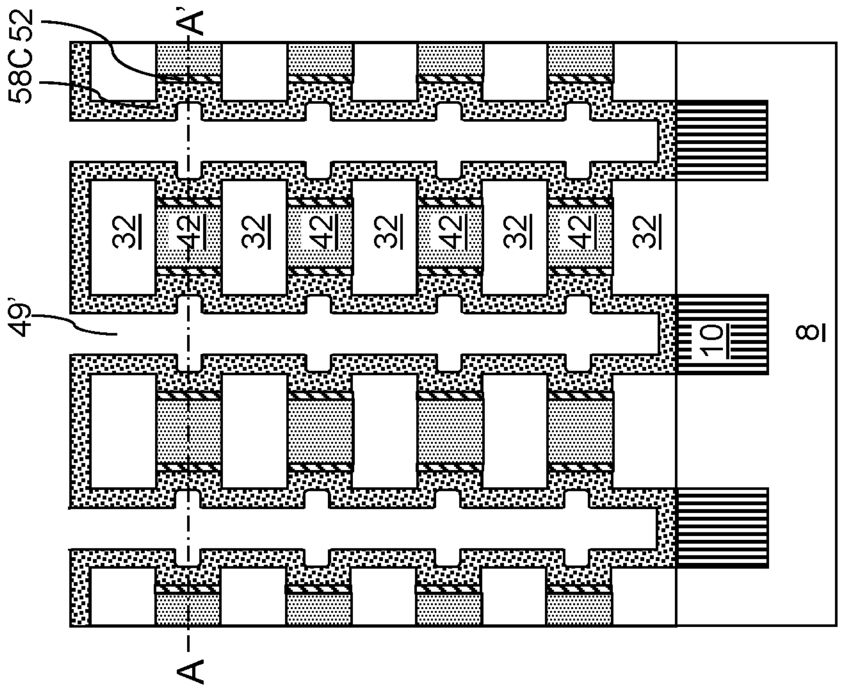
FIG. 36B is a vertical cross-sectional view along the vertical plane B-B' of the first configuration of the second exemplary structure of FIG. 36A. The horizontal plane A-A' is the plane of the horizontal cross-sectional view of FIG. 36A.
Figure 36A:
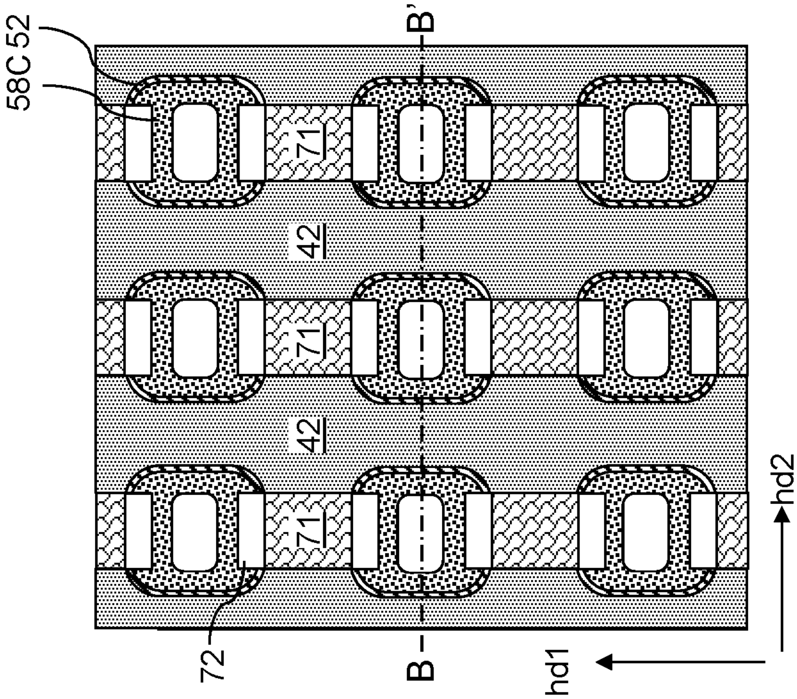
FIG. 36A is a horizontal cross-sectional view of the first configuration of the second exemplary structure after formation of a phase change memory material layer according to the second embodiment of the present disclosure.

Referring to FIGS. 36A and 36B, processing steps of FIGS. 13A and 13B can be performed to optionally deposit a continuous carbon layer (not shown) and to deposit a continuous phase change memory material layer 58C. While an embodiment in which the continuous carbon layer is omitted is described herein, embodiments in which a continuous carbon layer (as described in the first embodiment) is present are expressly contemplate herein for each configuration of the second exemplary structure.

As in the first embodiment, the continuous phase change memory material layer 58C is a continuous material layer including a phase change memory material. The thickness of the continuous phase change memory material layer 58C can be in a range from 1 nm to 60 nm, such as from 3 nm to 40 nm and/or from 10 nm to 25 nm, although lesser and greater thicknesses can also be employed. The continuous phase change memory material layer 58C can be formed by chemical vapor deposition or atomic layer deposition. At least a portion of each lateral recess at the levels of the sacrificial material strips 42 is filled with the continuous phase change memory material layer 58C. Each unfilled volume of the laterally-expanded cavities 49" is herein referred to as a memory cavity 49'. Each memory cavity 49' can have a greater lateral extent at levels of the sacrificial material strips 42 than at levels of the insulating strips 32.

Figure 37B:
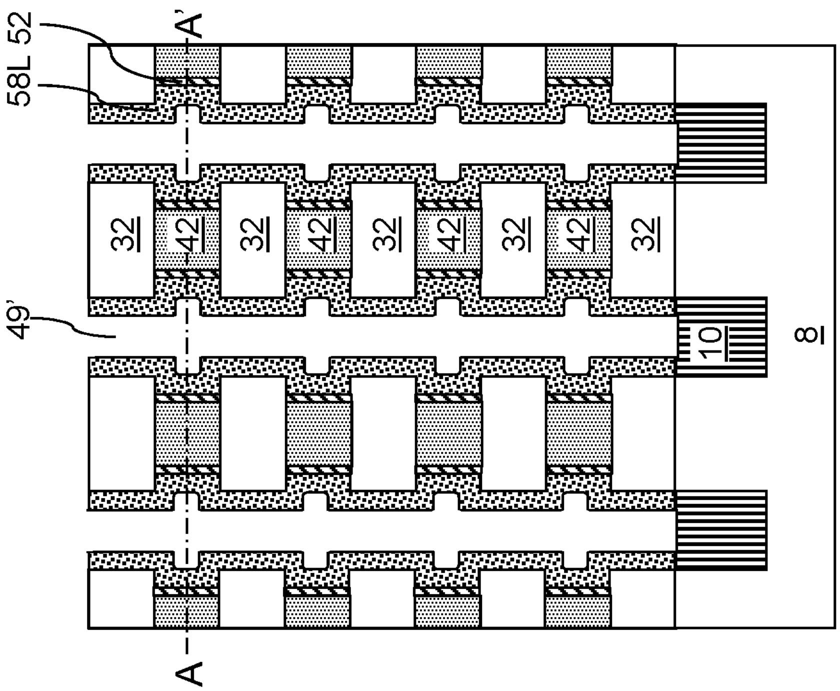
FIG. 37B is a vertical cross-sectional view along the vertical plane B-B' of the first configuration of the second exemplary structure of FIG. 37A. The horizontal plane A-A' is the plane of the horizontal cross-sectional view of FIG. 37A.
Figure 37A:
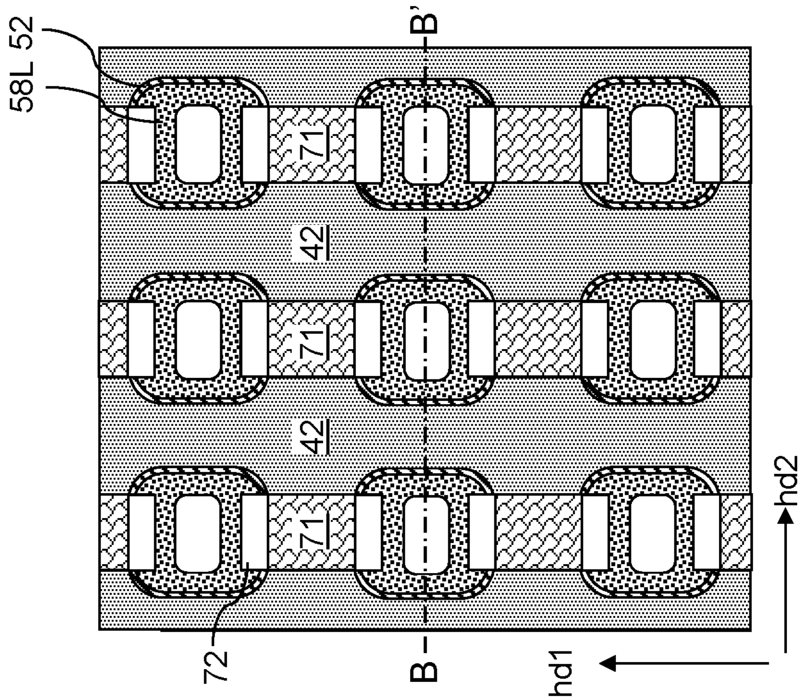
FIG. 37A is a horizontal cross-sectional view of the first configuration of the second exemplary structure after formation of phase change memory material layers by anisotropically etching the continuous phase change memory material layer according to the second embodiment of the present disclosure.

Referring to FIGS. 37A and 37B, the processing steps of FIGS. 18A and 18B can be performed to anisotropically etch horizontal portions of the continuous phase change memory material layer 58C, and if present, the continuous carbon layer. Each remaining vertical portion of the continuous phase change memory material layer 58C constitutes a phase change memory material layer 58L. A top surface of an access node 10 can be physically exposed within each memory cavity 49'.

Figure 38B:
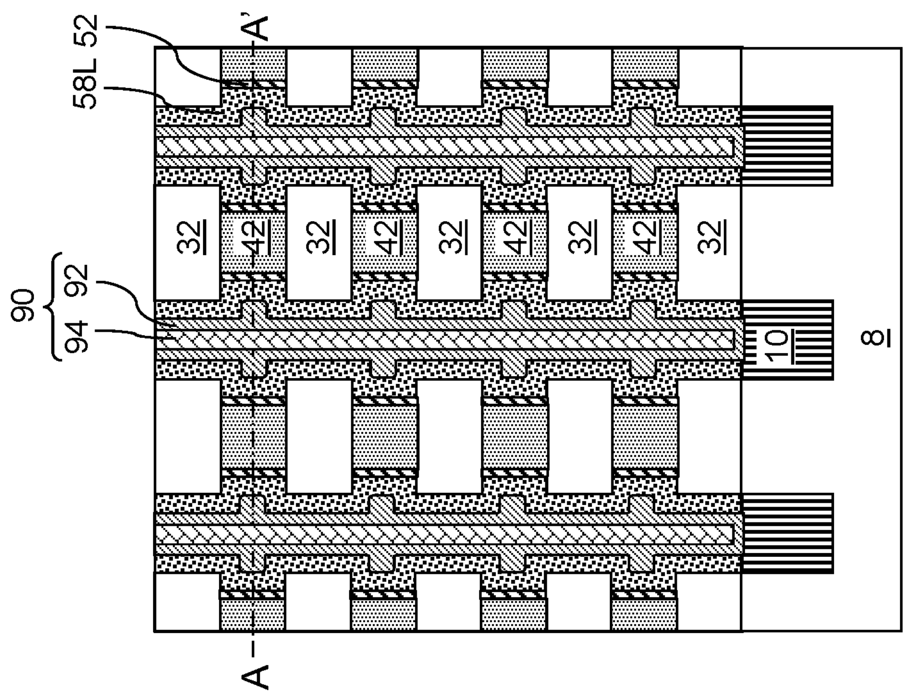
FIG. 38B is a vertical cross-sectional view along the vertical plane B-B' of the first configuration of the second exemplary structure of FIG. 38A. The horizontal plane A-A' is the plane of the horizontal cross-sectional view of FIG. 38A.
Figure 38A:
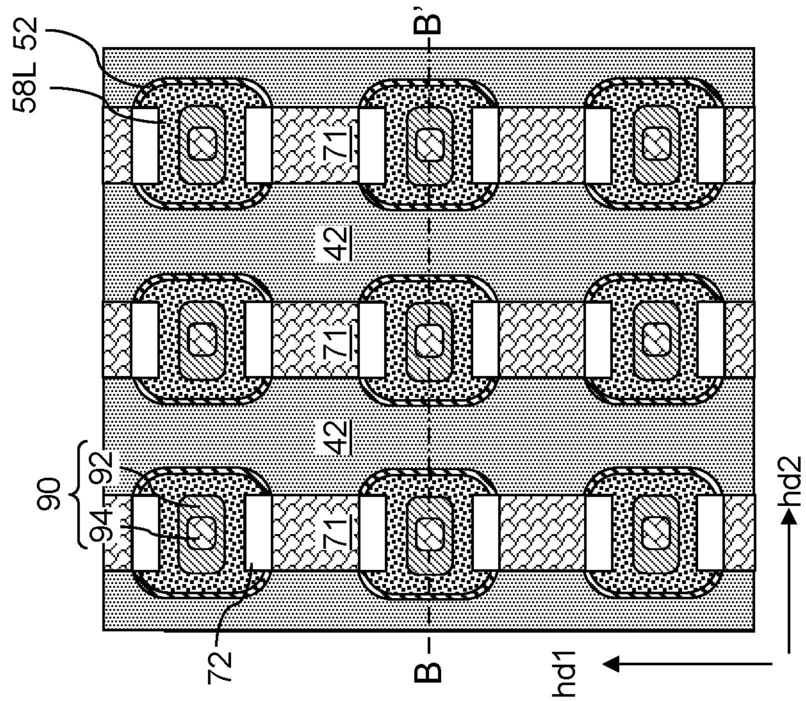
FIG. 38A is a horizontal cross-sectional view of the first configuration of the second exemplary structure after formation of vertical bit lines according to the second embodiment of the present disclosure.

Referring to FIGS. 38A and 38B, the processing steps of FIGS. 19A and 19B can be performed to form vertical bit lines 90 in the memory cavities 49'. Since the memory cavities 49' include the volumes of the pillar cavities 49, the vertical bit lines 90 are formed in a two-dimensional array of pillar cavities 49. Each vertical bit line 90 can include a combination of a metallic liner 92 and a metallic fill material portion 94, and can contact a respective one of the access nodes 10. The sidewall of each vertical bit line 90 can continuously contact an inner sidewall of the respective phase change memory material layer 58L from the level of the bottommost insulating strips 32 to the level of the topmost insulating strips 32. Each vertical bit line 90 vertically extends through each level of the alternating stacks (32, 42), and has a laterally undulating vertical cross-sectional profile.

Figure 39B:
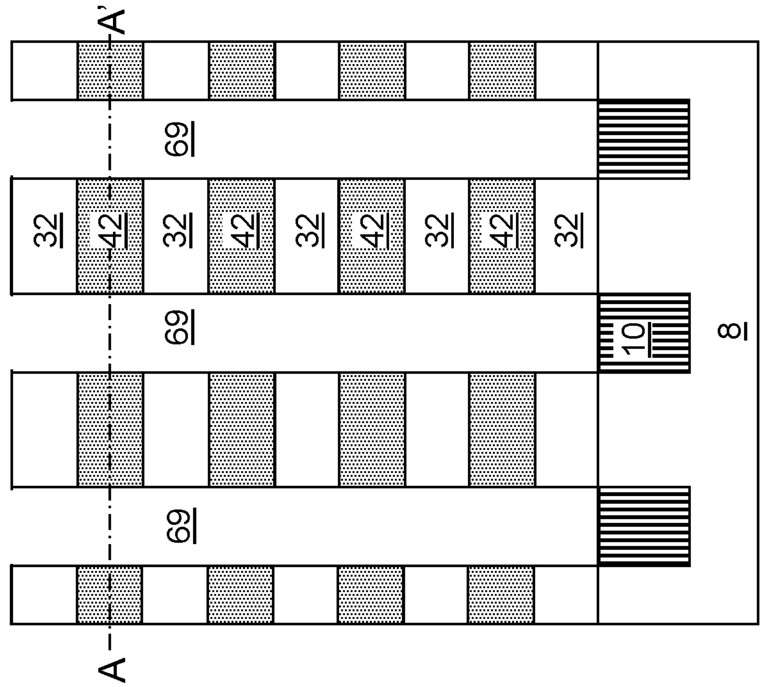
FIG. 39B is a vertical cross-sectional view along the vertical plane B-B' of the first configuration of the second exemplary structure of FIG. 39A. The horizontal plane A-A' is the plane of the horizontal cross-sectional view of FIG. 39A.
Figure 39A:
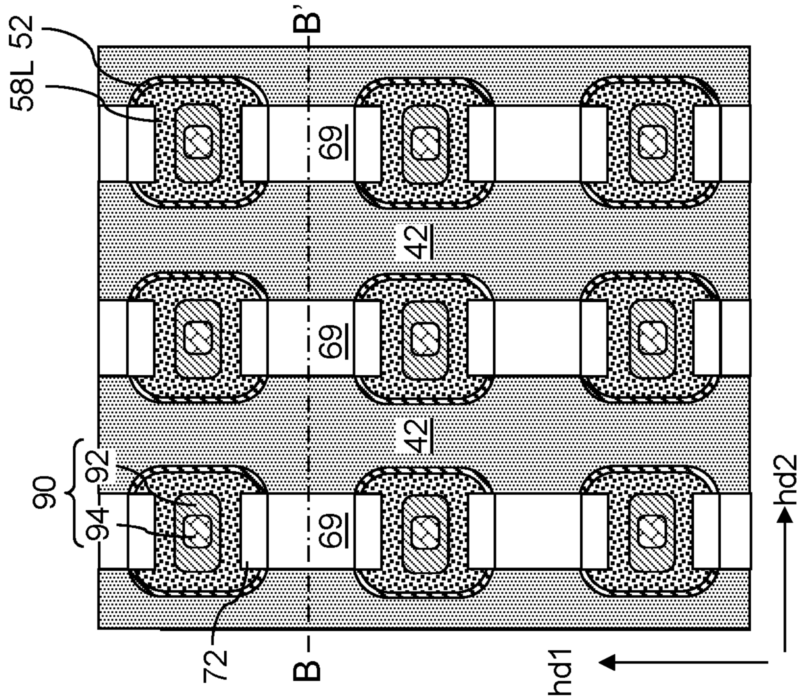
FIG. 39A is a horizontal cross-sectional view of the first configuration of the second exemplary structure after formation of backside openings according to the second embodiment of the present disclosure.

Referring to FIGS. 39A and 39B, backside openings 69 can be formed by removing the sacrificial pillar structures 71 selective to the vertical bit lines 90, the phase change memory material layers 58L, the insulating strips 32, the doped semiconductor oxide pillars 72, and the access nodes 10. For example, if the sacrificial pillar structures 71 include a semiconductor material such as doped silicon, a wet etch process employing trimethyl-2 hydroxyethyl ammonium hydroxide (TMY) or tetramethylammonium hydroxide (TMAH) may be employed to selectively etch the semiconductor material of the sacrificial pillar structures 71. Alternatively, a dry etch process employing gas phase hydrogen chloride may be employed to selectively etch the semiconductor material of the sacrificial pillar structures 71. The voids formed by removal of the sacrificial pillar structures 71 constitute backside openings 69. Sidewalls of the sacrificial material strips 42 are physically exposed around each backside opening 69.

Figure 40B:
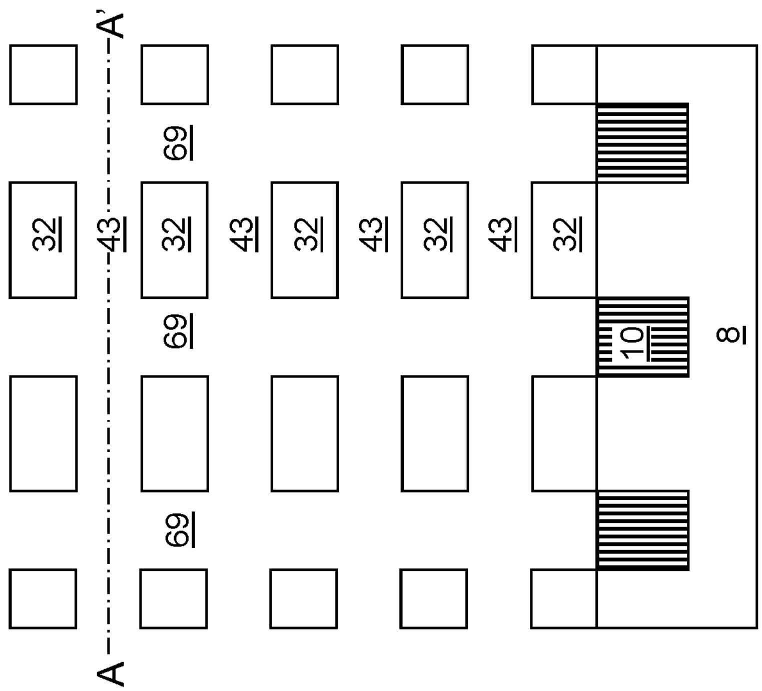
FIG. 40B is a vertical cross-sectional view along the vertical plane B-B' of the first configuration of the second exemplary structure of FIG. 40A. The horizontal plane A-A' is the plane of the horizontal cross-sectional view of FIG. 40A.
Figure 40A:
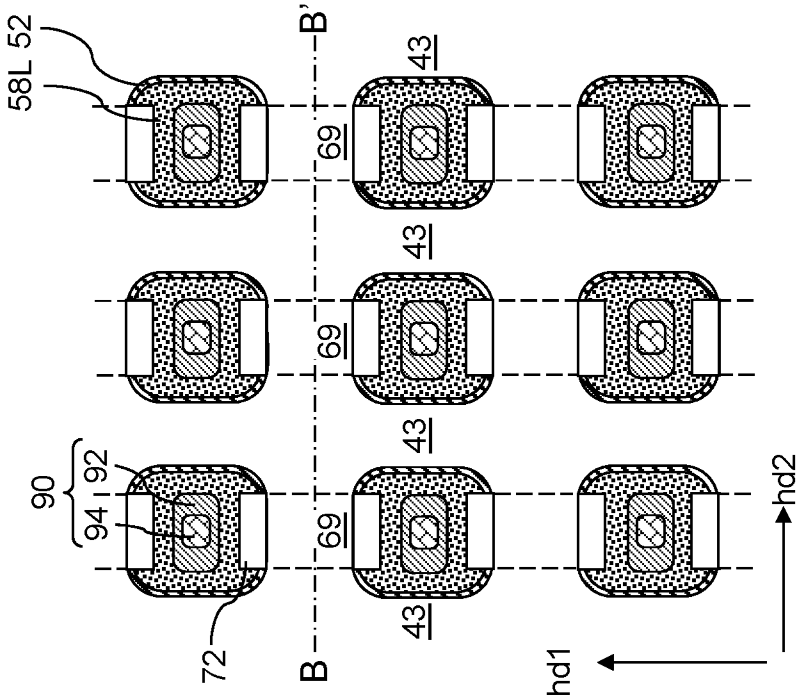
FIG. 40A is a horizontal cross-sectional view of the first configuration of the second exemplary structure after formation of backside cavities according to the second embodiment of the present disclosure.

Referring to FIGS. 40A and 40B, the sacrificial material strips 42 can be removed employing an isotropic etch process. An isotropic etchant that etches the sacrificial material strips 42 selective to the materials of the insulating strips 32, the doped semiconductor oxide pillars 72, the phase change memory material layers 58L, and the vertical bit lines 90 is introduced into the backside openings 69 and etches the sacrificial material strips 42. In case the sacrificial material strips 42 include silicon nitride and the insulating strips 32 include a silicon oxide material, a wet etch employing hot phosphoric acid can be employed to remove the sacrificial material strips 42. The sacrificial material strips 42 can be completely removed, and backside recesses 43 can be formed in volumes from which the sacrificial material strips 42 are removed. Each backside recess 43 is connected to at least one row, such as two rows, of backside openings 69 that are laterally spaced apart along the second horizontal direction hd2.

Figure 41B:
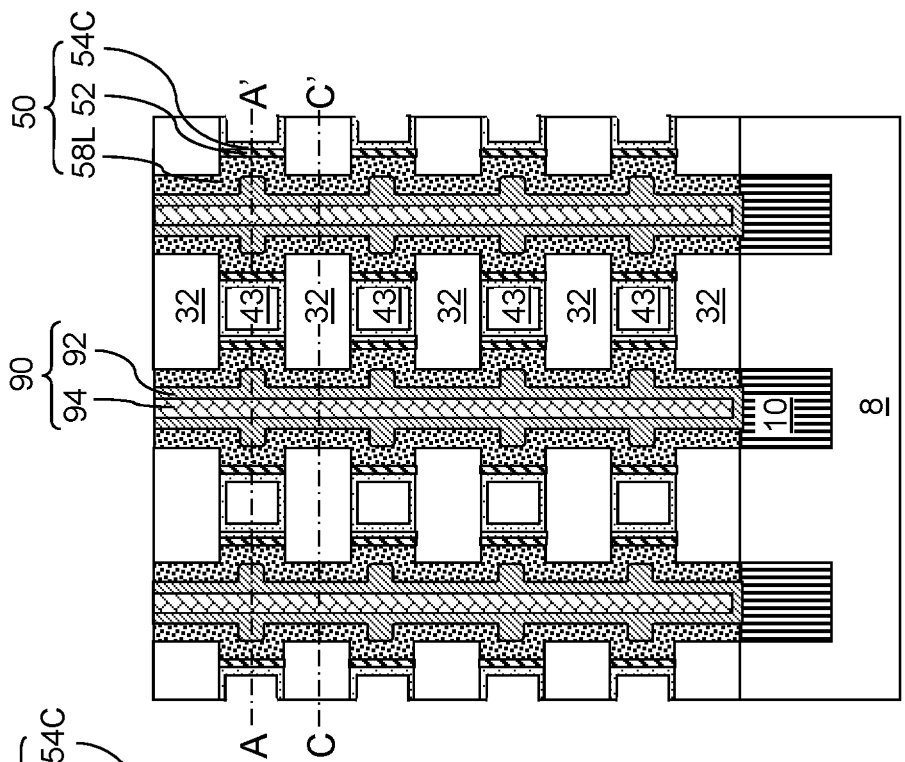
FIG. 41B is a vertical cross-sectional view along the vertical plane B-B' of the first configuration of the second exemplary structure of FIG. 41A. The horizontal plane A-A' is the plane of the horizontal cross-sectional view of FIG. 41A.
Figure 41A:
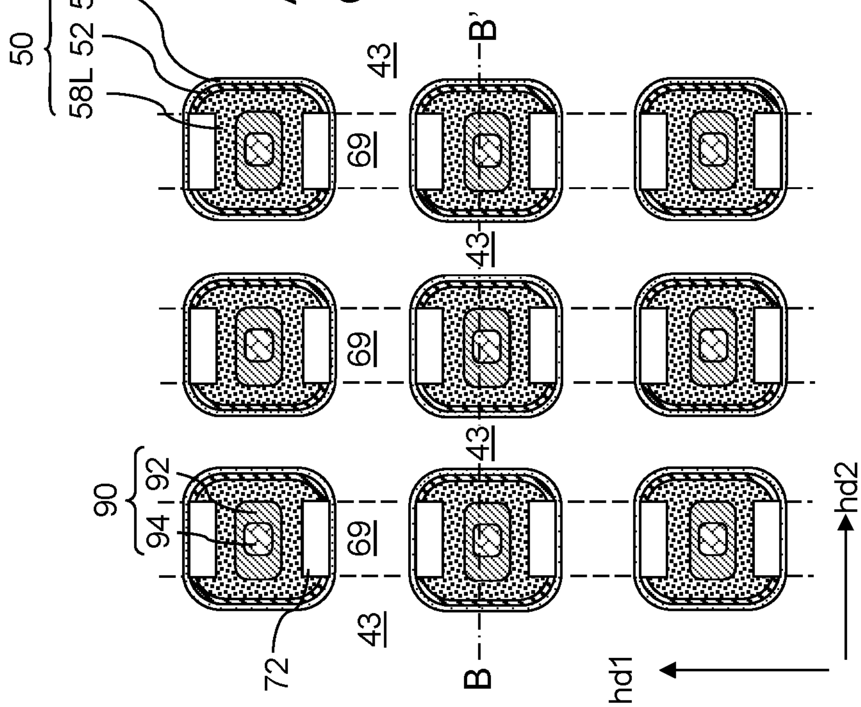
FIG. 41A is a horizontal cross-sectional view of the first configuration of the second exemplary structure after formation of a selector material layer according to the second embodiment of the present disclosure.
Figure 41C:
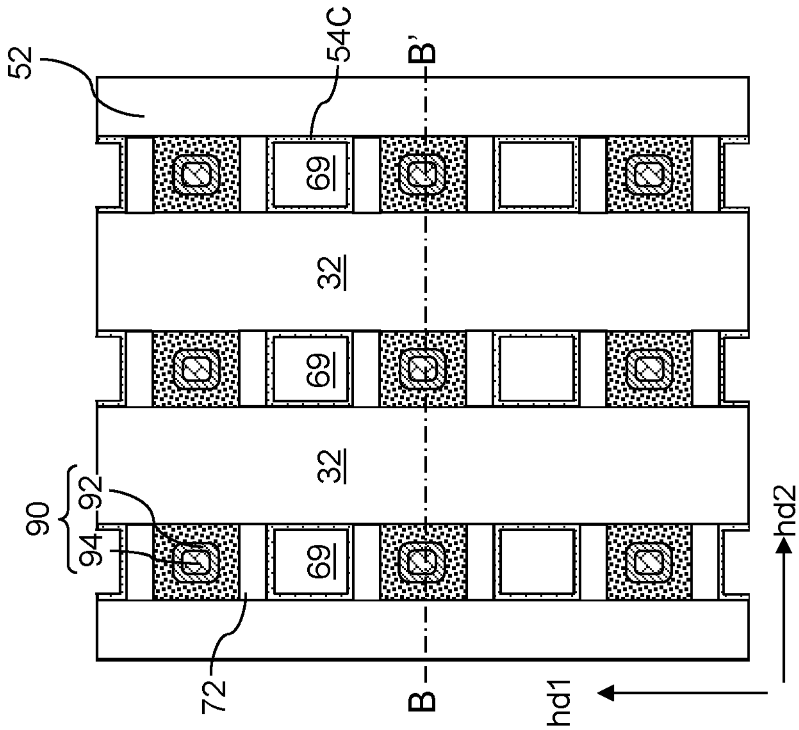
FIG. 41C is a top-down view of the first configuration of the second exemplary structure of FIGS. 41A and 41B.

Referring to FIGS. 41A-41C, a continuous selector material layer 54C can be formed by conformal deposition of a selector material. The continuous selector material layer 54C can include any of the selector materials that can be employed for the discrete selector material portions 54 or the continuous selector material layer 54C of the first embodiment. The continuous selector material layer 54C can be deposited directly all physically exposed surfaces of the second exemplary structure, which include the outer sidewalls of the discrete metal portions 52, sidewalls of the doped semiconductor oxide pillars 72, and sidewalls of the insulating strips 32 around each backside opening 69. In one embodiment, the composition and the thickness of the continuous selector material layer 54C can be selected such that the critical bias voltage magnitude can be in a range from 1 V to 4 V, although lesser and greater voltages can also be employed for the critical bias voltage magnitude. The thickness of the continuous selector material layer 54C can be, for example, in a range from 1 nm to 40 nm, such as from 2 nm to 20 nm, although lesser and greater thicknesses can also be employed.

Each set of a discrete metal portion 52, a portion of the continuous selector material layer 54C contacting the discrete metal portion 52, and a portion of a phase change memory material layer 58L contacting the discrete metal portion 52 constitutes a phase change memory cell 50. In other words, each phase change memory cell 50 includes a discrete metal portion 52, a phase change memory material portion (that is a portion of a phase change memory material layer 58L) contacting the discrete metal portion 52, and a selector material portion that is a portion of the continuous selector material layer 54C contacting the discrete metal portion 52. The phase change memory cells 50 can be formed at each level of the sacrificial material strips 42 at a periphery of each of the pillar cavities 49. Each center region of a pillar cavity 49 is filled with a respective one of the vertical bit lines 90. Each of the discrete metal portions 52 is formed between a phase change memory material portion and a selector material portion within a respective phase change memory cell 50.

Figure 42B:
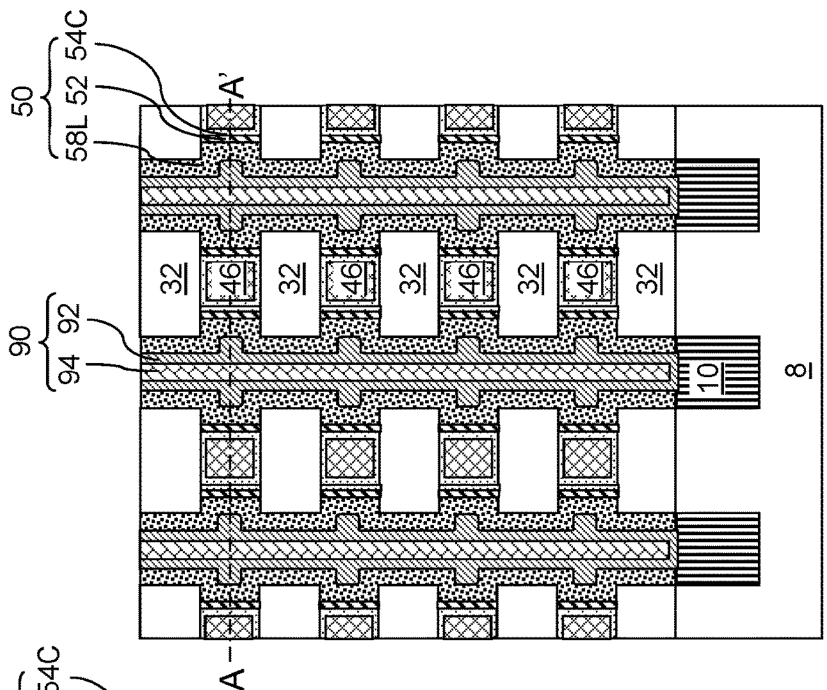
FIG. 42B is a vertical cross-sectional view along the vertical plane B-B' of the first configuration of the second exemplary structure of FIG. 42A. The horizontal plane A-A' is the plane of the horizontal cross-sectional view of FIG. 42A.
Figure 42A:
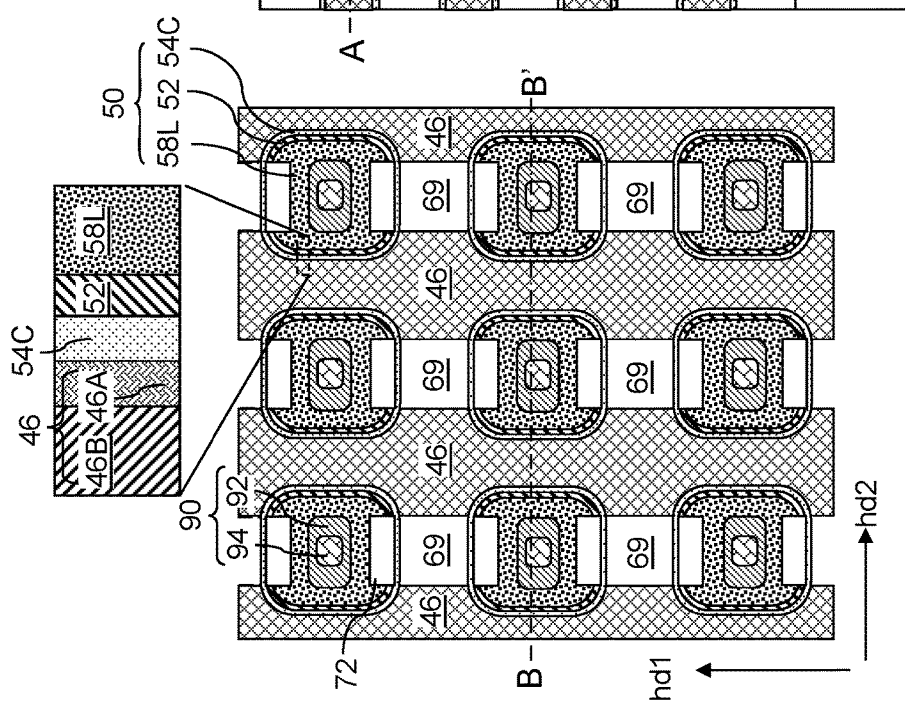
FIG. 42A is a horizontal cross-sectional view of the first configuration of the second exemplary structure after formation of electrically conductive strips according to the second embodiment of the present disclosure.

Referring to FIGS. 42A and 42B, at least one conductive material can be deposited in the backside recesses 43 by at least one conformal deposition process. At least one reactant for depositing the at least one conductive material through the backside openings 69 into the backside cavities 43. For example, the at least one conductive material can include a metallic barrier material such as TaN, TiN, and/or WN and a metallic fill material such as W, Cu, Co, Ru, and/or Mo. Any collaterally deposited conductive material can be removed from inside the backside openings 69 and from above the topmost insulating strips 32, for example, by an anisotropic etch process. Remaining portions of the at least one conductive material in the backside recesses 43 constitute electrically conductive strips 46. Each electrically conductive strip 46 can fill the volume of a respective backside recess 43, and can include a conformal metallic liner 46A (which is a remaining portion of the metallic barrier material) and a metallic fill material portion 46B (which is a remaining portions of the metallic fill material). Thus, remaining portions of the sacrificial material strips 42 after formation of the lateral recesses around the pillar cavities 49 can be replaced with the electrically conductive strips 46. The electrically conductive strips 46 can function as word lines of a three-dimensional memory device including a three-dimensional array of phase memory array cells 50.

Each phase change memory cell 50 is located between a respective pair of a bit line 90 and an electrically conductive strip 46. Each discrete metal portion 52 functions as a middle electrode, and is laterally spaced from a most proximal electrically conductive strip 46 by a respective portion of the continuous selector material layer 54C. Each discrete metal portion 52 may contact a respective phase change memory material layer 58L, or may be laterally spaced from a most proximal phase change memory material layer 58L by a portion of a carbon layer. Each discrete metal portion 52 can laterally contact a respective pair of doped semiconductor oxide pillars 72. The sidewalls of the vertical bit lines 90 can have a laterally undulating profile. Each vertical bit line 90 can have a greater lateral extent at levels of the electrically conductive strips 46 than at levels of the insulating strips 32.

Figure 43B:
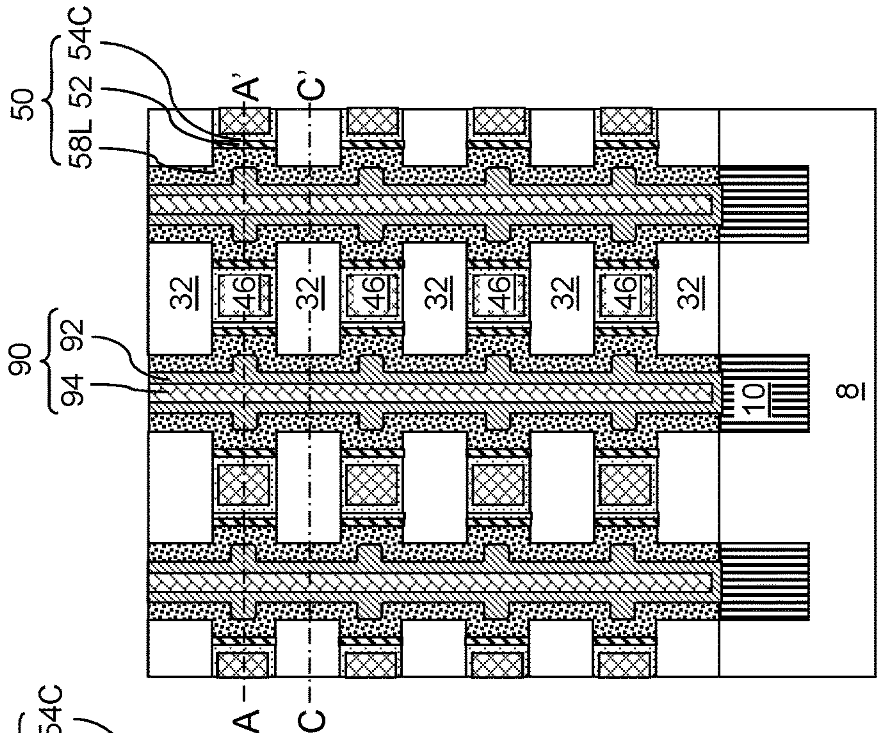
FIG. 43B is a vertical cross-sectional view along the vertical plane B-B' of the first configuration of the second exemplary structure of FIG. 43A. The horizontal plane A-A' is the plane of the horizontal cross-sectional view of FIG. 43A.
Figure 43A:
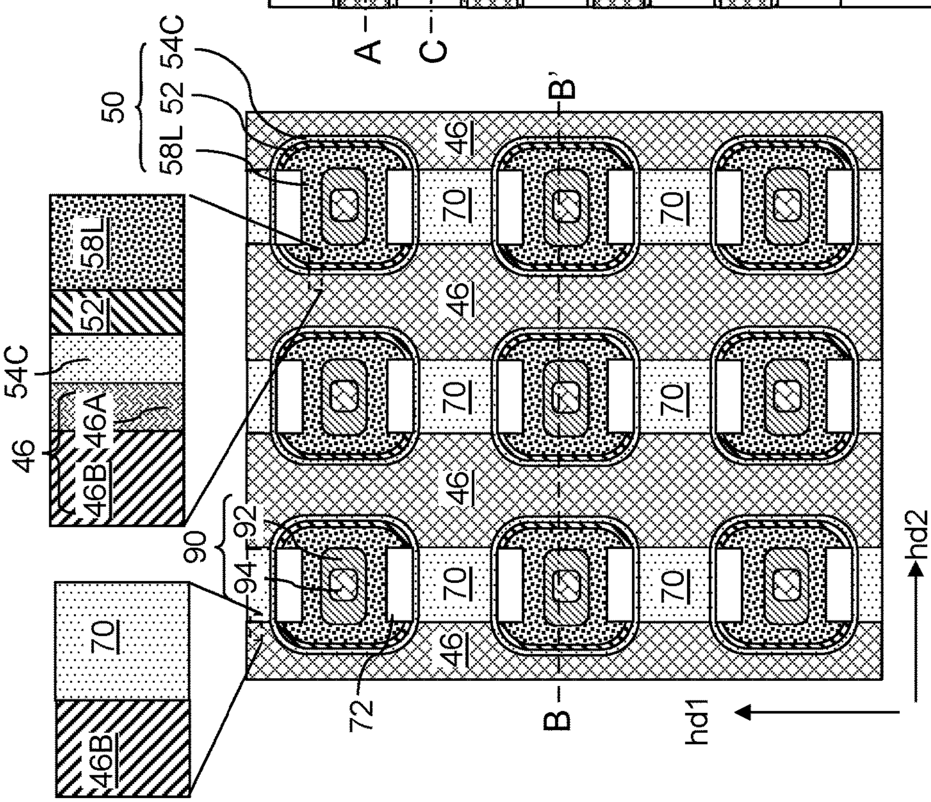
FIG. 43A is a horizontal cross-sectional view of the first configuration of the second exemplary structure after formation of dielectric isolation pillars according to the second embodiment of the present disclosure.
Figure 43C:
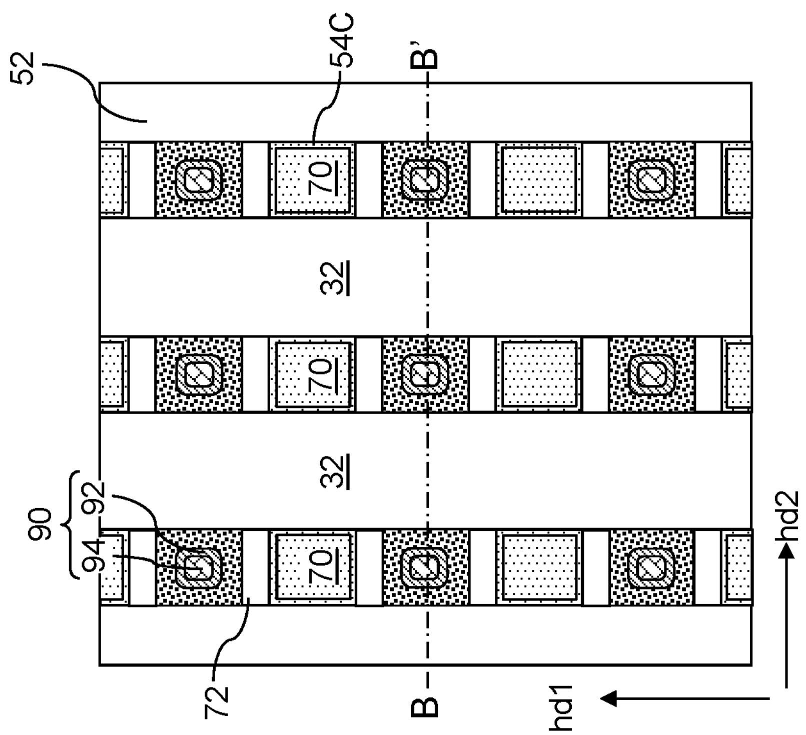
FIG. 43C is a top-down view of the first configuration of the second exemplary structure of FIGS. 43A and 43B.

Referring to FIGS. 43A-43C, a dielectric material such as silicon oxide can be deposited in the backside openings 69. Excess portions of the dielectric material can be removed from above the top surface of the topmost layers within the alternating stacks (32, 46) of the insulating strips 32 and the electrically conductive strips 46 by a planarization process. Dielectric isolation pillars 70 can be formed within the backside openings 69. The dielectric isolation pillars 70 can include a doped silicate glass (such as borosilicate glass, phosphosilicate glass, or borophosphosilicate glass), or can include undoped silicate glass. A reflow anneal and/or a densification anneal may be optionally performed. Each conformal metallic liner 46A can directly contact sidewalls of at least one row, such as two rows, of dielectric isolation pillars 70 formed in at least one, such as two, neighboring line trenches 79. Each metallic fill material portion 46B can directly contact sidewalls of at least one row, such as two rows, of dielectric isolation pillars 70 formed in at least one, such as two, neighboring line trenches 79.

Figure 44B:
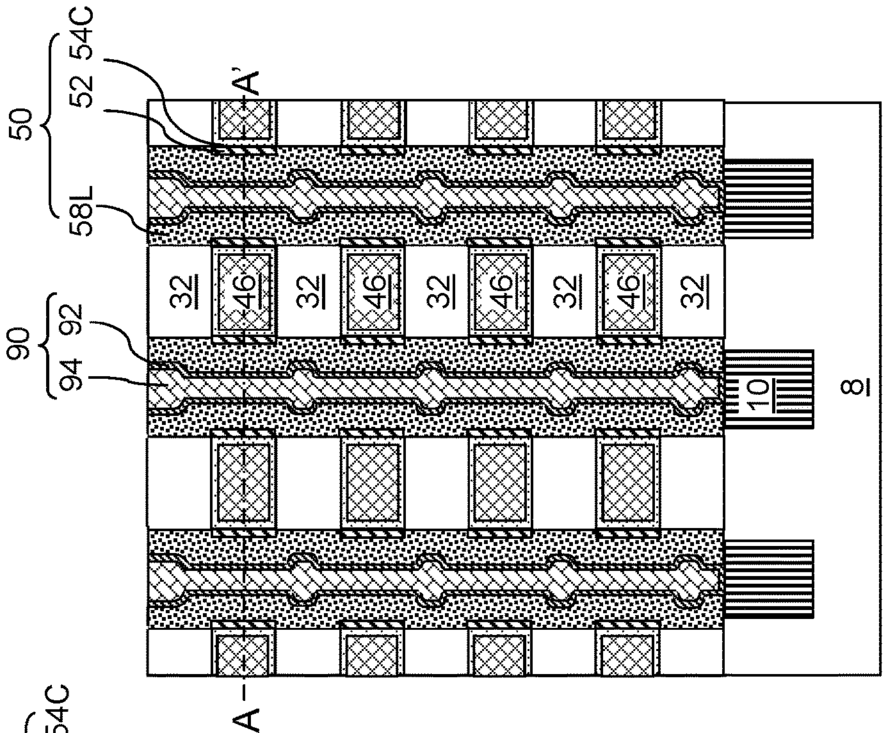
FIG. 44B is a vertical cross-sectional view along the vertical plane B-B' of the third configuration of the second exemplary structure of FIG. 44A. The horizontal plane A-A' is the plane of the horizontal cross-sectional view of FIG. 44A.
Figure 44A:
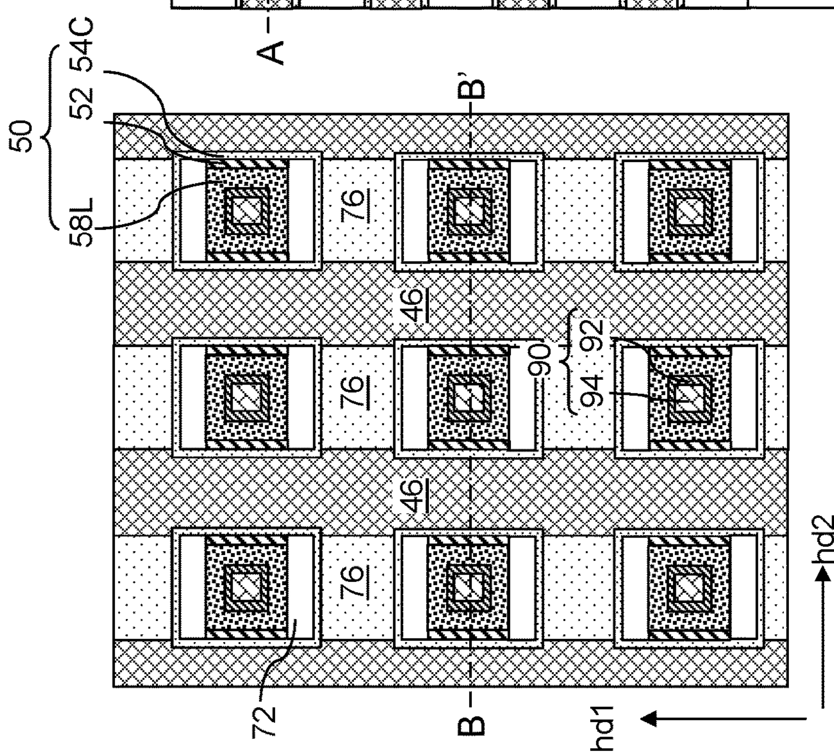
FIG. 44A is a horizontal cross-sectional view of a second configuration of the second exemplary structure after formation of dielectric isolation pillars according to the second embodiment of the present disclosure.

Referring to FIGS. 44A and 44B, a second configuration of the second exemplary structure can be derived from the first configuration of the second exemplary structure by omitting formation of lateral recesses around the pillar cavities 49 at the levels of the sacrificial material strips 42, i.e., by omitting the processing steps of FIGS. 34A and 34B. Subsequently, the processing steps of FIGS. 35A and 35B, 36A and 36B, 37A and 37B, 38A and 38B, 39A and 39B, 40A and 40B, 41A-41C, 42A and 42B, and 43A-43C can be performed. In this case, the discrete metal portions 52 can be formed directly on sidewalls of the sacrificial material strips 42 that are within the same vertical plane as sidewalls of insulating strips 32 within a respective alternating stack (32, 42). Each of the discrete metal portions 52 is formed directly on a respective one of the sacrificial material strips 42.

In the second configuration of the second exemplary structure, each phase change memory material portion is a respective portion within a phase change memory material layer 58L formed at a periphery of a respective one of the pillar cavities 49. Each vertical bit line 90 is formed directly on a respective phase change memory material layer 58L. Each set of a discrete metal portion 52, a portion of the continuous selector material layer 54C contacting the discrete metal portion 52, and a portion of a phase change memory material layer 58L contacting the discrete metal portion 52 constitutes a phase change memory cell 50. The phase change memory cells 50 can be formed at each level of the sacrificial material strips 42 at a periphery of each of the pillar cavities 49. Each center region of a pillar cavity 49 is filled with a respective one of the vertical bit lines 90. Each of the discrete metal portions 52 is formed between a phase change memory material portion and a selector material portion within a respective phase change memory cell 50.

Each phase change memory cell 50 is located between a respective pair of a bit line 90 and an electrically conductive strip 46. Each discrete metal portion 52 functions as a middle electrode, and is laterally spaced from a most proximal electrically conductive strip 46 by a respective portion of the continuous selector material layer 54C. Each discrete metal portion 52 may contact a respective phase change memory material layer 58L, or may be laterally spaced from a most proximal phase change memory material layer 58L by a portion of a carbon layer. Each discrete metal portion 52 can laterally contact a respective pair of doped semiconductor oxide pillars 72. The sidewalls of the vertical bit lines 90 can have a laterally undulating profile. Each vertical bit line 90 can have a greater lateral extent at levels of the insulating strips 32 than at levels of the electrically conductive strips 46.

Figure 45B:
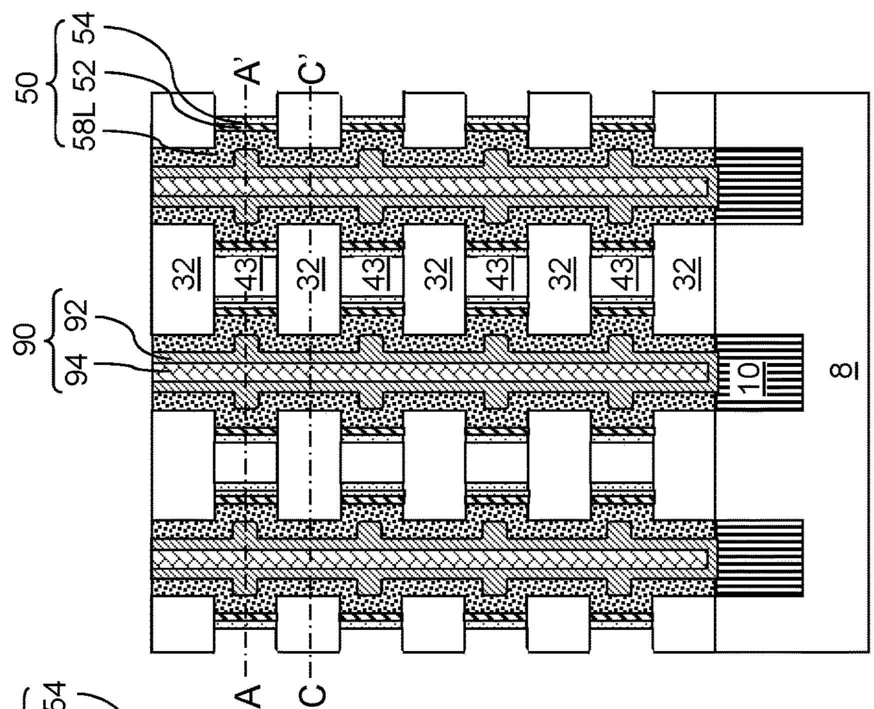
FIG. 45B is a vertical cross-sectional view along the vertical plane B-B' of the third configuration of the second exemplary structure of FIG. 45A. The horizontal plane A-A' is the plane of the horizontal cross-sectional view of FIG. 45A.
Figure 45A:
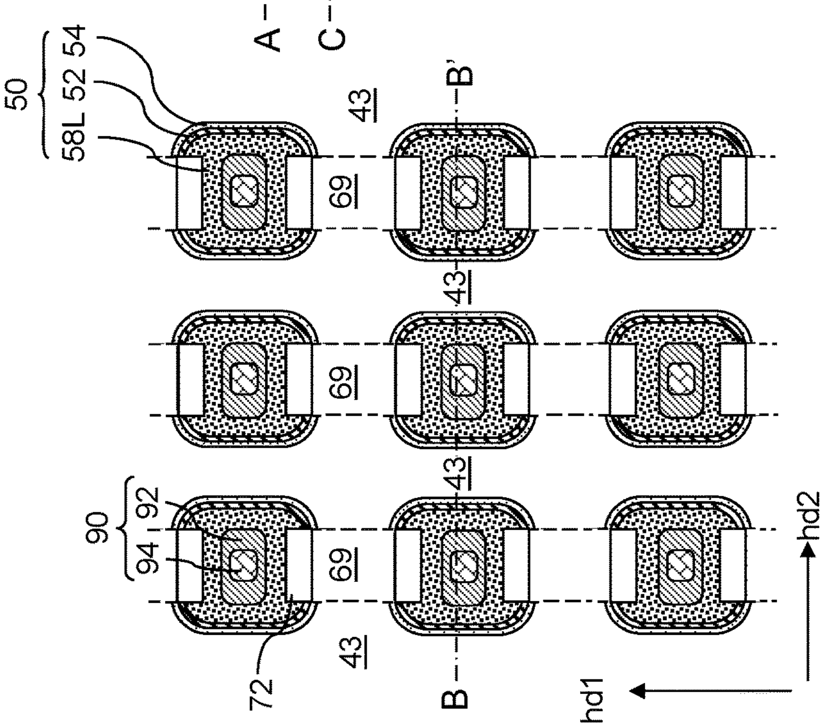
FIG. 45A is a horizontal cross-sectional view of a third configuration of the second exemplary structure after formation of selector material portions according to the second embodiment of the present disclosure.
Figure 45C:
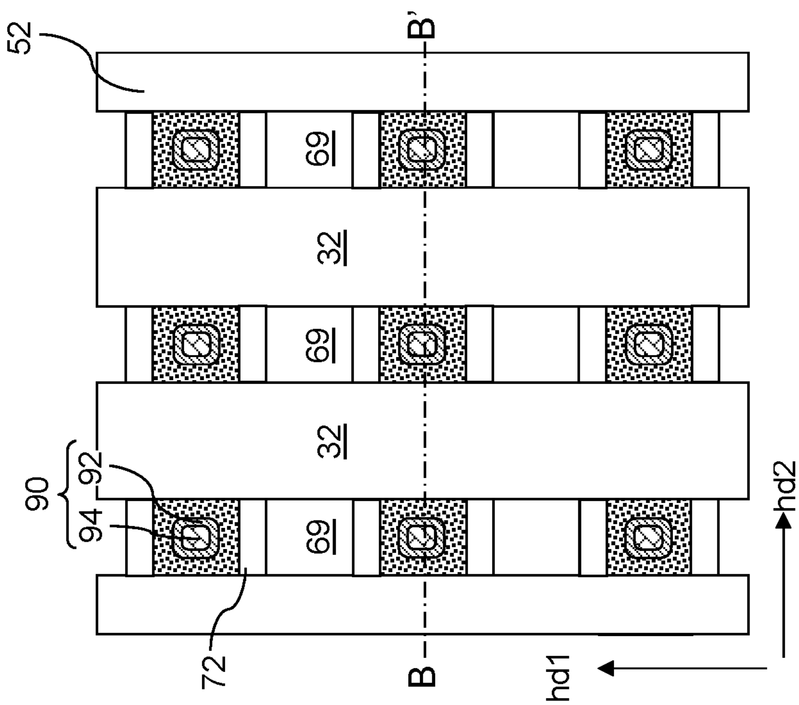
FIG. 45C is a top-down view of the third configuration of the second exemplary structure of FIGS. 45A and 45B.

Referring to FIGS. 45A-45C, a third configuration of the second exemplary structure can be derived from the first configuration of the second exemplary structure illustrated in FIGS. 40A and 40B by selectively depositing a selector material. The chemistry of the selector material deposition process can be selected such that the selector material grows only from the physically exposed surfaces of the discrete metal portions 52 while suppressing growth of the selector material from the surfaces of the insulating strips 32 and the doped semiconductor oxide pillars 72. In one embodiment, methods for selectively depositing a chalcogenide selector material only on metallic surfaces disclosed in C. H. (Kees) de Groot et al. or Sophie L. Benjamin et al. may be employed. Discrete selector material portions 54 can be formed on the outer sidewalls of the discrete metal portions 52. The thickness of the discrete selector material portions 54 can be in a range from 1 nm to 40 nm, such as from 2 nm to 20 nm, although lesser and greater thicknesses can also be employed.

A three-dimensional array of phase change memory cells 50 is formed. Each phase change memory cell 50 includes a discrete metal portion 52, a phase change memory material portion that is a portion of a phase change memory material layer 58L, and a discrete selector material portion 54. Each phase change memory material portion is a respective portion within a phase change memory material layer 58L formed at a periphery of a respective one of the pillar cavities 49. Each vertical bit line 90 is formed directly on a respective phase change memory material layer 58L. Each of the discrete metal portions 52 is formed between a phase change memory material portion and a selector material portion within a respective phase change memory cell 50. Each discrete selector material portion 54 is formed only on a single discrete metal portion 52.

Figure 46B:
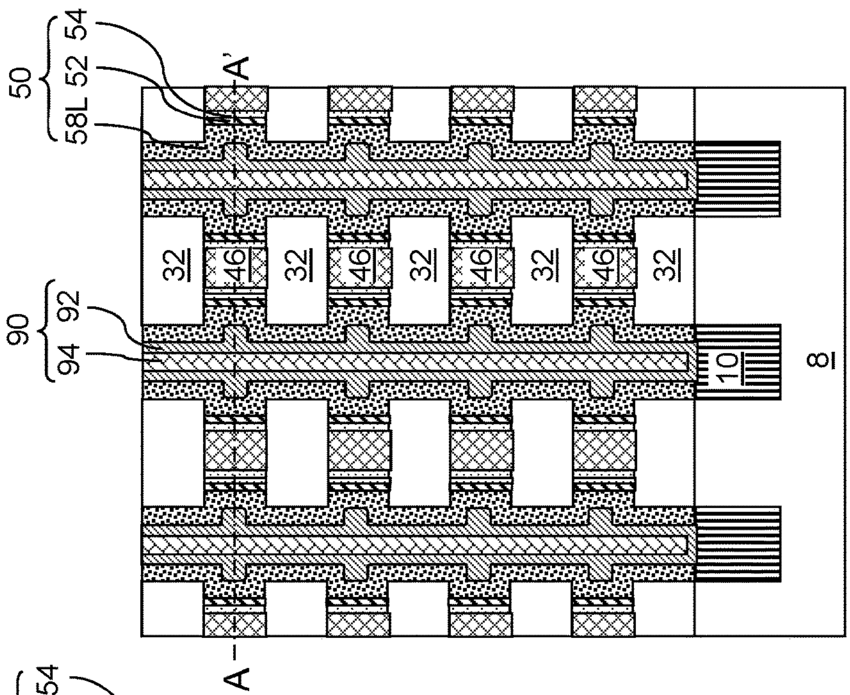
FIG. 46B is a vertical cross-sectional view along the vertical plane B-B' of the third configuration of the second exemplary structure of FIG. 46A. The horizontal plane A-A' is the plane of the horizontal cross-sectional view of FIG. 46A.
Figure 46A:
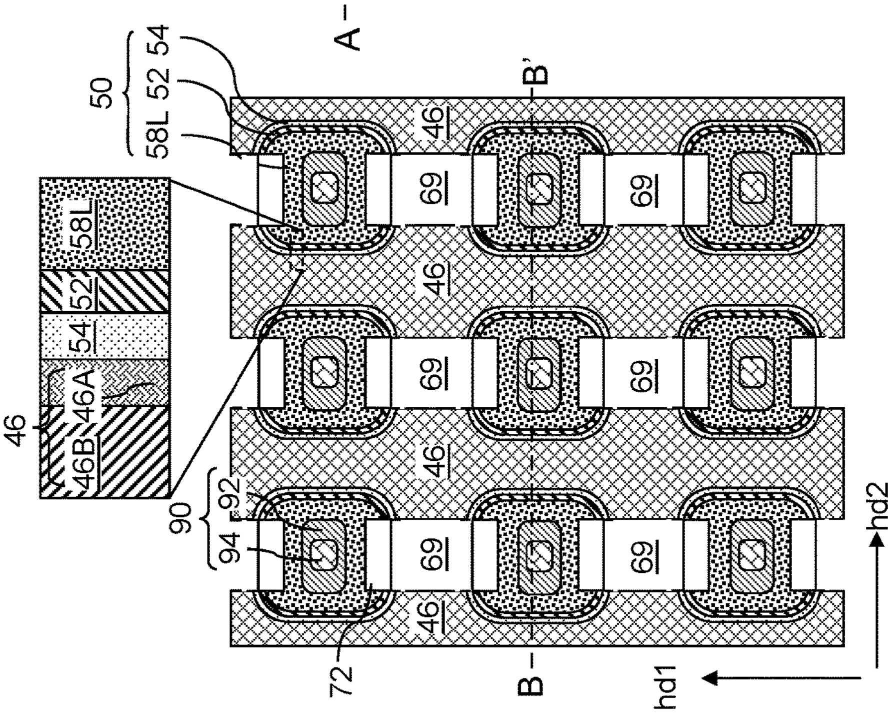
FIG. 46A is a horizontal cross-sectional view of the third configuration of the second exemplary structure after formation of electrically conductive strips according to the second embodiment of the present disclosure.

Referring to FIGS. 46A and 46B, the processing steps of FIGS. 42A and 42B can be performed to form electrically conductive strips 46 within the backside recesses 43. Any collaterally deposited conductive material can be removed from inside the backside openings 69 and from above the topmost insulating strips 32, for example, by an anisotropic etch process. Remaining portions of the at least one conductive material in the backside recesses 43 constitute electrically conductive strips 46. Each electrically conductive strip 46 can fill the volume of a respective backside recess 43, and can include a conformal metallic liner 46A (which is a remaining portion of the metallic barrier material) and a metallic fill material portion 46B (which is a remaining portion of the metallic fill material). The electrically conductive strips 46 can function as word lines of a three-dimensional memory device including a three-dimensional array of phase memory array cells 50.

Figure 47B:
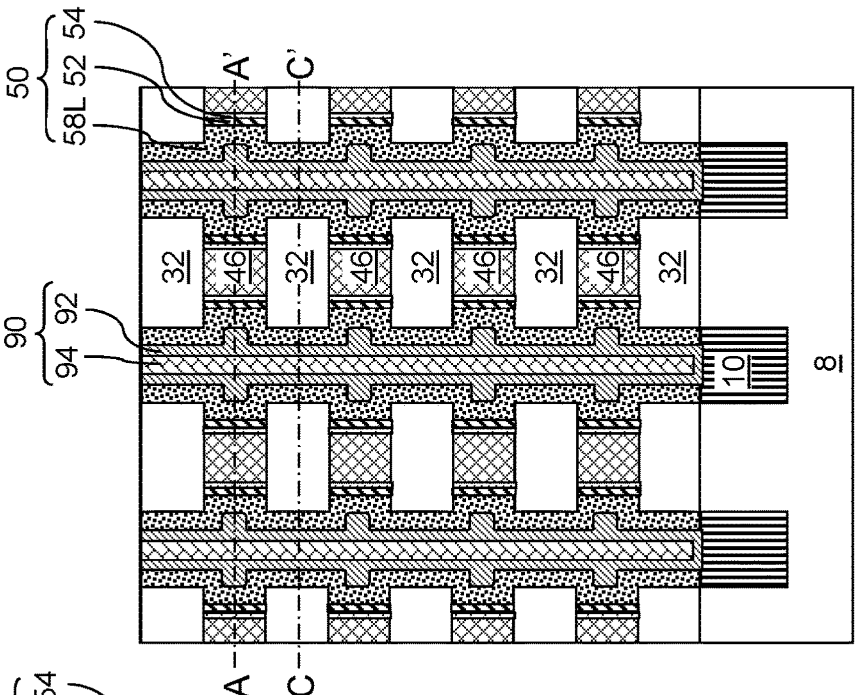
FIG. 47B is a vertical cross-sectional view along the vertical plane B-B' of the third configuration of the second exemplary structure of FIG. 47A. The horizontal plane A-A' is the plane of the horizontal cross-sectional view of FIG. 47A.
Figure 47A:
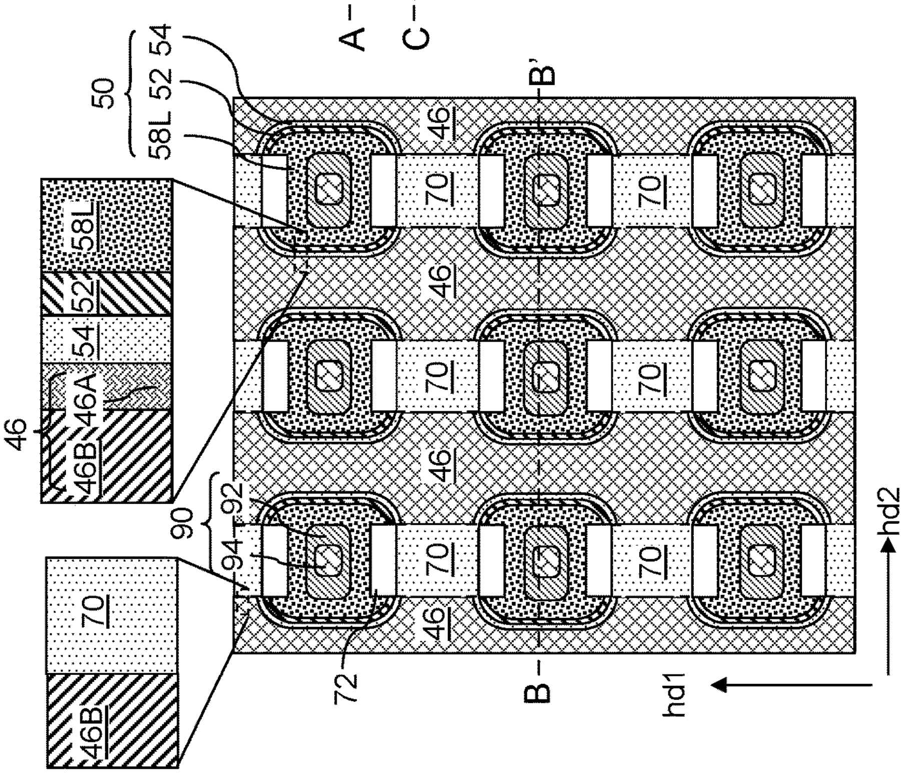
FIG. 47A is a horizontal cross-sectional view of the third configuration of the second exemplary structure after formation of dielectric isolation pillars according to the second embodiment of the present disclosure.
Figure 47C:
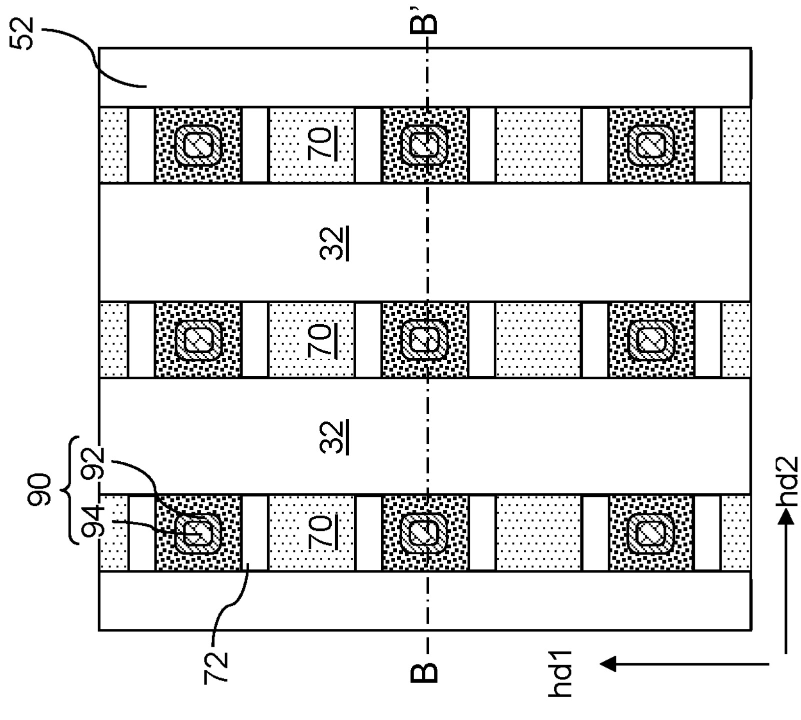
FIG. 47C is a top-down view of the third configuration of the second exemplary structure of FIGS. 47A and 47B.

Referring to FIGS. 47A-47C, the processing steps of FIGS. 43A and 43B can be performed to form dielectric isolation pillars 70 can be formed within the backside openings 69. The dielectric isolation pillars 70 can include a doped silicate glass (such as borosilicate glass, phosphosilicate glass, or borophosphosilicate glass), or can include undoped silicate glass. A reflow anneal and/or a densification anneal may be optionally performed. Each conformal metallic liner 46A can directly contact sidewalls of at least one row, such as two rows, of dielectric isolation pillars 70 formed in at least one, such as two, neighboring line trenches 79. Each metallic fill material portion 46B can directly contact sidewalls of at least one row, such as two rows, of dielectric isolation pillars 70 formed in at least one, such as two, neighboring line trenches 79.

Figure 48B:
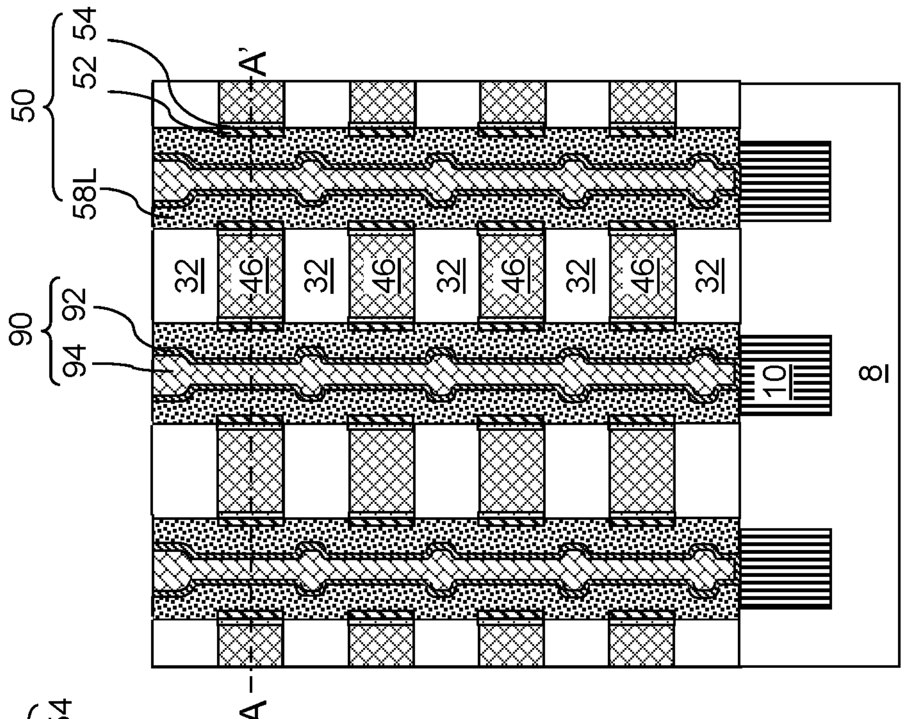
FIG. 48B is a vertical cross-sectional view along the vertical plane B-B' of the fourth configuration of the second exemplary structure of FIG. 48A. The horizontal plane A-A' is the plane of the horizontal cross-sectional view of FIG. 48A.
Figure 48A:
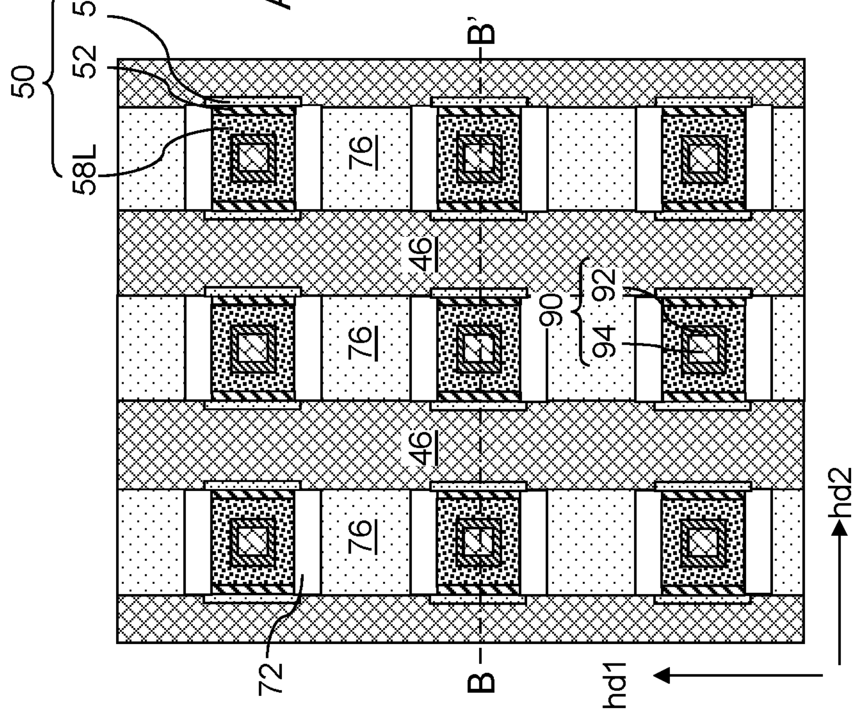
FIG. 48A is a horizontal cross-sectional view of a fourth configuration of the second exemplary structure after formation of dielectric isolation pillars according to the second embodiment of the present disclosure.

Referring to FIGS. 48A and 48B, a fourth configuration of the second exemplary structure can be derived from the third configuration of the second exemplary structure by omitting formation of lateral recesses around the pillar cavities 49 at the levels of the sacrificial material strips 42, i.e., by omitting the processing steps of FIGS. 34A and 34B. In this case, the discrete metal portions 52 can be formed directly on sidewalls of the sacrificial material strips 42 that are within the same vertical plane as sidewalls of insulating strips 32 within a respective alternating stack (32, 42). Each of the discrete metal portions 52 is formed directly on a respective one of the sacrificial material strips 42. Subsequently, the processing steps for forming the third configuration of the second exemplary structure can be performed, which include the processing steps of FIGS. 35A and 35B, 36A and 36B, 37A and 37B, 38A and 38B, 39A and 39B, 40A and 40B, the processing steps for forming the discrete selector material portions 54 of the third configuration of the second exemplary structure, and the processing steps of FIGS. 42A and 42B, and 43A-43C.

In the fourth configuration of the second exemplary structure, each phase change memory material portion is a respective portion within a phase change memory material layer 58L formed at a periphery of a respective one of the pillar cavities 49. Each vertical bit line 90 is formed directly on a respective phase change memory material layer 58L. Each set of a discrete metal portion 52, a discrete selector material portion 54 contacting the discrete metal portion 52, and a portion of a phase change memory material layer 58L contacting the discrete metal portion 52 constitutes a phase change memory cell 50. The phase change memory cells 50 can be formed at each level of the sacrificial material strips 42 at a periphery of each of the pillar cavities 49. Each center region of a pillar cavity 49 is filled with a respective one of the vertical bit lines 90. Each of the discrete metal portions 52 is formed between a phase change memory material portion and a discrete selector material portion 54 within a respective phase change memory cell 50.

Each phase change memory cell 50 is located between a respective pair of a bit line 90 and an electrically conductive strip 46. Each discrete metal portion 52 functions as a middle electrode, and is laterally spaced from a most proximal electrically conductive strip 46 by a respective selector material portion 54. Each discrete metal portion 52 may contact a respective phase change memory material layer 58L, or may be laterally spaced from a most proximal phase change memory material layer 58L by a portion of a carbon layer. Each discrete metal portion 52 can laterally contact a respective pair of doped semiconductor oxide pillars 72. The sidewalls of the vertical bit lines 90 can have a laterally undulating profile. Each vertical bit line 90 can have a greater lateral extent at levels of the insulating strips 32 than at levels of the electrically conductive strips 46.

Figure 49B:
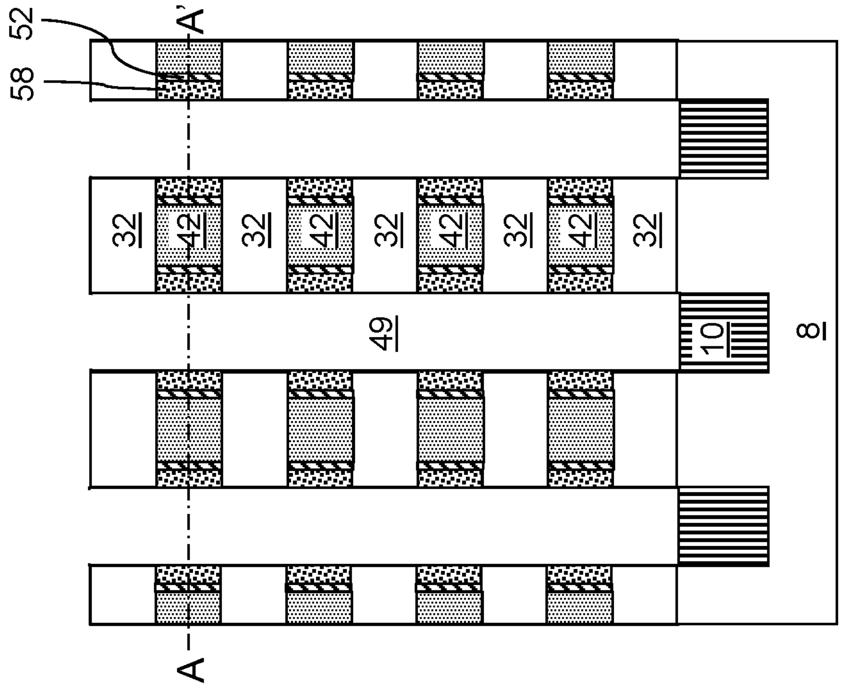
FIG. 49B is a vertical cross-sectional view along the vertical plane B-B' of the fifth configuration of the second exemplary structure of FIG. 48A. The horizontal plane A-A' is the plane of the horizontal cross-sectional view of FIG. 48A.
Figure 49A:
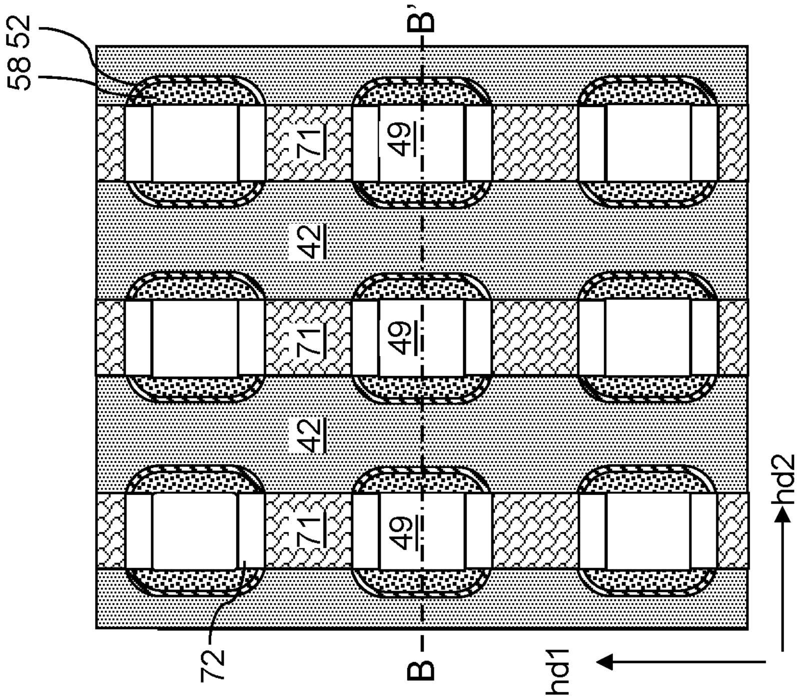
FIG. 49A is a horizontal cross-sectional view of a fifth configuration of the second exemplary structure after formation of discrete phase change memory material portions according to the second embodiment of the present disclosure.

Referring to FIGS. 49A and 49B, a fifth configuration of the second exemplary structure can be derived from the first exemplary structure of FIGS. 36A and 36B by anisotropically removing portions of the continuous phase change memory material layer 58C and the optional continuous carbon layer (if present) that are not located inside recess regions at the levels of the sacrificial material strips 42. An anisotropic etch process that etches the materials of the continuous phase change memory material layer 58C and the optional continuous carbon layer selective to the materials of the insulating strips 32, the doped semiconductor oxide pillars 72, and the sacrificial pillar structures 71 can be employed. Horizontal portions of the continuous phase change memory material layer 58C and the optional continuous carbon layer located above the alternating stacks (32, 42) and at bottom portions of the pillar cavities 49 can be removed by the anisotropic etch process. Further, portions of the continuous phase change memory material layer 58C and the optional continuous carbon layer that are located within volumes of the pillar cavities 49 as provided at the processing steps of FIGS. 33A and 33B can be removed. Each remaining portion of the continuous phase change memory material layer 58C constitutes a discrete phase change memory material portion 58. Each remaining portion of the continuous carbon layer constitutes a discrete carbon portion. Generally, portions of the continuous phase change memory material layer 58C can be etched back from volumes of the pillar cavities 49 employing an etch back process. In this case, the phase change memory material portions of a three-dimensional phase change memory device comprise discrete remaining phase change memory material portions after the etch back process.

Figure 50B:
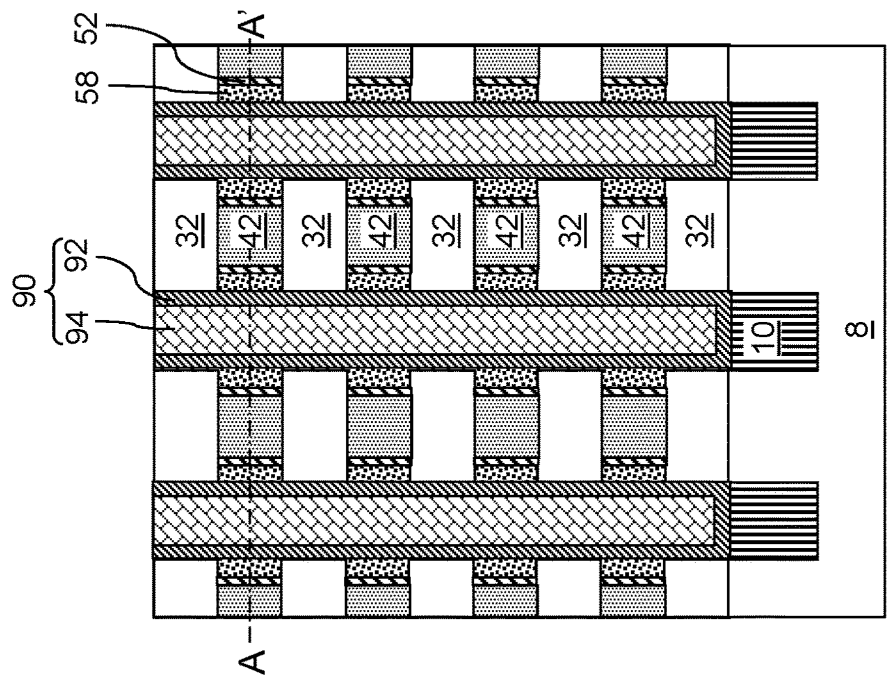
FIG. 50B is a vertical cross-sectional view along the vertical plane B-B' of the fifth configuration of the second exemplary structure of FIG. 50A. The horizontal plane A-A' is the plane of the horizontal cross-sectional view of FIG. 50A.
Figure 50A:
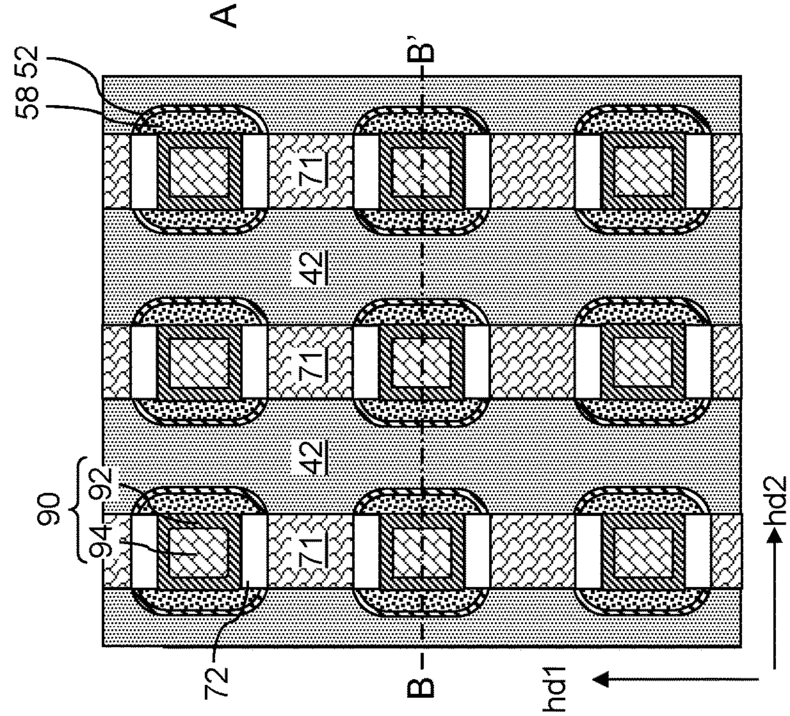
FIG. 50A is a horizontal cross-sectional view of the fifth configuration of the second exemplary structure after formation of vertical bit lines according to the second embodiment of the present disclosure.

Referring to FIGS. 50A and 50B, the processing steps of FIGS. 38A and 38B can be performed to form vertical bit lines 90. Each bit line 90 can include a metallic liner 92 and a metallic fill material portion 94.

Figure 51B:
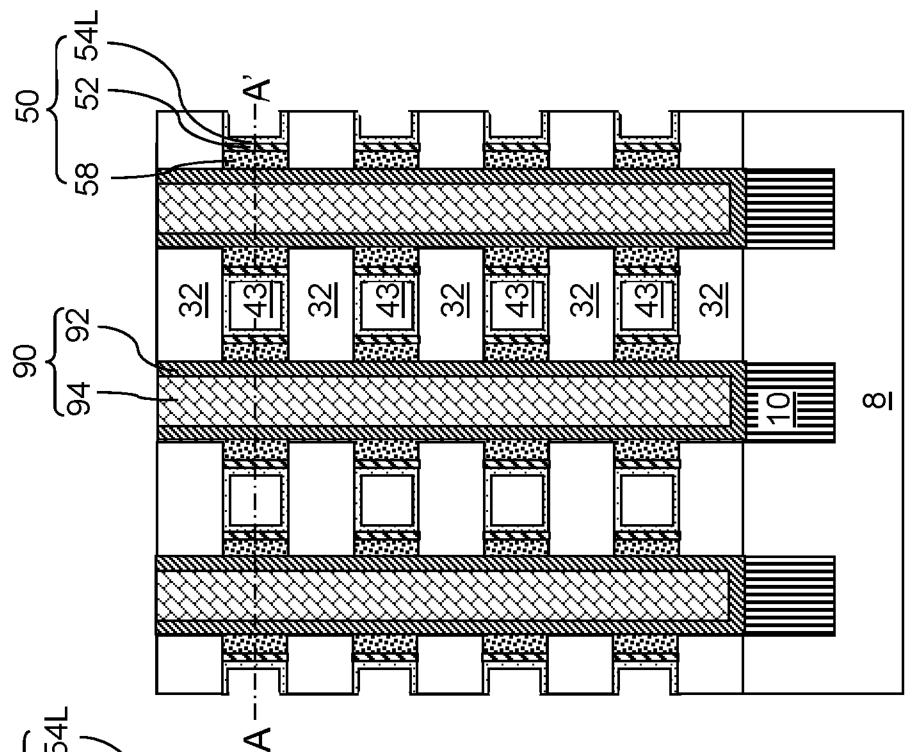
FIG. 51B is a vertical cross-sectional view along the vertical plane B-B' of the fifth configuration of the second exemplary structure of FIG. 51A. The horizontal plane A-A' is the plane of the horizontal cross-sectional view of FIG. 51A.
Figure 51A:
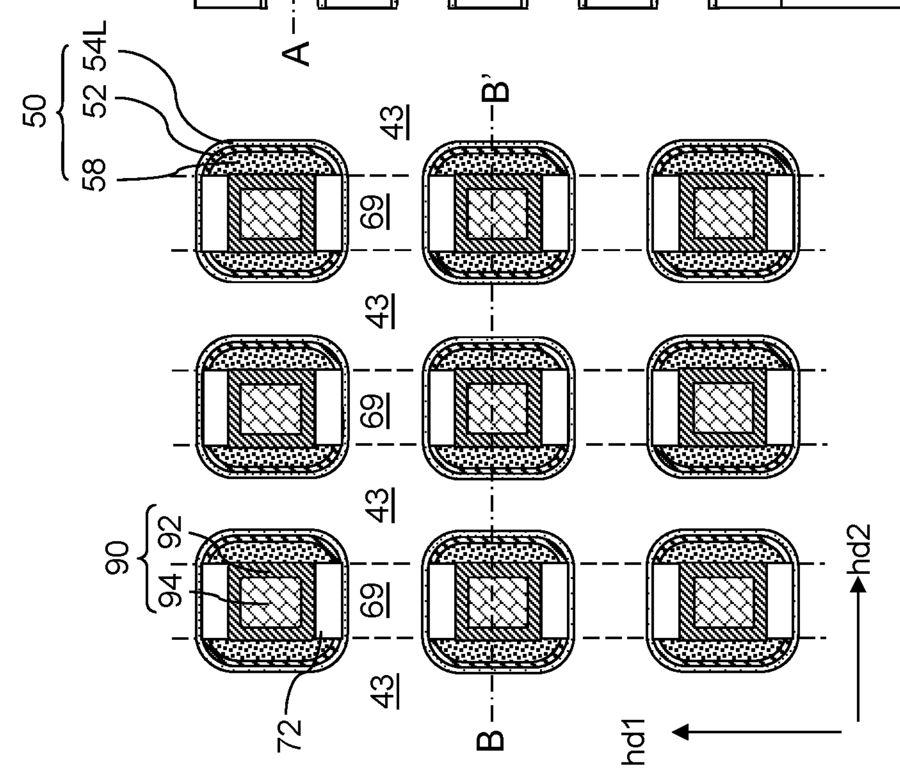
FIG. 51A is a horizontal cross-sectional view of the fifth configuration of the second exemplary structure after formation of backside openings, backside cavities, and a selector material layer according to the second embodiment of the present disclosure.
Figure 51C:
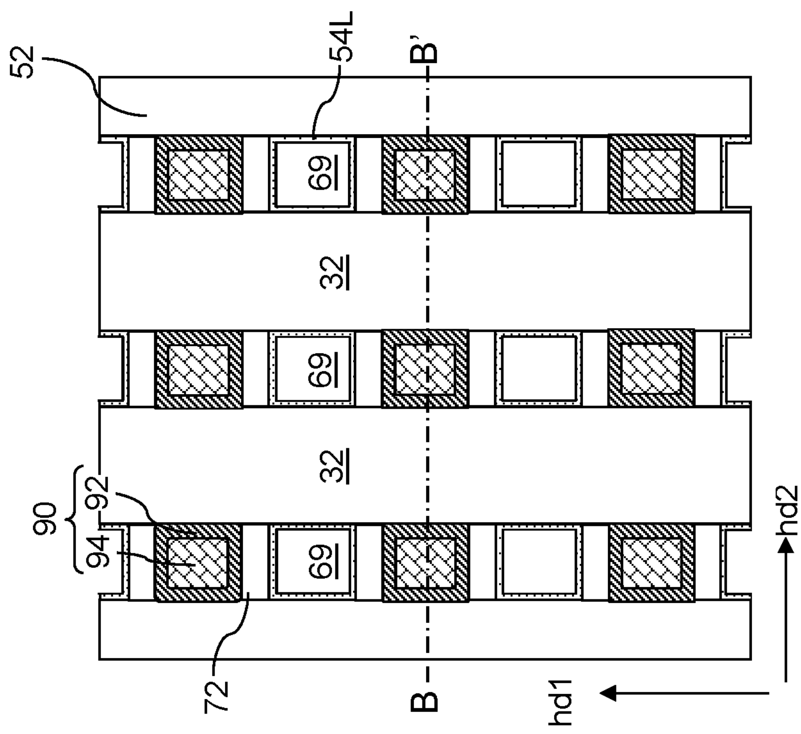
FIG. 51C is a top-down view of the fifth configuration of the second exemplary structure of FIGS. 51A and 51B.

Referring to FIGS. 51A-51C, the processing steps of FIGS. 39A and 39B can be performed to remove the sacrificial pillar structures 71 selective to the doped semiconductor oxide pillars 72, the phase change memory material layers 58L, the bit lines 90, and the insulating strips 32. Backside openings 69 are formed in volumes from which the sacrificial pillar structures 71 are removed.

Subsequently, the processing steps of FIGS. 40A and 40B can be performed to remove the sacrificial material strips 42 selective to the doped semiconductor oxide pillars 72, the phase change memory material layers 58L, the bit lines 90, and the insulating strips 32. Backside recesses 43 are formed in volumes from which the sacrificial material strips 42 are removed.

The processing steps of FIGS. 41A-41C can be performed to form a continuous selector material layer 54C. A conformal deposition process that deposits a selector material on all physically exposed surfaces of the second exemplary structure may be employed. The continuous selector material layer 54C can include any of the selector materials that can be employed for the discrete selector material portions 54 or the continuous selector material layer 54C of the first embodiment. In one embodiment, the composition and the thickness of the continuous selector material layer 54C can be selected such that the critical bias voltage magnitude can be in a range from 1 V to 4 V, although lesser and greater voltages can also be employed for the critical bias voltage magnitude. The thickness of the continuous selector material layer 54C can be, for example, in a range from 1 nm to 40 nm, such as from 2 nm to 20 nm, although lesser and greater thicknesses can also be employed.

The processing steps FIGS. 42A and 42B can be performed to form electrically conductive strips 46 in remaining volumes of the backside recesses 43. Collaterally deposited portions of the at least one conducive material of the electrically conductive strips 46 can be removed from inside each backside opening 69, for example, by an anisotropic etch process.

A three-dimensional array of phase change memory cells 50 is thus provided. Each phase change memory cell 50 includes a discrete metal portion 52, a discrete phase change memory material portion 58 contacting the discrete metal portion 52, and a selector material portion that is a portion of the continuous selector material layer 54C contacting the discrete metal portion 52. The phase change memory cells 50 can be formed at each level of the sacrificial material strips 42 at a periphery of each of the pillar cavities 49. Each center region of a pillar cavity 49 is filled with a respective one of the vertical bit lines 90. Each of the discrete metal portions 52 is formed between a phase change memory material portion and a selector material portion within a respective phase change memory cell 50. Two vertical stacks of phase change memory cells 50 can be formed at a periphery of each of the pillar cavities 49. Each phase change memory cell 50 can be formed on a respective electrically conductive strip 46 around a respective pillar cavity 49 among the two-dimensional array of pillar cavities 42.

In the fifth configuration of the second exemplary structure, the continuous selector material layer 54L is formed directly on outer sidewalls of the discrete metal portions 52. Each of the discrete carbon portions, if present, is formed directly on an inner sidewall of a respective one of the discrete metal portions 52. Each of the discrete phase change memory material portion 58 is formed directly on an inner sidewall of a respective one of the discrete carbon portions (if present), or directly on an inner sidewall of a respective one of the discrete metal portions 52. Each of the discrete metal portions 52, the discrete carbon portions (if present), and the discrete phase change memory material portions 58 can have a vertical planar outer sidewall segment and a pair of vertical convex outer sidewall segments. Each of the discrete metal portions 52 and the discrete carbon portions can have a vertical planar inner sidewall segment and a pair of vertical convex inner sidewall segments. An inner sidewall of each phase change memory material portion 58 can be vertically coincident with sidewalls of overlying insulating strips 32 and underlying insulating strips 32. As used herein, a first surface and a second surface are vertically coincident if the second surface underlies or overlies the first surface and if there exists a vertical plane including the first surface and the second surface.

Figure 52B:
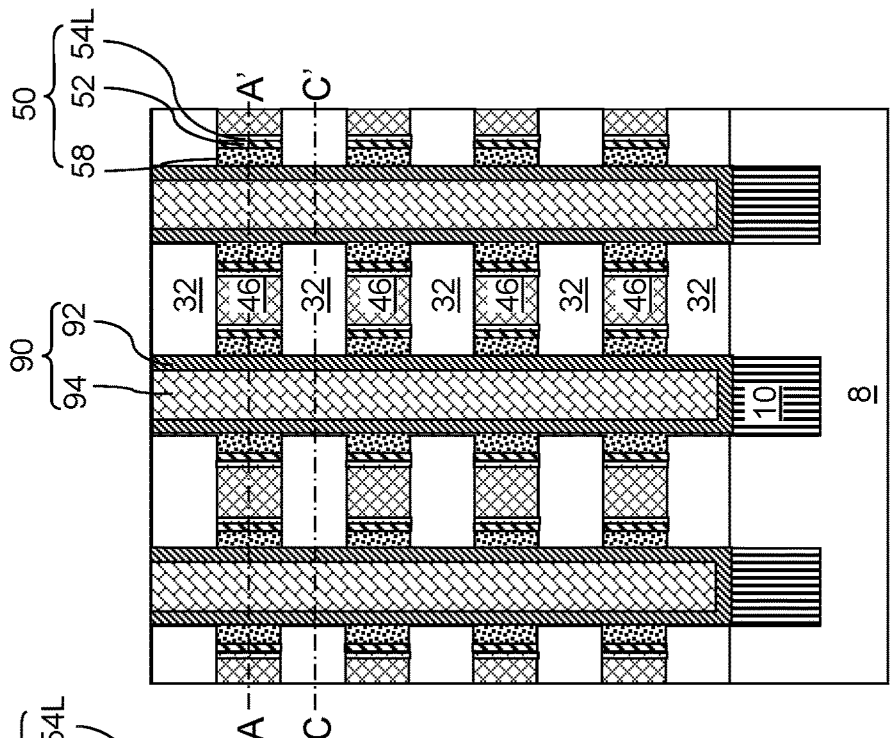
FIG. 52B is a vertical cross-sectional view along the vertical plane B-B' of the fifth configuration of the second exemplary structure of FIG. 52A. The horizontal plane A-A' is the plane of the horizontal cross-sectional view of FIG. 52A.
Figure 52A:
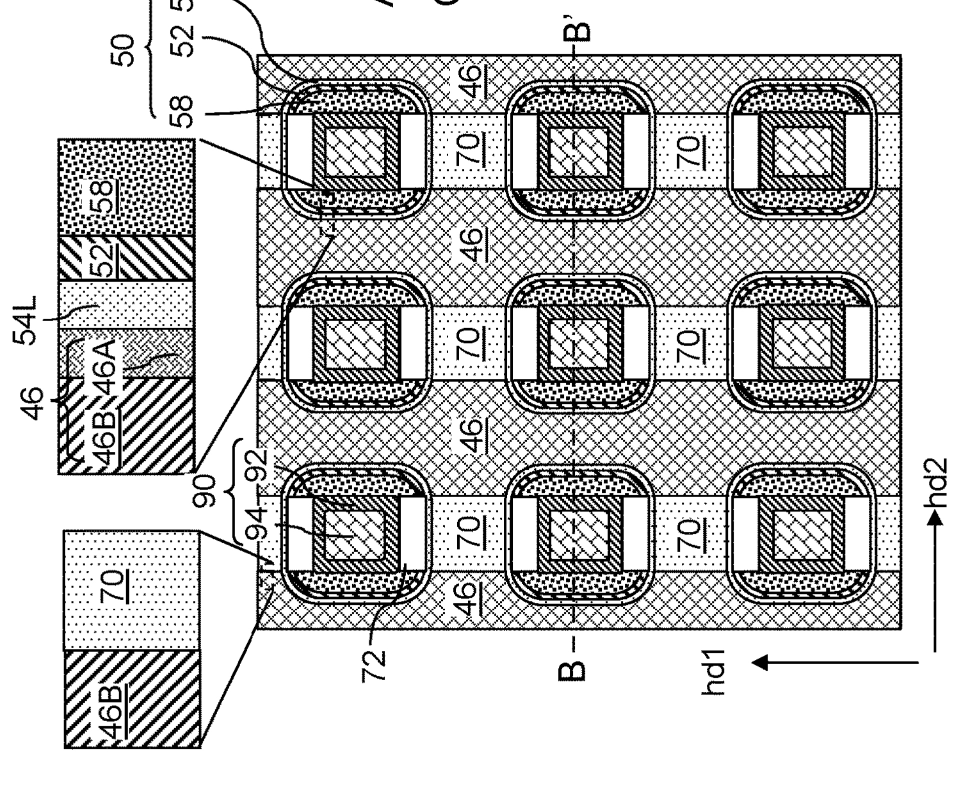
FIG. 52A is a horizontal cross-sectional view of the fifth configuration of the second exemplary structure after formation of electrically conductive strips according to the second embodiment of the present disclosure.
Figure 52C:
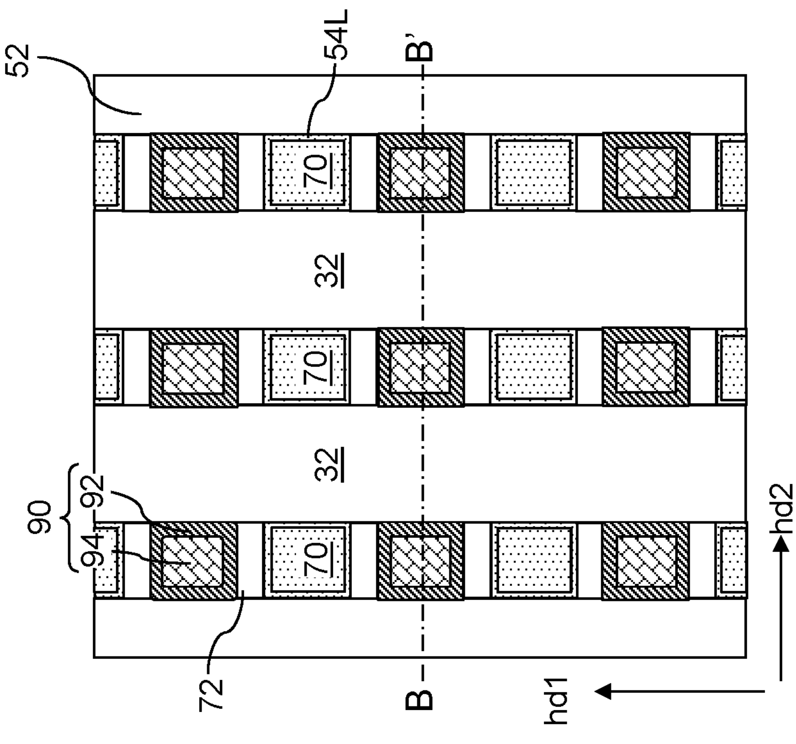
FIG. 52C is a top-down view of the fifth configuration of the second exemplary structure of FIGS. 52A and 52B.

Referring to FIGS. 52A-52C, the processing steps of FIGS. 43A-43C can be performed to form dielectric isolation pillars 70 can be formed within the backside openings 69. The dielectric isolation pillars 70 can include a doped silicate glass (such as borosilicate glass, phosphosilicate glass, or borophosphosilicate glass), or can include undoped silicate glass. A reflow anneal and/or a densification anneal may be optionally performed. Each conformal metallic liner 46A can directly contact sidewalls of at least one row, such as two rows, of dielectric isolation pillars 70 formed in at least one, such as two, neighboring line trenches 79. Each metallic fill material portion 46B can directly contact sidewalls of at least one row, such as two rows, of dielectric isolation pillars 70 formed in at least one, such as two, neighboring line trenches 79.

Figure 53B:
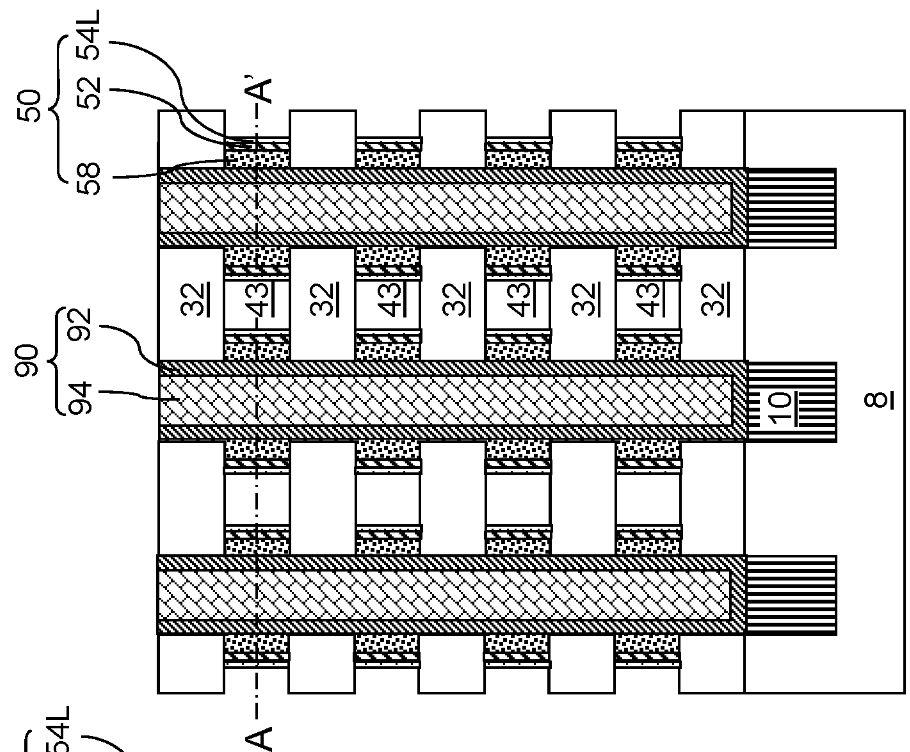
FIG. 53B is a vertical cross-sectional view along the vertical plane B-B' of the sixth configuration of the second exemplary structure of FIG. 53A. The horizontal plane A-A' is the plane of the horizontal cross-sectional view of FIG. 53A.
Figure 53A:
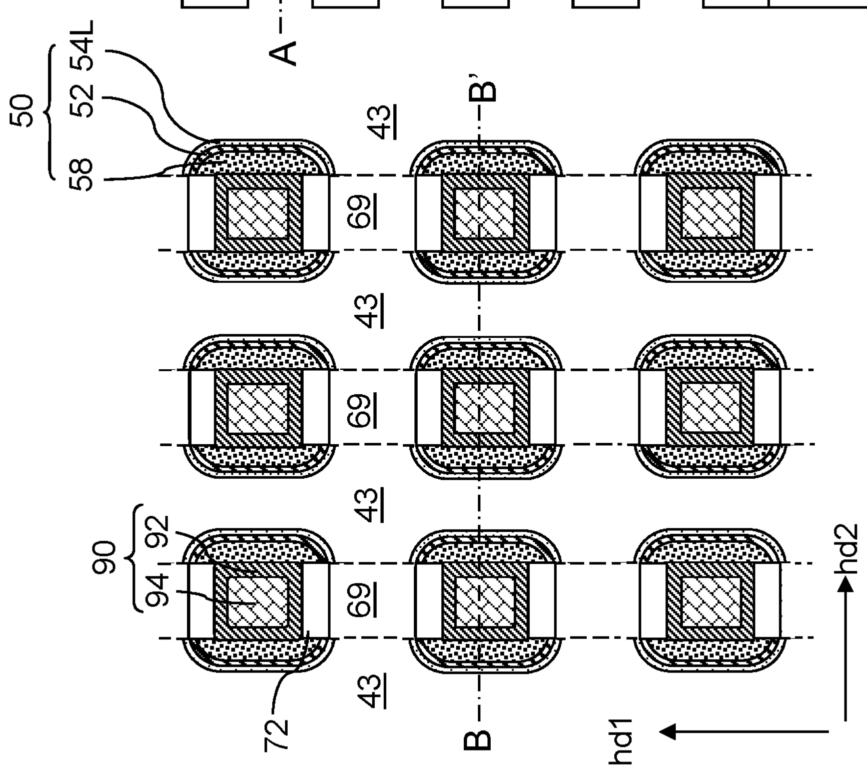
FIG. 53A is a horizontal cross-sectional view of a sixth configuration of the second exemplary structure after formation of selector material portions according to the second embodiment of the present disclosure.

Referring to FIGS. 53A and 53B, a sixth configuration of the second exemplary structure can be derived from the fifth configuration of the second exemplary structure of FIGS. 50A and 50B by forming backside recesses 43 through selective removal of the sacrificial material strips 42, and by selectively depositing a selector material in lieu of non-selective deposition of a selector material. Discrete selector material portions 54 are formed in lieu of a continuous selector material layer 54L. Each discrete selector material portion 54 can be formed on a respective one of the discrete metal portions 52. The composition and the thickness of the discrete selector material portions 54 can be selected such that the critical bias voltage magnitude can be in a range from 1 V to 4 V, although lesser and greater voltages can also be employed for the critical bias voltage magnitude. The thickness of the discrete selector material portions 54 can be, for example, in a range from 1 nm to 40 nm, such as from 2 nm to 20 nm, although lesser and greater thicknesses can also be employed.

Figure 54B:
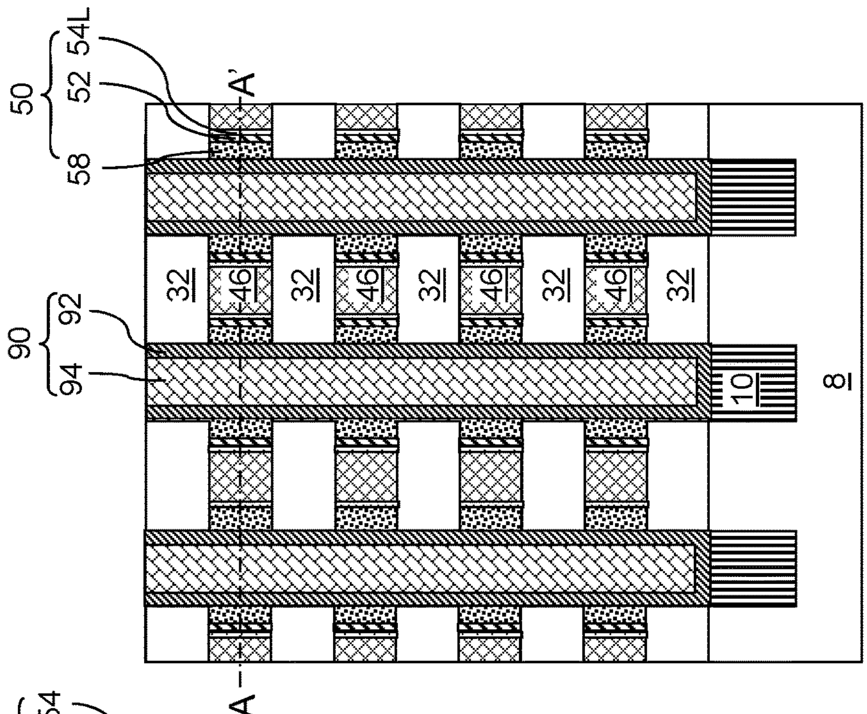
FIG. 54B is a vertical cross-sectional view along the vertical plane B-B' of the sixth configuration of the second exemplary structure of FIG. 54A. The horizontal plane A-A' is the plane of the horizontal cross-sectional view of FIG. 54A.
Figure 54A:
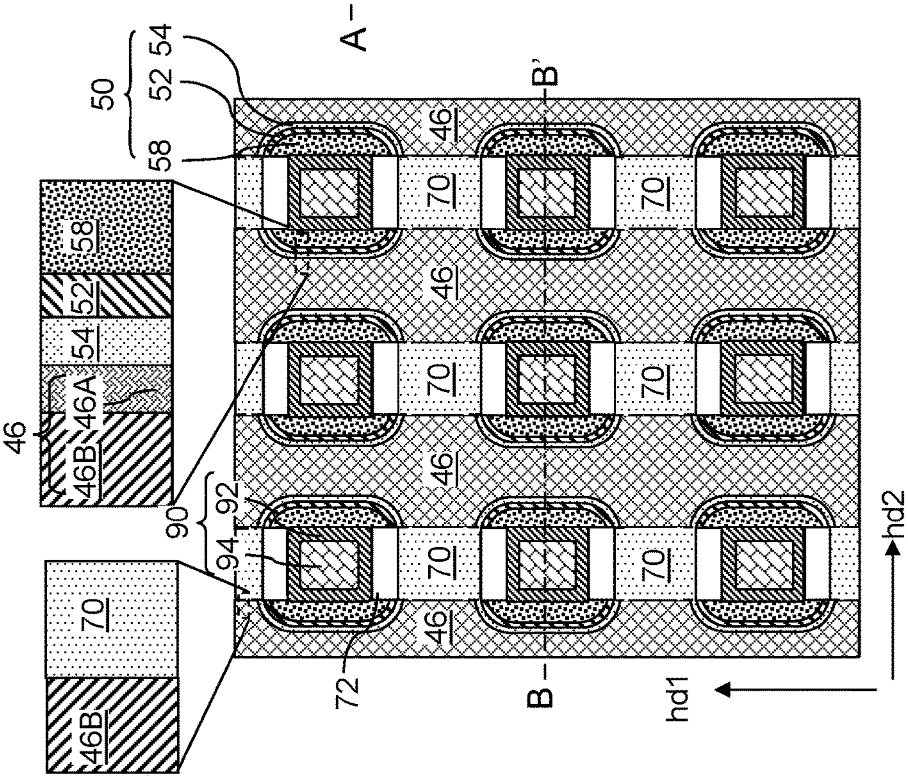
FIG. 54A is a horizontal cross-sectional view of the sixth configuration of the second exemplary structure after formation of electrically conductive strips and dielectric isolation pillars according to the second embodiment of the present disclosure.
Figure 54C:
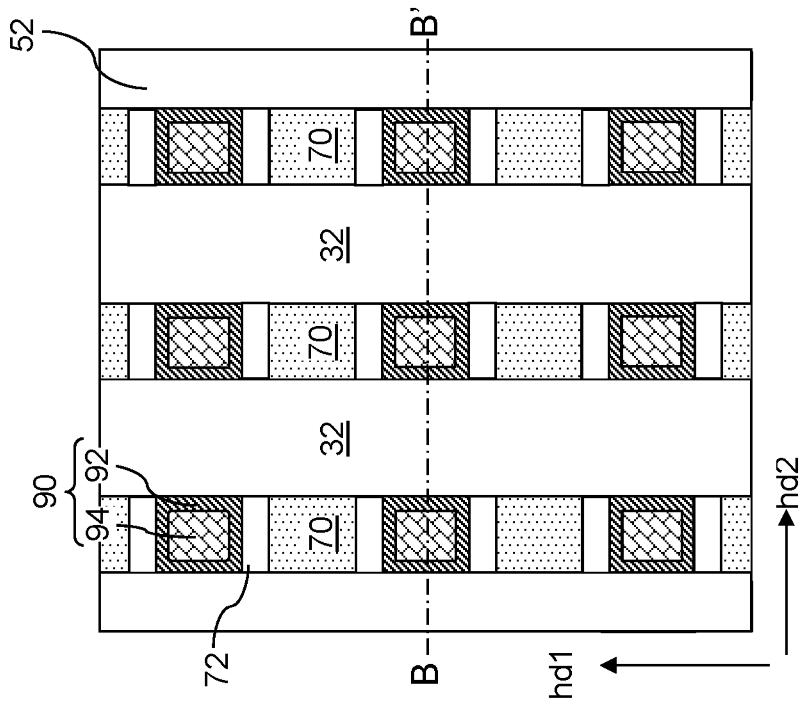
FIG. 54C is a top-down view of the sixth configuration of the second exemplary structure of FIGS. 54A and 54B.

Referring to FIGS. 54A-54C, the processing steps of FIGS. 42A and 42B can be performed to form electrically conductive strips 46 in remaining volumes of the backside recesses 43. Collaterally deposited portions of the at least one conducive material of the electrically conductive strips 46 can be removed from inside each backside opening 69, for example, by an anisotropic etch process.

A three-dimensional array of phase change memory cells 50 is thus provided. Each phase change memory cell 50 includes a discrete metal portion 52, a discrete phase change memory material portion 58 contacting the discrete metal portion 52, and a discrete selector material portion 54 contacting the discrete metal portion 52. The phase change memory cells 50 can be formed at each level of the sacrificial material strips 42 at a periphery of each of the pillar cavities 49. Each center region of a pillar cavity 49 is filled with a respective one of the vertical bit lines 90. Each of the discrete metal portions 52 is formed between a discrete phase change memory material portion 58 and a discrete selector material portion 54 within a respective phase change memory cell 50. Two vertical stacks of phase change memory cells 50 can be formed at a periphery of each of the pillar cavities 49. Each phase change memory cell 50 can be formed on a respective electrically conductive strip 46 around a respective pillar cavity 49 among the two-dimensional array of pillar cavities 42.

In the sixth configuration of the second exemplary structure, each discrete selector material portion 54 is formed directly on an outer sidewall of a respective one of the discrete metal portions 52. Each of the discrete carbon portions, if present, is formed directly on an inner sidewall of a respective one of the discrete metal portions 52. Each of the discrete phase change memory material portion 58 is formed directly on an inner sidewall of a respective one of the discrete carbon portions (if present), or directly on an inner sidewall of a respective one of the discrete metal portions 52. Each of the discrete selector material portions 54, the discrete metal portions 52, the discrete carbon portions (if present), and the discrete phase change memory material portions 58 can have a vertical planar outer sidewall segment and a pair of vertical convex outer sidewall segments. Each of the discrete selector material portions 54, the discrete metal portions 52, and the discrete carbon portions can have a vertical planar inner sidewall segment and a pair of vertical convex inner sidewall segments. An inner sidewall of each phase change memory material portion 58 can be vertically coincident with sidewalls of overlying insulating strips 32 and underlying insulating strips 32. The processing steps of FIGS. 43A-43C can be subsequently performed to form dielectric isolation pillars 70 can be formed within the backside openings 69.

Figure 55B:
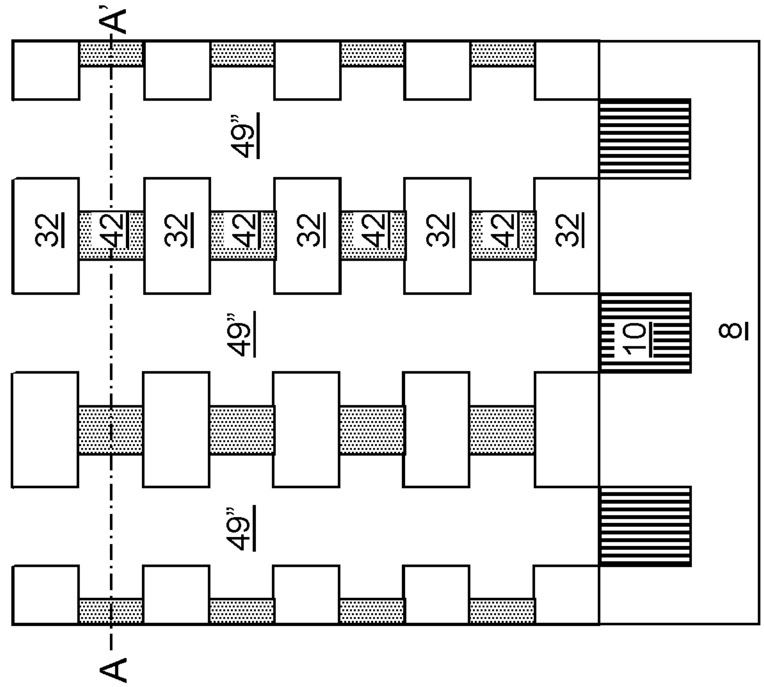
FIG. 55B is a vertical cross-sectional view along the vertical plane B-B' of the seventh configuration of the second exemplary structure of FIG. 34A. The horizontal plane A-A' is the plane of the horizontal cross-sectional view of FIG. 34A.
Figure 55A:
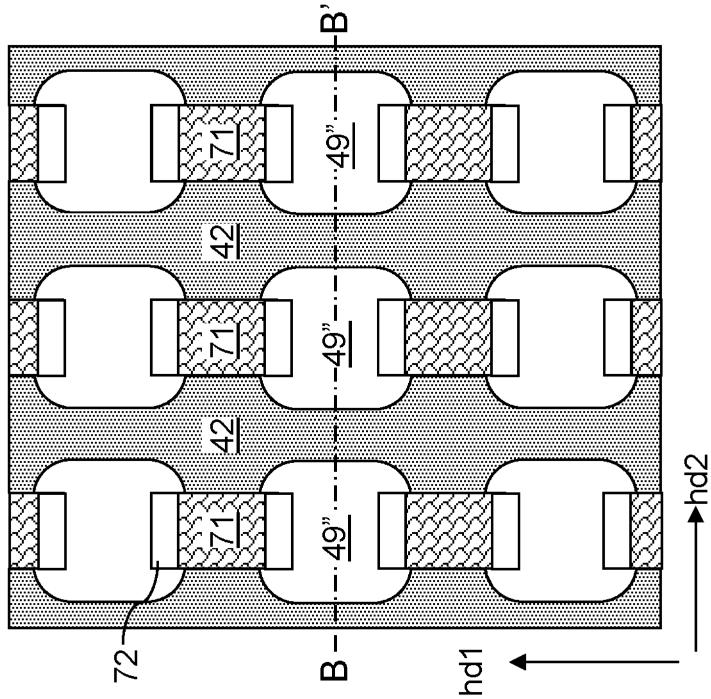
FIG. 55A is a horizontal cross-sectional view of a seventh configuration of the second exemplary structure after lateral expansion of the pillar cavities at levels of the sacrificial material strips according to the second embodiment of the present disclosure.

Referring to FIGS. 55A and 55B, a seventh configuration of the second exemplary structure can be derived from, and can be the same as, the first configuration of the second exemplary structure illustrated in FIGS. 34A and 34B.

Figure 56B:
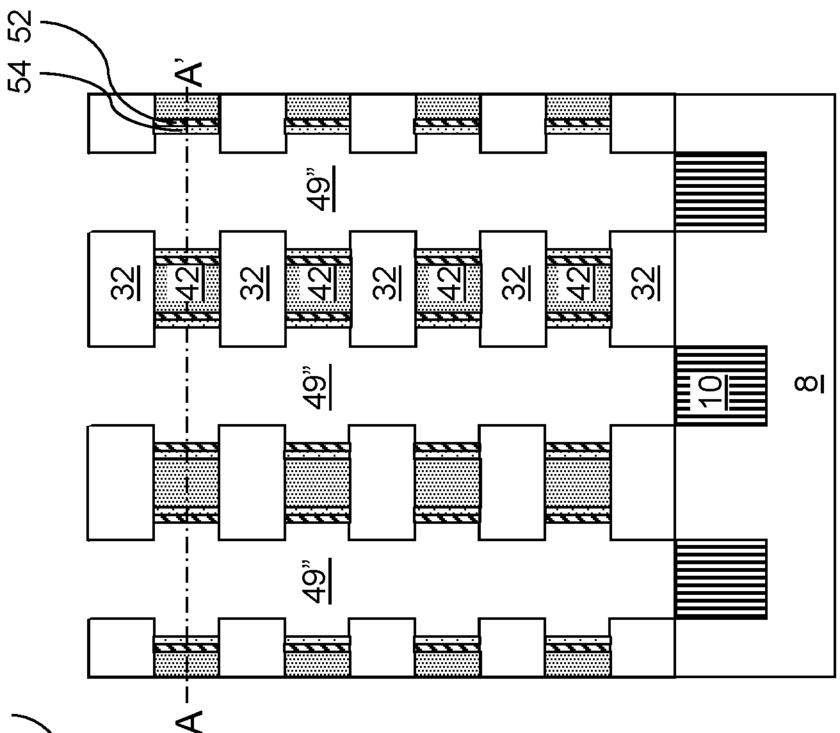
Figure 56A:
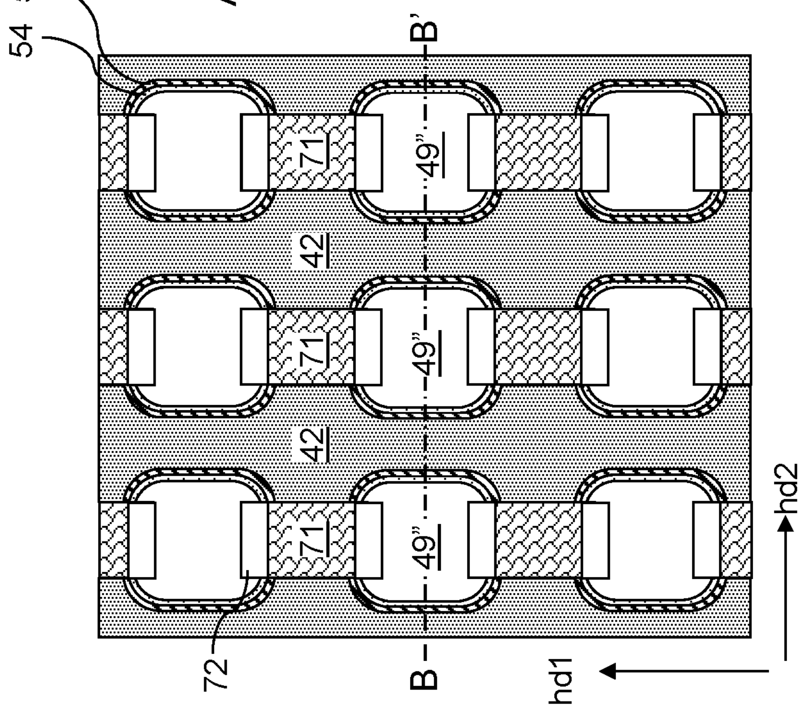

Referring to FIGS. 56A and 56B, the processing steps of FIGS. 11A and 11B can be performed to grow discrete metal portions 52 including a metal only from the physically exposed surfaces of the sacrificial material strips 42 while growth from the surfaces of the insulating strips 32, the doped semiconductor oxide pillars 72, the substrate 8, and the access nodes 10 is suppressed. Growth from top surfaces of the sacrificial pillar structures 71 may, or may not occur. If any metal portions grow on the top surfaces of the sacrificial pillar structures 71, such metal portions can be removed in an etch process or a planarization process that removes a horizontal portion of a continuous phase change memory material layer from above the alternating stacks (32, 42).

The metallic element of the discrete metal portions 52 is selected among elements that enable such selective metal deposition process as in the first embodiment. Generally, the elemental metal of the discrete metal portions 52 can be selected such that a selective deposition process can provide selective growth of the elemental metal of the discrete metal portions 52 only from the surfaces of the sacrificial material strips 42 while growth from surfaces of the insulating strips 32, the dielectric isolation pillars 76, the substrate 8, and the access nodes 10 is suppressed. In one embodiment, an intermetallic alloy may be employed in lieu of an elemental metal for the discrete metal portions 52. Each of the discrete metal portions 52 is formed directly on a respective one of the sacrificial material strips 42.

The discrete metal portions 52 function as middle electrodes of phase change memory cells to be subsequently formed. The middle electrodes can enhance device characteristics of the phase change memory cells by providing an optimized material interface on a phase change memory material portion and/or on a selector element. The thickness of the discrete metal portions 52 can be in a range from 1 nm to 20 nm, such as from 2 nm to 10 nm, although lesser and greater thicknesses can also be employed.

The processing steps of FIGS. 12A and 12B can be subsequently performed to form discrete selector material portions 54 on a respective one of the discrete metal portions 52. The discrete selector material portions 54 include a selector material, which can be any selector material that can be employed in the first embodiment. Each selector material portion can be formed as a discrete selector material portion 54 that contacts only a single one of the discrete metal portions 52. In one embodiment, the material of the discrete selector material portions 54 can be selected such that the resistivity of the discrete selector material portions 54 decreases at least by two orders of magnitude (i.e., by more than a factor of 100) upon application of an external bias voltage that exceeds a critical bias voltage magnitude. In one embodiment, the composition and the thickness of the discrete selector material portions 54 can be selected such that the critical bias voltage magnitude can be in a range from 1 V to 4 V, although lesser and greater voltages can also be employed for the critical bias voltage magnitude. The thickness of the discrete selector material portions 54 can be, for example, in a range from 1 nm to 40 nm, such as from 2 nm to 20 nm, although lesser and greater thicknesses can also be employed. Alternatively or additionally, the discrete selector material portions 54 may include an alternative non-Ohmic material layer such as a p-n junction diode layer. Optionally, a combination of a conformal deposition process and at least one etch back process can be employed to form the discrete selector material portions 54.

Figure 57B:
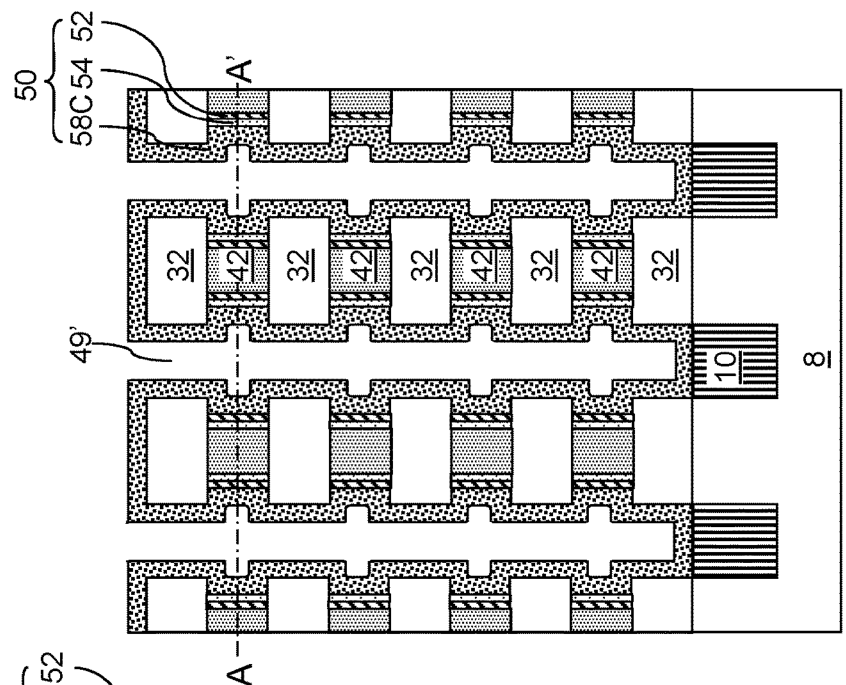
Figure 57A:
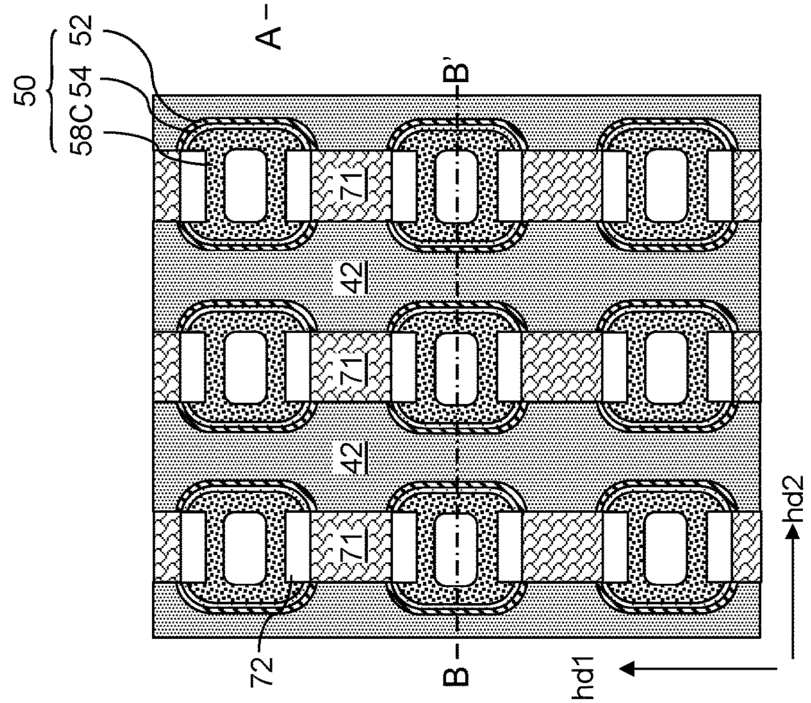
Figure 58B:
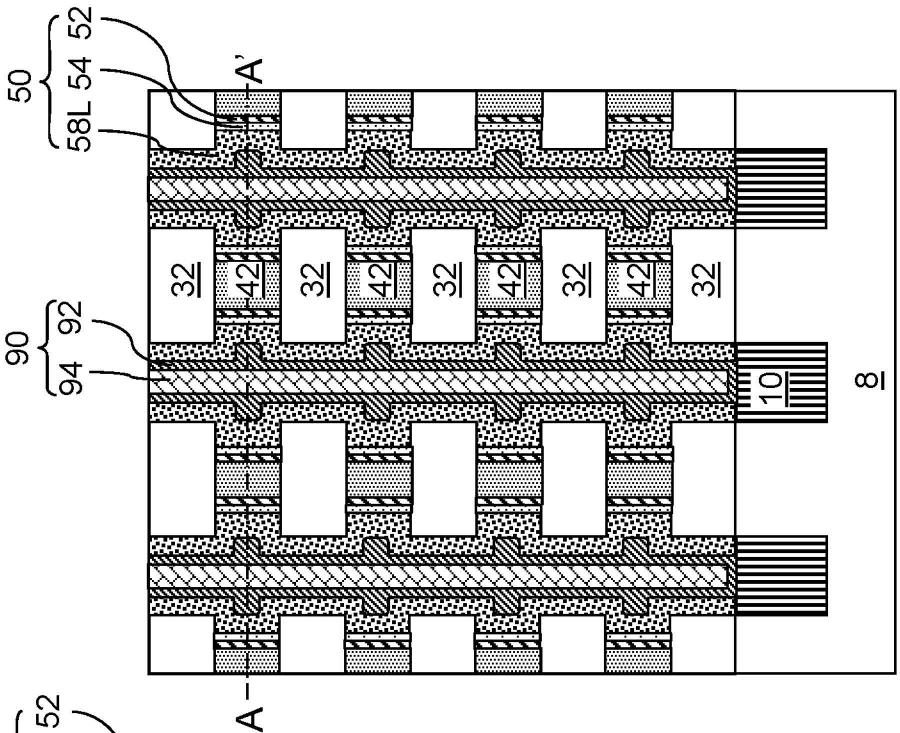
Figure 58A:
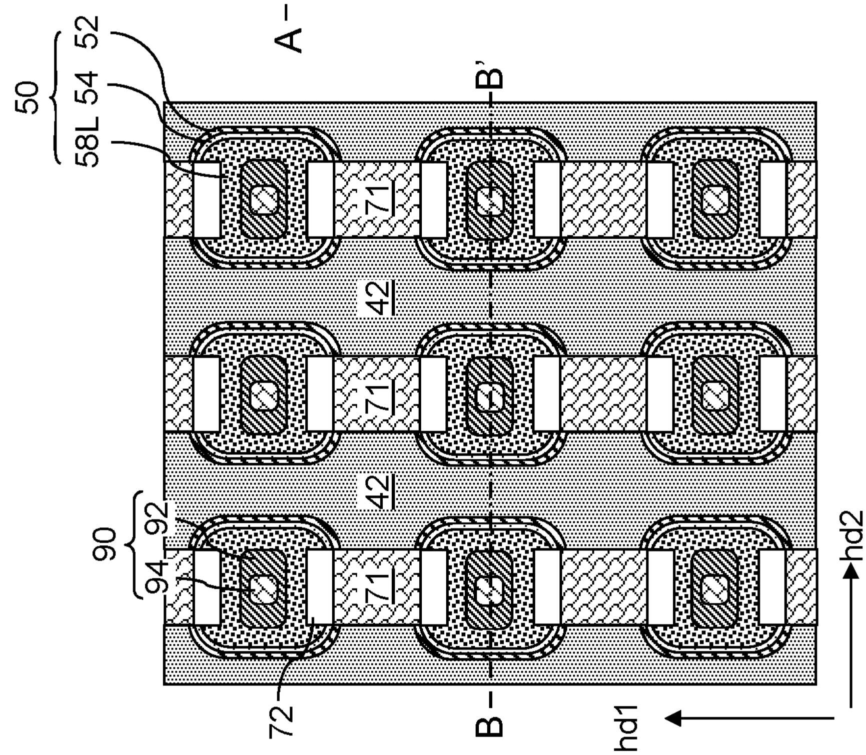

Referring to FIGS. 57A and 57B, the processing steps of FIGS. 13A and 13B can be performed to optionally form a continuous carbon layer (not shown) and a continuous phase change memory material layer 58C. The processing steps of FIGS. 18A and 18B can be performed to anisotropically etch horizontal portions of the continuous phase change memory material layer 58C and the continuous carbon layer. Each remaining vertical portion of the continuous phase change memory material layer 58C constitutes a phase change memory material layer 58L. Each remaining vertical portion of the continuous carbon layer (if employed) constitutes a carbon layer. A memory cavity 49' is present within each unfilled volume of the pillar cavities 49. A top surface of each access node 10 is physically exposed at the bottom of each memory cavity 49'.

Figure 59B:
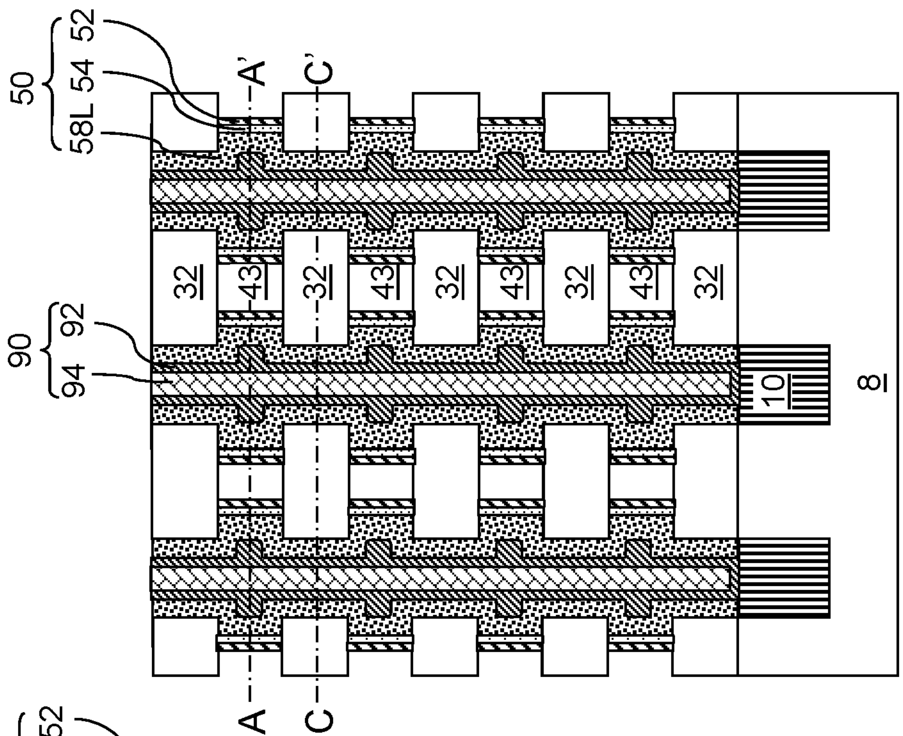
Figure 59A:
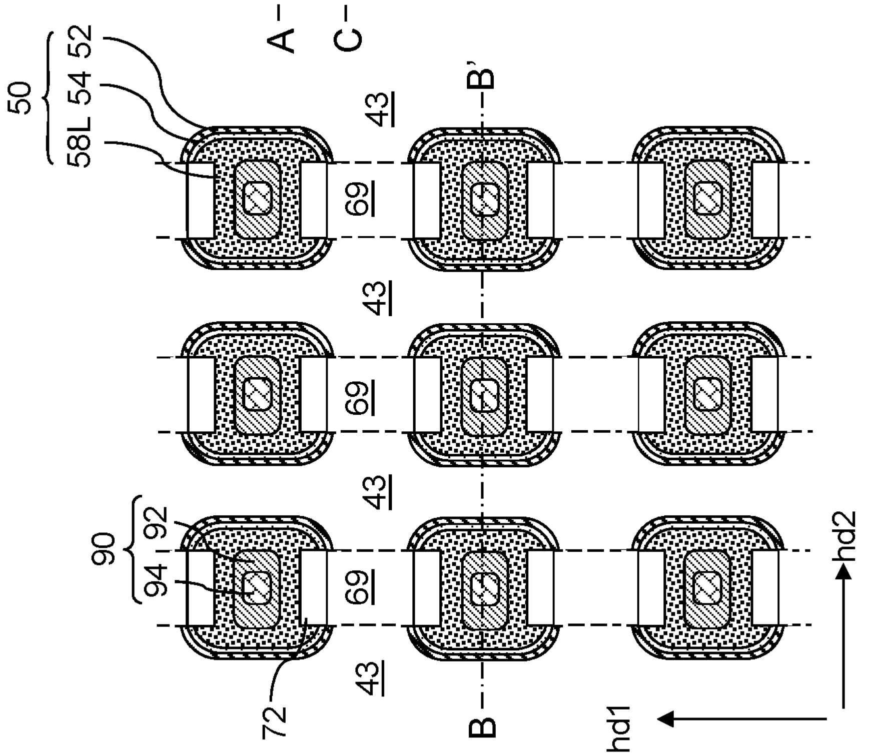
Figure 59C:
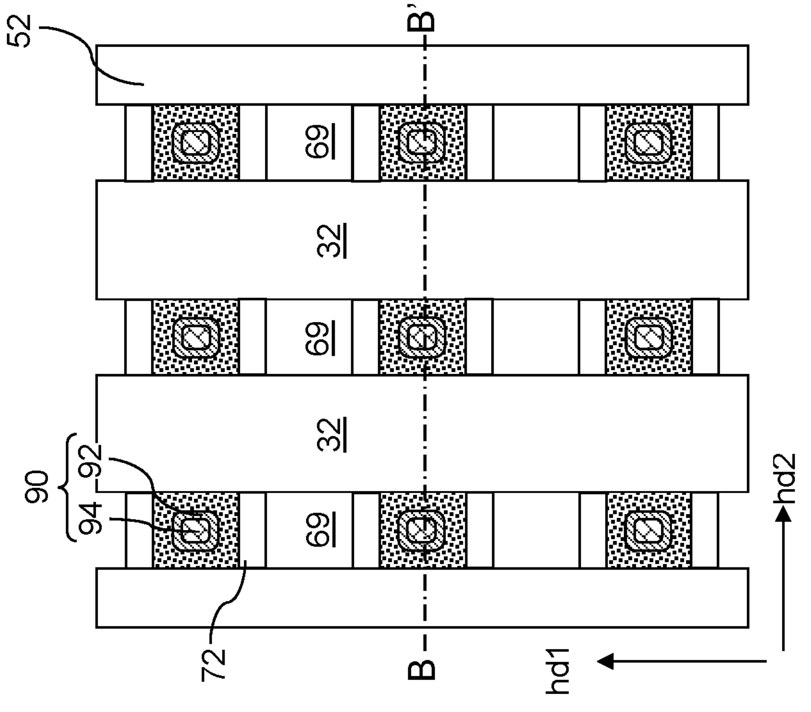

Referring to FIGS. 59A-59C, the processing steps of FIGS. 19A and 19B can be performed to form vertical bit lines 90. Each vertical bit line 90 includes a metallic liner 92 and a metallic fill material portion 94.

Figure 60B:
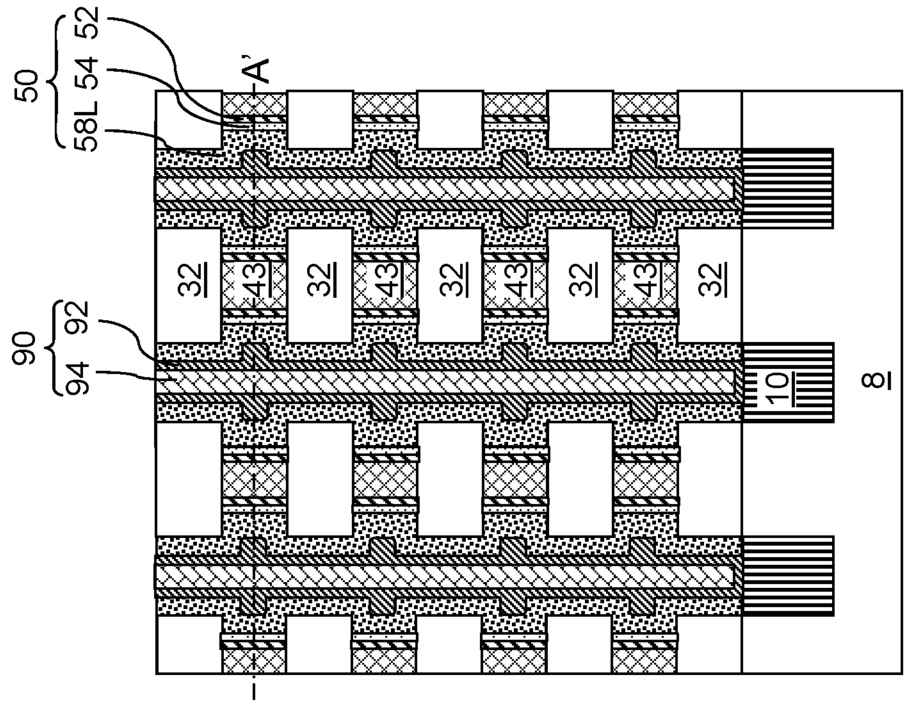
Figure 60A:
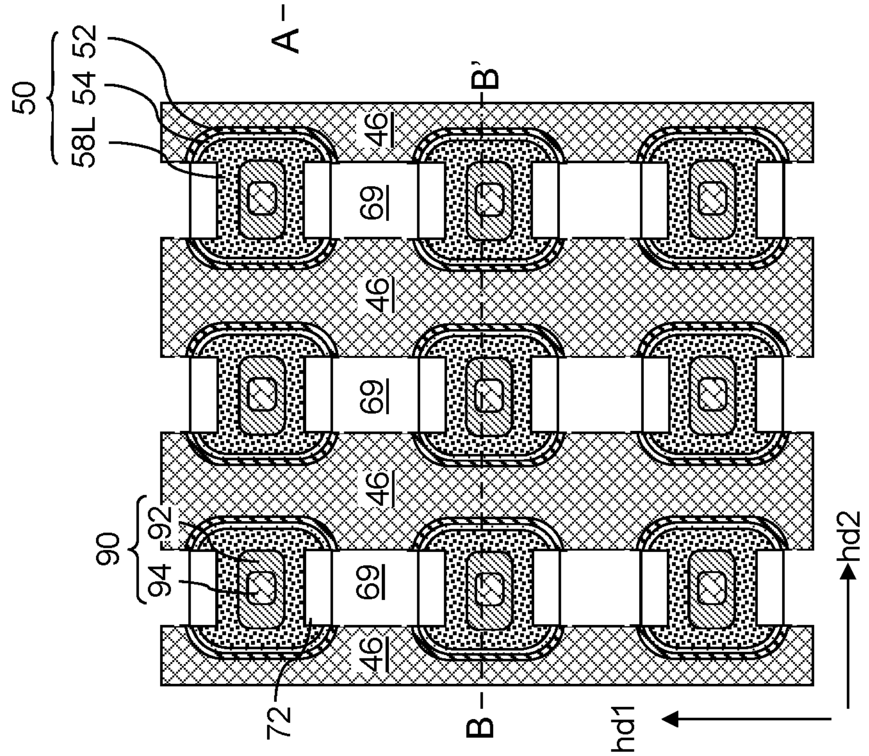

Referring to FIGS. 60A and 60B, the processing steps of FIGS. 39A and 39B can be performed to remove the sacrificial material pillars 71 selective to the materials of the insulating strips 32, the doped semiconductor oxide pillars 72, the substrate 8, and the access nodes 10, thereby forming backside openings 69. The processing steps of FIGS. 40A and 40B can be subsequently performed to remove the sacrificial material strips 42 selective to the discrete metal portions 52, the insulating strips 32, the doped semiconductor oxide pillars 72, the substrate 8, and the access nodes 10, thereby forming backside recesses 43. The processing steps of FIGS. 42A and 42B can be performed to form electrically conductive strips 46 in the backside recesses 43. Collaterally deposited portions of the at least one conducive material of the electrically conductive strips 46 can be removed from inside each backside opening 69, for example, by an anisotropic etch process.

A three-dimensional array of phase change memory cells 50 is thus provided. Each phase change memory cell 50 includes a discrete metal portion 52, a discrete selector material portion 54 contacting the discrete metal portion 52, and a phase change memory material portion that is a portion of a phase change memory material layer 58L and contacts the discrete selector material portion 54. The phase change memory cells 50 can be formed at each level of the sacrificial material strips 42 at a periphery of each of the pillar cavities 49. Each center region of a pillar cavity 49 is filled with a respective one of the vertical bit lines 90. Each of the discrete selector material portions 54 is formed between a phase change memory material layer 58L and a discrete metal portion 52 within a respective phase change memory cell 50. Two vertical stacks of phase change memory cells 50 can be formed at a periphery of each of the pillar cavities 49. Each phase change memory cell 50 can be formed on a respective electrically conductive strip 46 around a respective pillar cavity 49 among the two-dimensional array of pillar cavities 42.

In the seventh configuration of the second exemplary structure, each discrete selector material portion 54 is formed directly on an inner sidewall of a respective one of the discrete metal portions 52. Each carbon layer, if present, is formed directly on an inner sidewall of a respective one of the discrete selector material portions 54. Each phase change memory material layer 58L is formed directly on an inner sidewall of a respective carbon layer (if present), or directly on an inner sidewall of a respective one of the discrete selector material portions 54. Each of the discrete selector material portions 54 and the discrete metal portions 52 can have a vertical planar outer sidewall segment and a pair of vertical convex outer sidewall segments. Each of the discrete selector material portions 54 and the discrete metal portions 52 can have a vertical planar inner sidewall segment and a pair of vertical convex inner sidewall segments.

Referring to FIGS. 61A-61C, the processing steps of FIGS. 43A-43C can be performed to form dielectric isolation pillars 70 within the backside openings 69. Each conformal metallic liner 46A can directly contact sidewalls of at least one row, such as two rows, of dielectric isolation pillars 70 formed in at least one, such as two, neighboring line trenches 79. Each metallic fill material portion 46B can directly contact sidewalls of at least one row, such as two rows, of dielectric isolation pillars 70 formed in at least one, such as two, neighboring line trenches 79.

Referring to FIGS. 62A and 62B, an eighth configuration of the second exemplary structure can be derived from the seventh configuration of the second exemplary structure of FIGS. 57A and 57B by anisotropically etching the materials of the continuous phase change memory material layer 58C and the continuous carbon layer (if present) from inside the volumes of the pillar cavities 49 as provided at the processing steps of FIGS. 32A and 32B. An anisotropic etch process that etches the materials of the continuous phase change memory material layer 58C and the continuous carbon layer selective to the materials of the insulating strips 32, the substrate 8, and the access nodes 10 can be employed. For example, the processing steps of FIGS. 49A and 49B can be employed.

Each remaining portion of the continuous phase change memory material layer 58C constitutes a phase change memory material portion 58. Each remaining portion of the continuous carbon layer constitutes a discrete carbon portion (not illustrated), which can be present between a neighboring pair of a phase change memory material portion 58 and a selector material portion 54. An inner sidewall of each phase change memory material portion 58 may be vertically coincident with sidewalls of overly insulating strips 32 and underlying insulating strips 32. Generally, portions of the continuous phase change memory material layer 58C can be etched back from volumes of the pillar cavities 49 employing an etch back process. In this case, the phase change memory material portions of a three-dimensional phase change memory device comprise discrete remaining phase change memory material portions after the etch back process.

Referring to FIGS. 63A and 63B, the processing steps of FIGS. 50A and 50B can be performed to form vertical bit lines 90 within the pillar cavities 49.

Referring to FIGS. 64A and 64B, the processing steps of FIGS. 40A and 40B can be performed to remove the sacrificial material strips 42 selective to the discrete metal portions 52, the insulating strips 32, the doped semiconductor oxide pillars 72, the substrate 8, and the access nodes 10, thereby forming backside recesses 43.

Referring to FIGS. 65A and 65B, the processing steps of FIGS. 42A and 42B can be performed to form electrically conductive strips 46 in the backside recesses 43. Collaterally deposited portions of the at least one conducive material of the electrically conductive strips 46 can be removed from inside each backside opening 69, for example, by an anisotropic etch process.

A three-dimensional array of phase change memory cells 50 is thus provided. Each phase change memory cell 50 includes a discrete metal portion 52, a discrete selector material portion 54 contacting the discrete metal portion 52, and a discrete phase change memory material portion 58 contacting the discrete selector material portion 54, or laterally spaced from the discrete selector material portion 54 by a discrete carbon portion. The phase change memory cells 50 can be formed at each level of the sacrificial material strips 42 at a periphery of each of the pillar cavities 49. Each center region of a pillar cavity 49 is filled with a respective one of the vertical bit lines 90. Each of the discrete selector material portions 54 is formed between a phase change memory material portion 58 and a discrete metal portion 52 within a respective phase change memory cell 50. Two vertical stacks of phase change memory cells 50 can be formed at a periphery of each of the pillar cavities 49. Each phase change memory cell 50 can be formed on a respective electrically conductive strip 46 around a respective pillar cavity 49 among the two-dimensional array of pillar cavities 42.

In the eighth configuration of the second exemplary structure, each discrete selector material portion 54 is formed directly on an inner sidewall of a respective one of the discrete metal portions 52. Each discrete carbon portion, if present, is formed directly on an inner sidewall of a respective one of the discrete selector material portions 54. Each phase change memory material portion 58 is formed directly on an inner sidewall of a respective discrete carbon portion (if present), or directly on an inner sidewall of a respective one of the discrete selector material portions 54.

Each of the discrete selector material portions 54, the discrete metal portions 52, the carbon portions, and the phase change memory material portions 58 can have a vertical planar outer sidewall segment and a pair of vertical convex outer sidewall segments. Each of the discrete selector material portions 54, the discrete metal portions 52, and the discrete carbon portions can have a vertical planar inner sidewall segment and a pair of vertical convex inner sidewall segments.

Referring to FIGS. 66A-66C, the processing steps of FIGS. 43A-43C can be performed to form dielectric isolation pillars 70 within the backside openings 69. Each conformal metallic liner 46A can directly contact sidewalls of at least one row, such as two rows, of dielectric isolation pillars 70 formed in at least one, such as two, neighboring line trenches 79. Each metallic fill material portion 46B can directly contact sidewalls of at least one row, such as two rows, of dielectric isolation pillars 70 formed in at least one, such as two, neighboring line trenches 79.

The various configurations of the second exemplary structure include a three-dimensional phase change memory device. The three-dimensional phase change memory device comprises: alternating stacks of insulating strips 32 and electrically conductive strips 46 located over a substrate 8, wherein each of the insulating strips 32 and electrically conductive strips 46 laterally extend along a first horizontal direction hd1, and the alternating stacks (32, 46) are laterally spaced apart along a second horizontal direction hd2, laterally alternating sequences of vertical bit lines 90 and dielectric isolation pillars 70 located between each neighboring pair of alternating stacks (32, 46), and a phase change memory cell containing a discrete metal portion 52, a phase change memory material portion (58 or 58L), and a selector material portion (54 or 54L) located in each intersection region between the electrically conductive strips 46 and the vertical bit lines 90. Each of the electrically conductive strips 46 comprises a word line that is in direct contact with a respective row of dielectric isolation pillars 70 located between a neighboring pair of alternating stacks.

In one embodiment, the lateral separation distance between a vertical bit line 90 and an electrically conductive strip 46 in each intersection region along the second horizontal direction hd2 is less than one half of the average pitch of separation between the alternating stacks in the second horizontal direction hd2.

In one embodiment, the three-dimensional phase change memory device comprises doped semiconductor oxide pillars 72 located between each neighboring pair of a vertical bit line 90 and a dielectric isolation pillar 70 that are laterally spaced along the first horizontal direction hd1 within each laterally alternating sequence of vertical bit lines 90 and dielectric isolation pillars 70.

In one embodiment, each of the doped semiconductor oxide pillars 72 comprises: a pair of lengthwise sidewalls that laterally extend along the second horizontal direction hd2; and a pair of widthwise sidewalls that laterally extend along the first horizontal direction hd1 and in contact with surfaces of a pair of discrete metal portions 52. In one embodiment, each of the pair of lengthwise sidewalls contacts a respective one of the vertical bit lines 90. In another embodiment, each phase change memory material portion is a respective portion within a phase change memory material layer 58L that laterally surrounds a respective one of the vertical bit lines 90, continuously extends vertically along the respective one of the vertical bit lines 90 from a bottommost level of the electrically conductive strips 46 to a topmost level of the electrically conductive strips 46, and contacts lengthwise sidewalls of a neighboring pair of doped semiconductor oxide pillars 72.

In one embodiment, each of the doped semiconductor oxide pillars 72 contacts a pair of discrete metal portions 52. In one embodiment, the doped semiconductor oxide pillars 72 have a different material composition than the dielectric isolation pillars 70.

In one embodiment, each of the discrete metal portions 52 is in direct contact with a respective one of the electrically conductive strips 46. In another embodiment, each of the discrete metal portions 52 is located between a phase change memory material portion (58 or 58L) and a selector material portion (54 or 54L) within a respective phase change memory cell 50.

In one embodiment, each selector material portion is a respective portion within a selector material layer 54L that laterally surrounds a respective one of the vertical bit lines 90 and continuously extends vertically from a bottommost level of the electrically conductive strips 46 to a topmost level of the electrically conductive strips 46. In another embodiment, each selector material portion 54 contacts only a single one of the discrete metal portions 52.

In one embodiment, a vertical stack of phase change memory cells 50 is formed directly on each of the doped semiconductor oxide pillars 72, wherein the vertical stack of phase change memory cells 50 comprises a set of phase change memory cells formed at each level of the sacrificial material strips 46.

The various embodiments of the present disclosure provide phase change memory cells 50 containing discrete intermediate electrodes comprising the discrete metal portions 52. The discrete intermetallic electrodes can enhance performance of the phase change memory cells by tailoring interfacial device characteristics at interfaces with a phase change memory material portion and/or at interfaces with a selector material portion.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional phase change memory device comprising:

alternating stacks of insulating strips and electrically conductive strips located over a substrate, wherein each of the insulating strips and electrically conductive strips laterally extend along a first horizontal direction, and the alternating stacks are laterally spaced apart along a second horizontal direction;

laterally alternating sequences of vertical bit lines and dielectric isolation pillars located between each neighboring pair of alternating stacks; and a phase change memory cell including a discrete metal portion, a phase change memory material portion, and a selector material portion located in each intersection region between the electrically conductive strips and the vertical bit lines, wherein each of the electrically conductive strips comprises a word line that is in direct contact with a respective row of dielectric isolation pillars located between a neighboring pair of alternating stacks.

2. The three-dimensional phase change memory device of claim 1, further comprising doped semiconductor oxide pillars located between each neighboring pair of a vertical bit line and a dielectric isolation pillar that are laterally spaced along the first horizontal direction within each laterally alternating sequence of vertical bit lines and dielectric isolation pillars.

3. The three-dimensional phase change memory device of claim 2, wherein each of the doped semiconductor oxide pillars comprises:

a pair of lengthwise sidewalls that laterally extend along the second horizontal direction; and a pair of widthwise sidewalls that laterally extend along the first horizontal direction and in contact with surfaces of a pair of discrete metal portions.

4. The three-dimensional phase change memory device of claim 3, wherein each of the pair of lengthwise sidewalls contacts a respective one of the vertical bit lines.

5. The three-dimensional phase change memory device of claim 3, wherein each phase change memory material portion is a respective portion within a phase change memory material layer that laterally surrounds a respective one of the vertical bit lines, continuously extends vertically along the respective one of the vertical bit lines from a bottommost level of the electrically conductive strips to a topmost level of the electrically conductive strips, and contacts lengthwise sidewalls of a neighboring pair of doped semiconductor oxide pillars.

6. The three-dimensional phase change memory device of claim 2, wherein each of the doped semiconductor oxide pillars contacts a pair of discrete metal portions.

7. The three-dimensional phase change memory device of claim 2, wherein the doped semiconductor oxide pillars have a different material composition than the dielectric isolation pillars.

8. The three-dimensional phase change memory device of claim 1, wherein each of the discrete metal portions is in direct contact with a respective one of the electrically conductive strips.

9. The three-dimensional phase change memory device of claim 1, wherein each of the discrete metal portions is located between a phase change memory material portion and a selector material portion within a respective phase change memory cell.

10. The three-dimensional phase change memory device of claim 1, wherein each selector material portion is a respective portion within a selector material layer that laterally surrounds a respective one of the vertical bit lines and continuously extends vertically from a bottommost level of the electrically conductive strips to a topmost level of the electrically conductive strips.

11. The three-dimensional phase change memory device of claim 1, wherein each selector material portion contacts only a single one of the discrete metal portions.

12. A method of forming a three-dimensional phase change memory device, comprising:

forming a vertically alternating sequence of continuous insulating layers and continuous sacrificial material layers over a substrate;

forming line trenches laterally extending along a first horizontal direction through the vertically alternating sequence, wherein patterned portions of the vertically alternating sequence comprise alternating stacks of insulating strips and sacrificial material strips that laterally extend along the first horizontal direction and are laterally spaced apart along a second horizontal direction;

forming a laterally alternating sequence of pillar cavities and sacrificial pillar structures within each of the line trenches;

forming a phase change memory cell including a discrete metal portion, a phase change memory material portion, and a selector material portion at each level of the sacrificial material strips at a periphery of each of the pillar cavities;

forming vertical bit lines in the two-dimensional array of pillar cavities;

forming backside openings by removing the sacrificial pillar structures selective to the vertical bit lines; and replacing remaining portions of the sacrificial material strips with material portions that include electrically conductive strips.

13. The method of claim 12, further comprising:

forming sacrificial rails in the line trenches; and forming a two-dimensional array of the pillar cavities through the sacrificial rails, wherein remaining portions of the sacrificial rails comprise a two-dimensional array of sacrificial material pillars.

14. The method of claim 13, wherein:

the sacrificial rails comprise a doped semiconductor material; and the method further comprises forming doped semiconductor oxide pillars by oxidizing surface regions of the two-dimensional array of sacrificial material pillars, wherein unoxidized portions of the sacrificial material pillars comprise the sacrificial pillar structures.

15. The method of claim 14, wherein a vertical stack of phase change memory cells is formed directly on each of the doped semiconductor oxide pillars, wherein the vertical stack of phase change memory cells comprises a set of phase change memory cells formed at each level of the sacrificial material strips.

16. The method of claim 12, further comprising:

removing the sacrificial material strips employing an isotropic etch process in which an isotropic etchant that etches the sacrificial material strips selective to the insulating strips is introduced into the backside openings and etches the sacrificial material strips to form backside cavities;

forming the electrically conductive strips by introducing at least one reactant for depositing at least one conductive material through the backside openings into the backside cavities, whereby the electrically conductive strips are formed; and removing a collaterally deposited conductive material from inside the backside openings.

17. The method of claim 12, wherein each of the discrete metal portions is formed directly on a respective one of the sacrificial material strips.

18. The method of claim 12, wherein each of the discrete metal portions is formed between a phase change memory material portion and a selector material portion within a respective phase change memory cell.

19. The method of claim 12, wherein:

each phase change memory material portion is a respective portion within a phase change memory material layer formed at a periphery of a respective one of the pillar cavities; and each vertical bit line is formed directly on a respective one of the phase change memory material layer.

20. The method of claim 12, further comprising:

laterally recessing the sacrificial material strips selective to the insulating strips to form lateral recesses prior to formation of the electrically conductive strips;

filling at least a portion of each lateral recess with a respective phase change memory material layer; and etching back portions of the phase change memory material layers from volumes of the pillar cavities employing an etch back process, wherein the phase change memory material portions comprise discrete remaining phase change memory material portions after the etch back process.

* * * * *